United States Patent
Kinstner et al.

(10) Patent No.: US 9,984,510 B1
(45) Date of Patent: May 29, 2018

(54) SYSTEM AND METHOD FOR MODIFYING VIRTUAL ELEMENTS IN A VIRTUAL ENVIRONMENT USING HIERARCHICAL ANCHORS INCORPORATED INTO VIRTUAL ELEMENTS

(71) Applicant: META COMPANY, San Mateo, CA (US)

(72) Inventors: Zachary R. Kinstner, Ada, MI (US); Rebecca B. Frank, Los Angeles, CA (US)

(73) Assignee: Meta Company, San Mateo, CA (US)

( * ) Notice: Subject to any disclaimer, the term of this patent is extended or adjusted under 35 U.S.C. 154(b) by 0 days. days.

(21) Appl. No.: 15/197,732

(22) Filed: Jun. 29, 2016

Related U.S. Application Data

(60) Provisional application No. 62/302,800, filed on Mar. 2, 2016.

(51) Int. Cl.
*G06T 19/00* (2011.01)
*G06T 7/00* (2017.01)
*G06T 15/08* (2011.01)

(52) U.S. Cl.
CPC ............ *G06T 19/006* (2013.01); *G06T 15/08* (2013.01); *G06T 19/003* (2013.01)

(58) Field of Classification Search
CPC .................................................. G06T 19/006
USPC ......................................................... 345/633
See application file for complete search history.

(56) References Cited

U.S. PATENT DOCUMENTS

| | | | | |
|---|---|---|---|---|
| 2010/0162151 A1* | 6/2010 | Class | ................... | G06F 3/0483 715/765 |
| 2011/0175918 A1* | 7/2011 | Liu | ...................... | G06T 13/40 345/473 |
| 2012/0249741 A1* | 10/2012 | MacIocci | ............... | G06F 3/011 348/46 |
| 2016/0210784 A1* | 7/2016 | Ramsby | ................ | G06T 19/006 |
| 2016/0217614 A1* | 7/2016 | Kraver | .................. | G06T 19/006 |
| 2017/0235143 A1 | 8/2017 | Chi | | |

\* cited by examiner

*Primary Examiner* — Zhengxi Liu
*Assistant Examiner* — Yi Yang
(74) *Attorney, Agent, or Firm* — Sheppard Mullin Richter & Hampton LLP

(57) ABSTRACT

The methods, systems, techniques, and components described herein allow interactions with virtual elements in a virtual environment, such as a Virtual Reality (VR) environment or Augmented Reality (AR) environment, to be modeled accurately. More particularly, the methods, systems, techniques, and components described herein allow a first virtual element to move within the virtual environment based on an anchor relationship between the first virtual element and a second virtual element. The anchor relationship may define an equilibrium position for the first virtual element. The equilibrium position may define a return position for the first virtual element with respect to the second virtual element. Responsive to the first virtual element being displaced from the equilibrium position, the virtual element may move towards the equilibrium position.

14 Claims, 38 Drawing Sheets

SYSTEM AND METHOD FOR MODIFYING VIRTUAL ELEMENTS IN A VIRTUAL ENVIRONMENT USING HIERARCHICAL ANCHORS INCORPORATED INTO VIRTUAL ELEMENTS

FIELD OF THE INVENTION

The system and methods described herein generally relate to facilitating interaction between physical objects in a real-world environment and virtual elements in a virtual environment, such as a Virtual Reality (VR) environment or an Augmented Reality (AR) environment.

BACKGROUND OF THE INVENTION

When displaying virtual elements that represent physical objects in a virtual environment, it is often difficult to model real-world interactions. As an example, a user, when interacting with a virtual element corresponding to a physical object, may wish to stretch, deform, or otherwise modify the virtual element. Inaccurately depicting the interaction on a virtual element that represents the physical object may detract from the usability of the system and from the user's experiences.

SUMMARY

The systems and methods described herein allow interactions with physical objects to be accurately modeled in a virtual environment. More particularly, the methods, systems, techniques, and components described herein allow a first virtual element to move within the virtual environment based on an anchor relationship between the first virtual element and a second virtual element. The anchor relationship may define an equilibrium position for the first virtual element. The equilibrium position may define a return position for the first virtual element with respect to the second virtual element. Responsive to the first virtual element being displaced from the equilibrium position, the virtual element may move towards the equilibrium position.

First virtual element, second virtual element, and/or other virtual elements corresponding to a physical object may be identified. In some implementations, the physical object may correspond to a third virtual element. The first virtual element may correspond to a first portion of the third virtual element, and the second virtual element may correspond to a second portion of the third virtual element.

The first virtual element, the second virtual element, and/or other virtual elements may be positioned within the virtual environment according to a first arrangement and/or other arrangements. The first virtual element may be movable within the virtual environment based on an anchor relationship between the first virtual element and the second virtual element. In some implementations, the anchor relationship may be based on a physical property of the object.

The anchor relationship may define an equilibrium position for the first virtual element. The equilibrium position may define a return position for the first virtual element with respect to the second virtual element. In some implementations, the equilibrium position may be fixed relative to the second virtual element.

In some implementations, the first virtual element may be associated with a first anchor point. The second virtual element may be associated with a second anchor point. The anchor relationship may define the equilibrium position for the first virtual element based on a position of the first anchor point and a position of the second anchor point. In some implementations, the anchor relationship may define the equilibrium position for the first virtual element further based on an orientation of the first anchor point and an orientation of the second anchor point.

In response to the first virtual element being displaced from the equilibrium position, the first virtual element may be moved towards the equilibrium position. A second arrangement of the first virtual element, the second virtual element, and/or other virtual elements may be determined based on the movement of the first virtual element towards the equilibrium position. The second arrangement of the virtual element, the second virtual element, and/or other virtual elements in the virtual environment may be displayed.

In some implementations, moving the first virtual element to the equilibrium position may include applying a force to the first virtual element. The force may be directed towards the equilibrium position. In some implementations, the application of the force to the first virtual element may be localized such that the force does not affect the second virtual element. In some implementations, an amount of the force may be based on a distance between the first virtual element and the equilibrium position.

In some implementations, the movement of the first virtual element towards the equilibrium position may be characterized by an anchor momentum. The anchor momentum may define an amount of distance the first virtual element overshoots the equilibrium position during the movement of the first virtual element towards the equilibrium position.

Physical objects may be broken down into portions that are related to one another by various physical properties, such as friction, tensile strength, momentum (linear, angular, etc.), etc. The different portions of a physical object may be assigned "anchor points," or reference points having virtual locations in the virtual environment. One or more portions of a physical object may be associated with primitives used as the basis of virtual objects that represent the physical objects in the virtual environment. User interactions with the physical objects may be broken down into component interactions with the various portions of the physical objects and may be based on the physical properties that relate the portions of the physical objects to one another.

The physical properties may provide a basis for "anchor relationships," or relationships in the virtual environment that are based on the physical relationships. In some implementations, the anchor relationships may provide a basis to display the extent a portion of a virtual object corresponding to the physical object appears to "stretch" or "spring" away from another portion of the virtual object in the virtual environment. Interactions that may be modeled include swipe and/or transition animations, explode and/or implode animations, "snap to grid" effects on grid-layout scenes, etc.

The following description provides methods, systems, techniques, and components that allow manipulation of computer-generated elements in a virtual three dimensional (3D) space based on, for example, input translated from real world 3D point data observed by at least one sensor. In one implementation, elements in the virtual world ("virtual elements")—such as individual primitives (a concept that is described in greater depth below), or virtual elements comprised of a composite of discrete primitive shapes—may be assigned an associated charge and field, which together may be referred to as a "interactive volume."

In one example, a virtual element has more than one associated interactive volume. A virtual element becomes interactive with an element translated from the real world (a "real world element") when the translated real world element interacts with an interactive volume associated with the virtual element. For example, when a real world element that has been detected by a depth camera and translated into the virtual world enters the interactive volume of a virtual element, the force exerted on the virtual element by the translated real world element is determined according to a charge associated with the interactive volume of the virtual element. The virtual element then responds to the exerted force based on properties assigned to the virtual element and based on the properties of the virtual environment in which the virtual element and translated real world element are present.

In one example, forces may be applied to the virtual element using a real world physics model to determine a response by the virtual element to the applied force. In addition, a virtual element may be treated as a fluid (e.g., a deformable object with a displacement property) instead of as a solid (e.g., an object with a stable, definite shape, and a definite volume). For example, in one implementation, a translated real world element may penetrate or otherwise exist inside of a virtual element as rendered in the virtual world. Moreover, according to one implementation, only a virtual element having an interactive volume that has been entered by a translated real world element can be acted upon by a force from the real world translated element. As a result, virtual elements may be easily manipulated or interacted with by real world elements—such as a hand, a pencil, or a table.

Additionally, the processing burden associated with rendering and manipulating the virtual elements in a 3D virtual environment may be reduced and/or simplified in an implementation, for example, by limiting processing computations associated with virtual elements to fewer instances when translated real world element and virtual elements are interacting concurrently. The ultimate result of the operation of this system is that users may intuitively interact with virtual elements based on their everyday understanding of real world physics phenomena while achieving efficiency from a computing perspective.

In one implementation, a virtual element may be any shape or object rendered as a synthetic image by a display, a projector or other imaging component capable of generating a virtual shape or object within a virtual 3D space. Each virtual element may have associated content and a number of assigned parameters to model the properties of the virtual element in a virtual 3D interactive space. The parameters are processed to determine the behavior of the element in the virtual 3D space. Examples of parameters include a type, a charge, a field, one or more constraints, and associated content. One or more of the parameters may be permanent or changed at any time, or on the fly, to modify the behavior and/or appearance of the virtual element within the 3D virtual space. In one example, a virtual element may be constructed from a set of one or more primitives that are geometrically modelled. One or more primitives may be used, associated, or combined to represent a virtual element within the 3D virtual space. Examples of primitives may include a point, a line or a line segment, a plane (or subset of a plane with a boundary condition, such as a circle or rectangle), an ellipsoid (e.g., a sphere), a cylinder, and a torus, which are described in more detail below.

In one implementation, a real world element is detected and modeled in the virtual world as a collection of point charges. For example, a real world object (e.g., a hand or any other real world object that may be detected by a sensor) may be modelled as a point cloud derived from the output of one or more sensing devices. In this example, a sensing device senses and/or detects a real world element and outputs a collection of point data representative of the real world element in space referred to as a "point cloud" and its movement in space over time.

The point data from the sensor is translated by a virtual world application into coordinates corresponding to the location of the point data in the virtual 3D space. In one example, the sensor may be implemented using a depth/range sensing camera, such as, for example, a Time-of-Flight (ToF) camera that returns a set of 3D points with spatial coordinates correlated with real world elements within the camera's range of vision. In this example, each point has a spatial coordinate (x, y, z), the confidence of the data (e.g., a value ranging from 0 to 1), and time stamp associated with a frame or snapshot in time from the sensor. The point cloud may be filtered, for example, using the confidence values to stabilize the input and reduce noise associated with detection of the point cloud. The filtered point cloud is then mapped to 3D virtual space coordinates to align the virtual world and the real world. The filtered collection of points also may be assigned a charge. In one example, different points corresponding to different real world elements may be assigned different charges (e.g., a point cloud associated with a user's hand may have one charge and a table surface may have a same or different charge). In addition, data and/or a unique identification (ID) may be associated with the points. In one example, a visual indication of the points in the cloud may be rendered within the 3D virtual space (e.g., to aid a user in manipulating real world objects in order to affect virtual elements in the virtual 3D space). When points within the cloud enter the field or boundary associated with a virtual element (such as a primitive), forces may be determined and applied to the primitive based on parameters assigned to the primitives and to the virtual environment to determine a response by the associated virtual element.

The following detailed description is merely exemplary in nature and is not intended to limit the described implementations (examples, options, etc.), or the application and uses of the described implementations. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable making or using the implementations of the disclosure and are not intended to limit the scope of the disclosure. For purposes of the description herein, the terms "upper," "lower," "left," "rear," "right," "front," "vertical," "horizontal," and similar terms or derivatives thereof shall relate to the examples as oriented in the drawings and do not necessarily reflect real-world orientations unless specifically indicated. Furthermore, there is no intention to be bound by any expressed or implied theory presented in the following detailed description. It is also to be understood that the specific devices, arrangements, configurations, and processes illustrated in the attached drawings, and described in the following specification, are exemplary implementations (examples), aspects and/or concepts. Hence, specific dimensions and other physical characteristics relating to the implementations disclosed herein are not to be considered as limiting, except in the context of any claims which expressly states otherwise. It is understood that "at least one" is equivalent to "a."

The aspects (examples, alterations, modifications, options, variations, implementations and any equivalent thereof) are described with reference to the drawings; it should be understood that the descriptions herein show by way of illustration various implementations in which claimed inventions may be practiced and are not exhaustive or exclusive. They are presented only to assist in understanding and teach the claimed principles. It should be understood that they are not necessarily representative of all claimed inventions. As such, certain aspects of the disclosure have not been discussed herein. That alternate implementations may not have been presented for a specific portion of the invention or that further alternate implementations which are not described may be available for a portion is not to be considered a disclaimer of those alternate implementations. It will be appreciated that many of those implementations not described incorporate the same principles of the invention and others that are equivalent. Thus, it is to be understood that other implementations may be utilized and functional, logical, organizational, structural and/or topological modifications may be made without departing from the scope and/or spirit of the disclosure.

These and other objects, features, and characteristics of the present disclosure, as well as the methods of operation and functions of the related components of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the any limits. As used in the specification and in the claims, the singular form of "a", "an", and "the" include plural referents unless the context clearly dictates otherwise.

DETAILED DESCRIPTION

Example System Architecture

Figure 1:
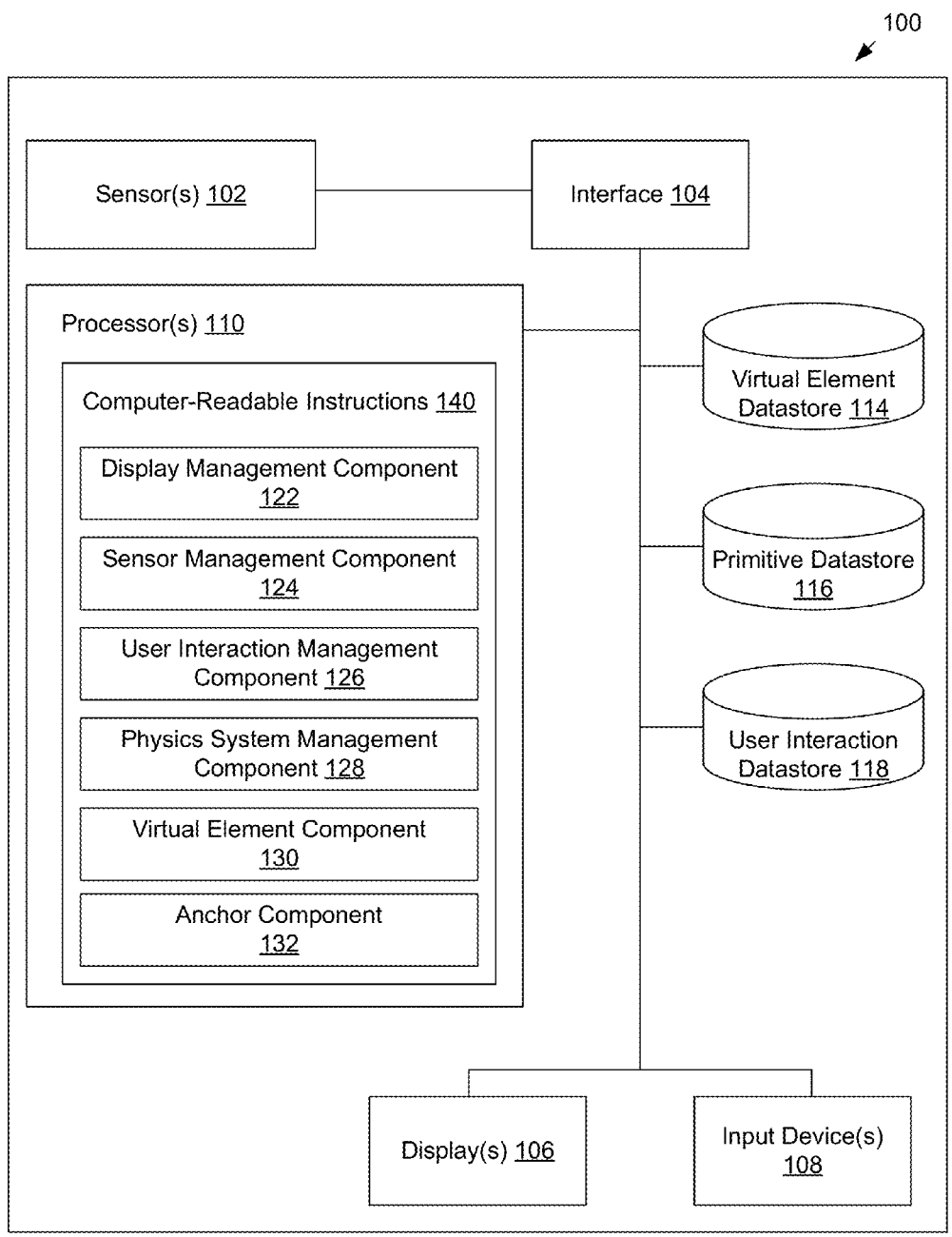
FIG. 1 illustrates an example of a virtual environment management system, in accordance with one or more implementations.

FIG. 1 illustrates an example of a virtual environment management system 100, in accordance with one or more implementations. The virtual environment management system 100 may include sensor(s) 102, an interface 104, display(s) 106, input device(s) 108, processor(s) 110, and one or more datastores, including a virtual element datastore 114, a primitive datastore 116, a user interaction datastore 118, and/or other datastores. One or more of the components shown in 1 may be coupled to one another or to components not explicitly shown in FIG. 1.

Sensor(s) 102, Interface 104, Display(s) 106, Input Device(s) 108, and Processor(s) 110

The sensor(s) 102 may be configured to detect user input. The sensor(s) 102 may include one or more devices that obtain data about a physical property (light, motion, velocity, distance, sound, heat, pressure, magnetism, etc.) in the physical world and provide one or more components of the virtual environment management system 100 with a signal that represents the data. In an implementation, the sensor(s) 102 include a motion sensor that senses movement of a user or of a component of the virtual environment management system 100. The sensor(s) 102 may also include an Inertial Measurement Unit (IMU), an accelerometer, a gyroscope, etc. that senses translational and/or rotational motion by a user or of a component of the virtual environment management system 100. In some implementations, the sensor(s)

102 include a camera that gathers images of a physical environment surrounding a user or a component of the virtual environment management system 100. The camera may comprise a still camera that captures still images of the physical environment or a motion camera that captures videos or other motion pictures of the physical environment. In various implementations, the sensor(s) 102 comprise a depth-camera. A "depth-camera," as used herein, may refer to a device or a component that has the capability to capture still and/or moving images, and has the ability to sense distances of objects away from it.

In various implementations, the sensor(s) 102 may form a part of a Virtual Reality (VR) system that senses the physical environment around a user. In these VR implementations, the sensor(s) 102 may include accelerometers, gyroscopes, etc. that provide movement data related to how a user is moving; the movement data may be used as the basis of perspectives, etc. used in a virtual environment managed by the VR system. A "virtual environment," as used herein, may refer to a virtual space that represents an environment, real or imaginary, and simulates a user's presence in a way that allows the user to interact with the environment.

An example of a virtual environment is a VR environment. A virtual environment may, but need not, contain "virtual elements," which as used herein, may refer to any elements that are displayed in the virtual environment but are not part of the physical world. Virtual elements may be assembled from primitives, discussed further herein. As also discussed further herein, the virtual environment may facilitate interactions with virtual elements. Examples of interactions include moving, resizing, rotating, etc. the virtual elements within the virtual environment. It is further noted that a "real world object" may comprise any object in the physical world, and may include animate items, inanimate items, physical objects/elements used to form the basis of a point cloud, etc.

Moreover, in some implementations, the sensor(s) 102 may form a part of an Augmented Reality (AR) system that uses a virtual environment to augment a physical environment to create an augmented, and/or "mixed reality", environment. An "augmented environment," as used herein, may refer to a space that represents a virtual environment that is superimposed over a perspective of a physical environment around a specific user. An augmented environment may include attributes of a virtual environment, including virtual elements superimposed over portions of the physical environment. In some implementations, an augmented environment may represent physical objects in the physical world as virtual elements in the augmented environment. The virtual elements may, but need not, appear to a user to be different from the physical objects that the virtual elements correspond to in the virtual environment. As an example, a virtual element representing a computer screen in an augmented environment may have the same size dimensions, etc., as the physical object (i.e., the computer screen); however, the virtual element may also have different size dimensions, etc., than the physical object. As discussed further herein, the augmented environment may facilitate interactions with virtual elements. Examples of interactions include moving, resizing, rotating, etc., the virtual elements within the augmented environment.

In VR and/or AR implementation, the sensor(s) 102 may include IMUs, accelerometers, gyroscopes, etc., that provide movement data related to how a user is moving; the movement data may be used as the basis of perspectives, etc. used in the virtual or augmented environment. Further, in an AR implementation, the sensor(s) may comprise or include a depth-camera used in an AR system to capture still and/or moving images of the physical environment and to provide distances of objects away from the depth-camera for processing and use in the AR environment.

One or more virtual elements may move within the virtual environment. One or more virtual elements may move within the virtual environment in response to one or more forces applied to virtual element(s).

The interface 104 may comprise any computer-readable medium that couples the other components of the virtual environment management system 100 to one another. In some implementations, at least a portion of the interface 104 includes a bus or other data conduit or data plane. In these implementations, at least two components of the virtual environment management system 100 are co-located on a single digital device. Further, in various implementations, at least a portion of the interface 104 includes a computer network or a part of a computer network. In these implementations, at least two components of the virtual environment management system 100 are located on different digital devices that are coupled to one another by the computer network. It is noted that the computer network may include a wireless or a wired back-end network or a Local Area Network (LAN). In some implementations, the computer network encompasses a relevant portion of a Wide Area Network (WAN) and/or other network.

The display(s) 106 may include one or more devices that display images and/or other data to a user. In some implementations, the display(s) 106 are implemented using Cathode Ray Tube (CRT), Plasma Display, Liquid Crystal Display (LCD), =Light Emitting Diode (LED) technologies, and/or fiber optic projector systems. The display(s) 106 may be configured to display a virtual environment, either alone (in replacement of the real world environment) or in an augmented environment. In some implementations, the display(s) 106 displays virtual elements, interactions with virtual elements, etc. In some implementations, the display(s) 106 comprise at least a portion of the input device(s) 108 as discussed further herein.

The virtual environment management system 100 may, but need not, include one or more input device(s) 108. The input device(s) 108 may include one or more devices that receive/detect user input from a user. The input device(s) 108 may comprise physical keyboards, joysticks, mice, trackpads, other peripherals, and/or portions of a touch-screen display. As an example, the input device(s) 108 may, in some implementations, comprise portions of touch-screen displays that facilitate and/or initiate interactions with virtual environments supported by the systems and methods herein. In some implementations, one or more sensor(s) 102 may be carried (e.g., attached to, supported, held, disposed on, and/or otherwise carried) by one or more input device(s) 108.

The processor(s) 110 may be configured to provide information processing capabilities in the virtual environment management system 100. In some implementations, the processor(s) 110 may include one or more of a digital processor, an analog processor, a digital circuit designed to process information, an analog circuit designed to process information, a state machine, and/or other mechanisms for electronically processing information.

Although processor(s) 110 is shown in FIG. 1 as a single entity, this is for illustrative purposes only. In some implementations, processor(s) 110 may include a plurality of processing units (e.g., a plurality of CPUs and/or GPUs). These processing units may be physically located within the same device, or processor(s) 110 may represent processing functionality of a plurality of devices operating in coordination. The processor(s) 110 may be configured to execute one or more computer-readable instructions 140. In some implementations, the processor(s) 110 is configured to execute the computer-readable instructions 140 by software, hardware, firmware, or some combination of software, hardware, and/or firmware; and/or other mechanisms for configuring processing capabilities on processor(s) 110.

Computer-Readable Instructions 140

The computer-readable instructions 140 may include a display management component 122, a sensor management component 124, a user interaction management component 126, a physics system management component 128, a virtual element component 130, an anchor component 132, and/or other computer-readable instructions components.

It should be appreciated that although the display management component 122, the sensor management component 124, the user interaction management component 126, the physics system management component 128, the virtual element component 130, and the anchor component 132 are illustrated in FIG. 1 as being co-located within a single processing unit (e.g., the processor(s) 110), in implementations in which processor(s) 110 includes multiple processing units, one or more of the display management component 122, the sensor management component 124, the user interaction management component 126, the physics system management component 128, the virtual element component 130, and the anchor component 132 may be located remotely from the other components.

The description of the functionality provided by the display management component 122, the sensor management component 124, the user interaction management component 126, the physics system management component 128, the virtual element component 130, and the anchor component 132 described herein is for illustrative purposes, and is not intended to be limiting, as any of the display management component 122, the sensor management component 124, the user interaction management component 126, the physics system management component 128, the virtual element component 130, and the anchor component 132 may provide more or less functionality than is described. For example, one or more of the display management component 122, the sensor management component 124, the user interaction management component 126, the physics system management component 128, the virtual element component 130, and the anchor component 132 may be eliminated, and some or all of its functionality may be provided by other ones of the display management component 122, the sensor management component 124, the user interaction management component 126, the physics system management component 128, the virtual element component 130, and the anchor component 132. As another example, processor(s) 110 may be configured to execute one or more additional components that may perform some or all of the functionality attributed herein to one of components the display management component 122, the sensor management component 124, the user interaction management component 126, the physics system management component 128, the virtual element component 130, and the anchor component 132.

In some implementations, the computer-readable instructions 140 provide instruction to operate one or more applications including an operating system, a virtual 3D environment application, a physics engine and/or a user interaction engine (e.g., if not included in the 3D environment application), various drivers (e.g., for the interfaces and communications of the system) in addition to other programs, for example, a browser application.

Display Management Component 122

The display management component 122 may include computer-readable instructions configured to manage the display(s) 106. The display management component 122 may include instructions to effectuate display of the virtual environment, including one or more virtual elements, on the display(s) 106. The virtual environment may be displayed on the display(s) 106 so that the virtual element(s) appear to move in response to one or more forces applied to the virtual element(s).

In some implementations, the display management component 122 includes instructions for addressing portions of the display(s) 106 to display specific aspects of a virtual environment, either alone, or as part of an augmented environment. For example, the display management component 122 may include instructions to address specific pixels of the display(s) 106 with specific colors, images, virtual elements, etc. that are provided to the user as part of a virtual environment. In various implementations, the display management component 122 selects specific colors, images, virtual elements, etc. based on attributes of the physical environment surrounding a user to implement an augmented environment. In various implementations, the display management component 122 selects specific colors, images, virtual elements, etc. based on a state of a virtual environment and/or user interactions taken (e.g., user interactions taken on virtual elements) in the virtual environment.

Sensor Management Component 124

The sensor management component 124 may include computer-readable instructions configured to manage the sensor(s) 102. The sensor management component 124 may be coupled to graphics processing hardware, software, and/or firmware for processing images, and/or other hardware, software, and/or firmware for processing other forms of sensor data. In various implementations, the sensor management component 124 obtains image, depth, and/or other data from the sensor(s) 102 and extracts image information, depth and/or other positional information, etc. from the data. The sensor management component 124 may provide the extracted information to the physics system management component 128 and/or other components of the virtual environment management system 100.

User Interaction Management Component 126

The user interaction management component 126 may include computer-readable instructions configured to manage user interactions from devices that can receive/detect user interactions, including but not limited to the sensor(s) 102, input device(s) 108, and/or other devices coupled to the virtual environment management system 100. A user interaction may refer to one or more actions of a user directed towards the virtual environment and/or one or more virtual elements. A user interaction may be received at a time, over a course of time, at a location, or over a range of locations. In some implementations, the user interaction management component 126 is coupled to peripheral processing hardware, software, and/or firmware that manages the devices that receive/detect user interactions. The user-interaction management component 126 may determine one or more user interactions with one or more virtual elements based on user input (e.g., received via the sensor(s) 102 and/or the input device(s) 108, etc.).

The user interaction management component 126 may provide to the physics system management component 128 any user interaction data that is based on user input into the devices that receive/detect user interactions. "User interaction data," as discussed herein, may refer to user input into the devices that receive/detect user interactions, the input allowing a user to interact with at least a portion of a virtual environment supported by the virtual environment management system 100. In some implementations, the user interaction data comprises interactions with at least portions of a virtual environment, such as interactions with virtual elements in a virtual environment. The virtual environment may, but need not, be incorporated in an augmented environment, as discussed further herein.

In some implementations, the user interaction data managed by the user interaction management component 126 may be based on sensor data from the sensor(s) 102 and/or managed by the sensor management component 124. The sensor data may be based on images taken, e.g., by a still or motion camera coupled to and/or implemented by the sensor(s) 102. The sensor data may be based on depth points (e.g., points along a line orthogonal to the sensor(s) 102) taken by a depth-sensor coupled to and/or implemented by the sensor(s) 102. In various implementations, the sensor data is taken from gyroscopes, accelerometers, and/or other motion sensors coupled to and/or implemented by the sensor(s) 102.

In various implementations, the user interaction management component 126 identifies portions of the virtual environment that correspond to specific user interactions. The user interaction management component 126 may identify where sensor data obtained from the sensor(s) 102 and/or managed by the sensor management component 124 is to be projected into a virtual environment managed by the virtual environment management system 100. As examples, the user interaction management component 126 may identify if/whether specific gestures are related to known virtual points, etc. in the virtual environment. The user interaction management component 126 may further identify whether these virtual points correspond to locations of virtual elements, etc. in the virtual environment. In various implementations, the user interaction management component 126 may modify a state, a property, etc. of a virtual element, etc. based on one or more user interactions. The user interaction management component 126 may, for instance, modify an interactive volume of a virtual element based on user interaction data.

Physics System Management Component 128

The physics system management component 128 may include computer-readable instructions configured to manage a physics system for a virtual environment supported by the virtual environment management system 100. A "physics system," as used herein, may refer to a set of rules that govern physical relationships of virtual elements in the virtual environment. In some implementations, the physics system implemented by the physics system management component 128 may implement rules for force determination in the virtual environment, rules to select and/or manage primitives that form the basis of virtual elements in the virtual environment, rules to define interactive volumes of virtual elements in the virtual environment, and/or rules that allow for and/or define manipulation of virtual elements in the virtual environment.

Force Determinations by Physics System Management Component 128

In some implementations, the physics system management component 128 implements force determinations for virtual elements in a virtual environment. In various implementations, the physics system management component 128 implements force determinations on these virtual elements based on rules assigned to those virtual elements and/or user interaction data from the user interaction management component 126.

One example of the types of force determinations that may be applied includes force determinations based on virtual electromagnetic forces between virtual elements in the virtual environment. Though the discussion herein discusses force determinations based on virtual electromagnetic forces (e.g., on Coulomb's Law) in greater detail, it is noted that the physics system management component 128 may determine virtual forces between virtual elements based on any virtual physical forces and/or other forces, including but not limited to virtual gravitational forces, virtual thermodynamic forces, virtual chemical forces, virtual atomic weak forces, virtual atomic strong forces, etc.

Figure 3A:
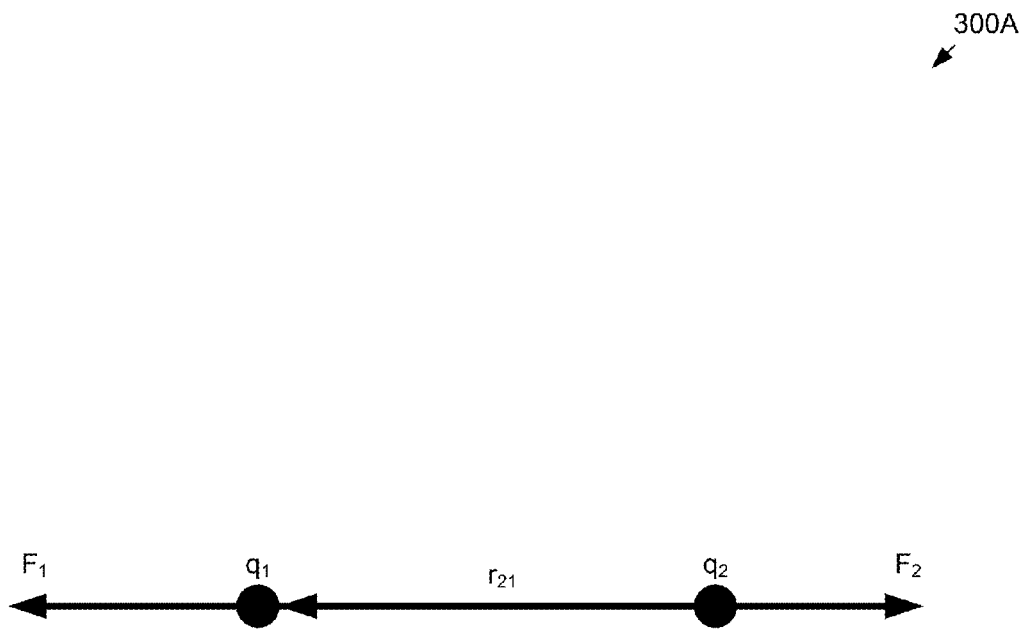
FIG. 3A illustrates an example of a force diagram showing manipulation of virtual elements using forces, in accordance with one or more implementations.

As a result, in some implementations, the physics system management component 128 determines forces between virtual elements based on virtual electromagnetic forces between the virtual elements. Turning to FIG. 3A, FIG. 3A shows an illustration 300A of an example of how force may be applied to virtual elements. By assigning a charge to a point associated with a virtual element and a separate charge to a point of input associated with a real world element and/or real world object detected by a sensing device, the elements' interaction can be governed by Coulomb's Law, which models the electric forces between two charges. For example, the magnitude of the electrostatic force of interaction between two point charges can be programmed to be directly proportional to the scalar multiplication of the magnitudes of charges and inversely proportional to the square of the distance between them. The force is applied along the straight line joining the points. If the two points have the same charge (e.g., positive and positive), the virtual electrostatic force between them is repellant (e.g., the points try move away from one another); if the two points have different charges (e.g., positive and negative), the virtual force between them is attractive (e.g., the points try to move towards one another), as shown in FIG. 3A.

Coulomb's law can be stated as a mathematical expression. The scalar and vector forms of the mathematical equation are given by:

$$|F| = k_e \frac{|q_1 q_2|}{r^2} \quad \text{Equation 1}$$

and $$|F| = k_e \frac{|q_1 q_2|}{|r_{21}|^2} r^{21}, \quad \text{Equation 2}$$

respectively, where $k_e$ is Coulomb's constant $k_e = 8.9875 \times 10^9$ N·m²·C⁻² and $q_1$ and $q_2$ are the signed magnitudes of the charges, the scalar r is the distance between the charges, the vector $r_{21} = r_1 - r_2$ is the vectorial distance between the charges, and $$r^{21} = \frac{r_{21}}{|r_{21}|} \quad \text{Equation 3}$$

(a unit vector pointing from $q_2$ to $q_1$).

For example, as shown in FIG. 3A, if $q_2$ represents a point charge of an input from a sensor (e.g., a depth sensor)

corresponding to a coordinate from a point cloud associated with a real world element and $q_1$ is a point charge associated with the virtual element, then the vector form of the equation calculates the force $F_1$ applied on $q_1$ by $q_2$. The determined force can be applied to the virtual element according to one or more properties associated with the virtual element. In one implementation, a derivative of Coulomb's law is applied to simplify the computation of force applied to a virtual element. For example, the constant $k_e$ and $q_1$ can be replaced by a single constant K, if the point charges on the primitive are constant at that instance, which is given by:

$$|F_1| = K \frac{q_2}{|r_{21}|^2} r^{21} \qquad \text{Equation 4}$$

Furthermore, other force mapping functions can be used to compute force applied to a virtual element—for example, to create a different behavior resulting from the force interaction. For example, the distance may be mapped to the force computation using a reciprocal function (e.g., $F \alpha 1/r^4$) to obtain a faster rate of force application (e.g., when a faster response time is desired form a force interaction).

Use of Primitives by the Physics System Management Component 128

Returning to FIG. 1, in some implementations, the physics system management component 128 may access a data file in the primitive datastore 116 that contains data relating to primitives corresponding to virtual elements and/or virtual elements. Virtual elements may be expressed as one or more primitives. The data file may store one or more primitives, coordinates, assigned content and/or graphics corresponding to virtual elements modeled in the 3D virtual environment. In one example, primitives may be thought of the building blocks of virtual elements in the 3D virtual world. Primitives include a number of parameters, which may be assigned according to the properties desired for the corresponding virtual element. For example, parameters may include at least a type, a charge, a field, a size, one of more constraints, and coordinates. A charge combined with a field describes an interactive volume of a virtual element.

A primitive's "type," as used herein, may include an identifier (ID) specifying the geometry of the primitive. Types of primitives include a point, a line or a line segment, a plane (or subset of a plane with a boundary condition, such as a circle or rectangle), an ellipsoid (e.g., a sphere), a cylinder, and a torus, which are described in more detail below. The geometric models may be specified by piecewise parametric equations corresponding to a shape and/or a size of the primitive.

In an implementation, the charge parameter of a primitive may be positive, negative, or no charge (e.g., 0)) and have a magnitude (e.g., 0<q<100). If the charge of the virtual element is the same as the charge associated with a point from a sensor input, then the force applied by the sensor input on the virtual element may be repellant, and if the charge of the virtual element is the opposite to the charge associated with a point from a sensor input, then the force applied by the sensor input on the virtual element may be attractive, for instance. In an implementation, a primitive may have multiple charges.

A "field" of the primitive, as used herein, may define an interactive boundary, or area of interactivity, of the primitive within the virtual environment. When the field is combined with a charge, it may define an "interactive volume" that specifies interaction with translated real world objects. In one example, the field parameter (e.g., 0 cm<$d_f$<=10 cm) is a distance d measured by a line segment of length d orthogonal to the core of the primitive at which, when coordinates of a sensor input are determined to be within it, the primitive becomes interactive (e.g., responds to forces acting on the primitive according to a charge associated with the field). Alternatively, the distance df may be measured as a line segment of length d orthogonal to a core associated with the virtual element. When coordinates of a sensor input are determined to be within the boundary defined by the parameter, virtual element becomes active or interactive and is capable of responding in a defined manner to the sensor input (e.g., responsive to the application of force from the sensor input according to a charge associated with the field).

A primitive may have multiple interactive volumes. In some implementations, a primitive has at least two interactive volumes. For example, a primitive may have a first charge (e.g., zero charge) that is applied from the core to a first field distance, and a second charge (e.g., a positive or negative charge) that is applied between the first field distance and a second field distance. To continue the example, from the core to a first distance (e.g., 0 cm<=dfcore<=5 cm), the primitive can have a zero charge to generate a neutral interactive volume. Within the neutral interactive volume, no forces are applied to the virtual element associated with the primitive and thus no force computation is performed. In an implementation, providing a neutral interactive volume around the core of a primitive prevents an infinite amount of force from being applied to the primitive and its related virtual element, for example, at an instance due to an attempt to divide by zero during a force calculation, which can result in unwanted manipulation of a virtual element. In an example, the neutral interactive volume may be roughly correlated to the visual size or portion of the rendering of a virtual element as it appears to a user. In addition, from the first distance to the second distance (e.g., 5 cm<$d_{fforce}$<=10 cm), the field has a charge (e.g., positive or negative) that creates a repellant interactive volume (e.g., charge of field is same as charge associated with a sensor input) or an attractive interactive volume (e.g., charge of field is opposite to a charge associated with a sensor input) that governs the way that applied force (as defined by the sensor input) acts on the primitive. Beyond the second distance, the primitive is inactive. Examples of these interactive volumes are shown in conjunction with the primitives illustrated in FIGS. 2A, 2B, 2C, 2D, 2E, and 2F.

In some implementations, a primitive has three interactive volumes: an inner neutral interactive volume, an intermediate repellant interactive volume, and a third outer attractive interactive volume. In this example, the combination of interactive volumes allows a virtual element to be moved and "held" in space as the attraction and repellent forces balance in an equilibrium state (e.g., the force of repulsion is substantially equal to the force of attraction at a specified distance from the core). An example of a primitive with three interactive volumes configured in this fashion is shown in FIG. 2F. For example, assume a primitive has neutral interactive volume (e.g., 0 cm<=$d_{fcore}$<=5 cm, charge=zero), a repellant interactive volume (e.g., 5 cm<$d_{frepel}$<=10 cm charge=positive), and an attractive interactive volume (e.g., 10 cm<$d_{fattract}$<=20 cm charge=negative), and a sensor input has a positive charge. As a sensor input coordinates move within a distance of 20 cm of the primitive, the primitive experiences an attractive force and moves toward the sensor input. As long as the sensor input maintains a distance (e.g., 10 cm<$d_{sensorinput}$<=20 cm), the primitive continues to be attracted or move towards the sensor input. If the sensor input remains in place over time, the primitive continues to be attracted and moves towards the coordinates of the sensor input until the distance from the core of the primitive reaches 10 cm. At this point, the object stops, as the attractive force generated by the attractive interactive volume equals the repellant force generated by the repellant interactive volume. In this sense, a virtual element is held in the virtual space. If the sensor input coordinates move within 10 cm, the primitive experiences a repellant force and movers away from the coordinates of the sensor input, giving the primitive the appearance of body or substance to the user. As long as the sensor input maintains a distance (e.g., 5 cm$<d_{sensorinput}<=$10 cm), the primitive continues to be repelled and moves away from the sensor input. If the sensor input moves within 5 cm no force is applied to the primitive, for example, to prevented unwanted force calculations and/or virtual element manipulation.

For example, if points from a depth camera related to the sensor(s) 102 correspond to a user's hand and the primitive described in the previous paragraph (e.g., the discussion related to FIG. 2F) is incorporated into a virtual element in a virtual 3D space, the user may reach towards the virtual element, breaking the outer interactive volume of an associated primitive, and causing the virtual element to be attracted to the user's hand to the point of equilibrium between the attractive and repellent interactive volumes associated with the primitive (i.e., until it is within 10 cm of the translated coordinates of the user's hand), at which point the virtual element will come to rest. If the translated coordinates of the user's hand maintain this distance relative to the virtual element, the virtual element moves with the translated hand as long as this distance is maintained. In this manner, a user may "hold" the element. For example, when in this "hold" position, if the user's hand moves closer to the virtual element, the virtual element will move away of the user's hand, seemingly responding to the movement of the user's hand as it appears to hold the virtual element. Conversely, if the user moves his or her hand away from the virtual element with sufficient velocity, the sensor points representing the user's hand will leave the attractive interactive volume around the virtual element, and the hand will appear to release or shake off its hold of the virtual element.

In an example, a virtual element may be held using two forces (e.g., a neutral interactive volume surrounded by an attractive interactive volume) in a similar manner; however, in this instance, the virtual element can be penetrated (e.g., as there is no repellant interactive volume).

Visual parameters of the primitive may be used to define the visual properties of the primitive. For example, a size, color, and a texture parameter may be provided and used in rendering of the primitive in the virtual 3D space. In addition, a link, identifier, or pointer may be used to associate and/or map virtual content to the primitive. For example, graphics of a web page may be mapped to a panel primitive simulating a virtual 3D multi-touch pad, while allowing a user to perform click or gestures inputs on a virtual web panel.

"Constraints" of the primitive can be used to define how the primitive responds to forces exerted on the primitive when the primitive is active. For example, a force vector and a constraint (among other parameters) may be input to a physics engine or other logic program to simulate the dynamics of the virtual 3D environment and to determine a response of the primitive to the application of the force. Examples of constraint parameters may include: drag, angular drag, mass, and center of mass, and trajectory. Drag is the force exerted in the direction opposite to the translation velocity of a primitive (e.g., 0$<$dragx$<$1, 0$<$dragy$<$1, 0$<$dragz$<$1). Angular drag is the force applied in the direction opposite to the rotational velocity of a primitive (e.g., 0$<$dragangular$<$1). Mass is the resistance of the primitive to being accelerated by a force applied to the primitive. In one example, the mass of a virtual element in the 3D virtual space may be 0.1 kg$<$mass$<$10 kg; however, other amounts and units of measurement may be used. Center of mass is the point (e.g. cm=(x, y, z)) of the primitive where a force may be applied causing the primitive to move in the direction of the applied force without rotation. Trajectory is a predefined path an object can travel in a 3D virtual space, and it constrains the possible movement of the 3D virtual element (e.g., moving on a curve). In addition, the primitive has coordinates (e.g., $p_1$=(x, y, z)) associated therewith to define its position in a virtual space and where the primitive is rendered for display.

Figure 2A:
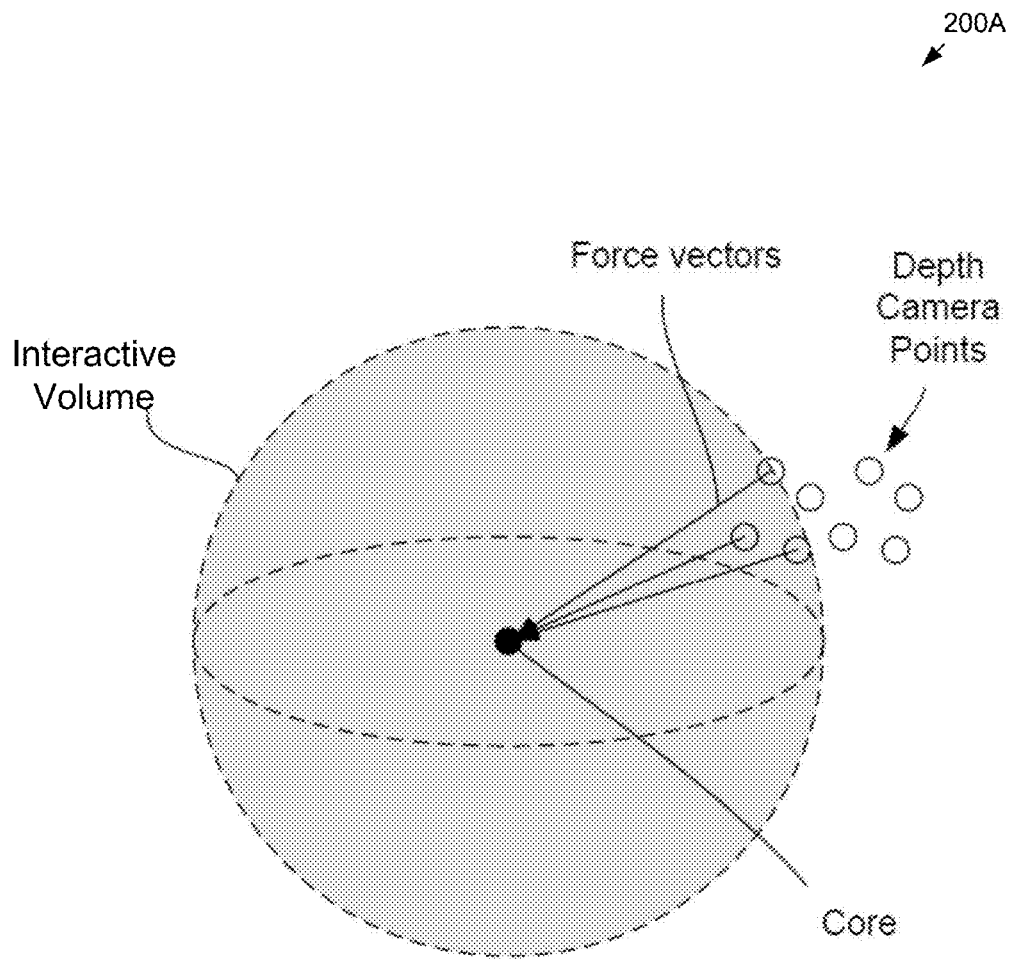
FIGS. 2A, 2B, 2C, 2D, 2E, and 2F show examples of primitives that may be used to build virtual elements, in accordance with one or more implementations.
Figure 2B:
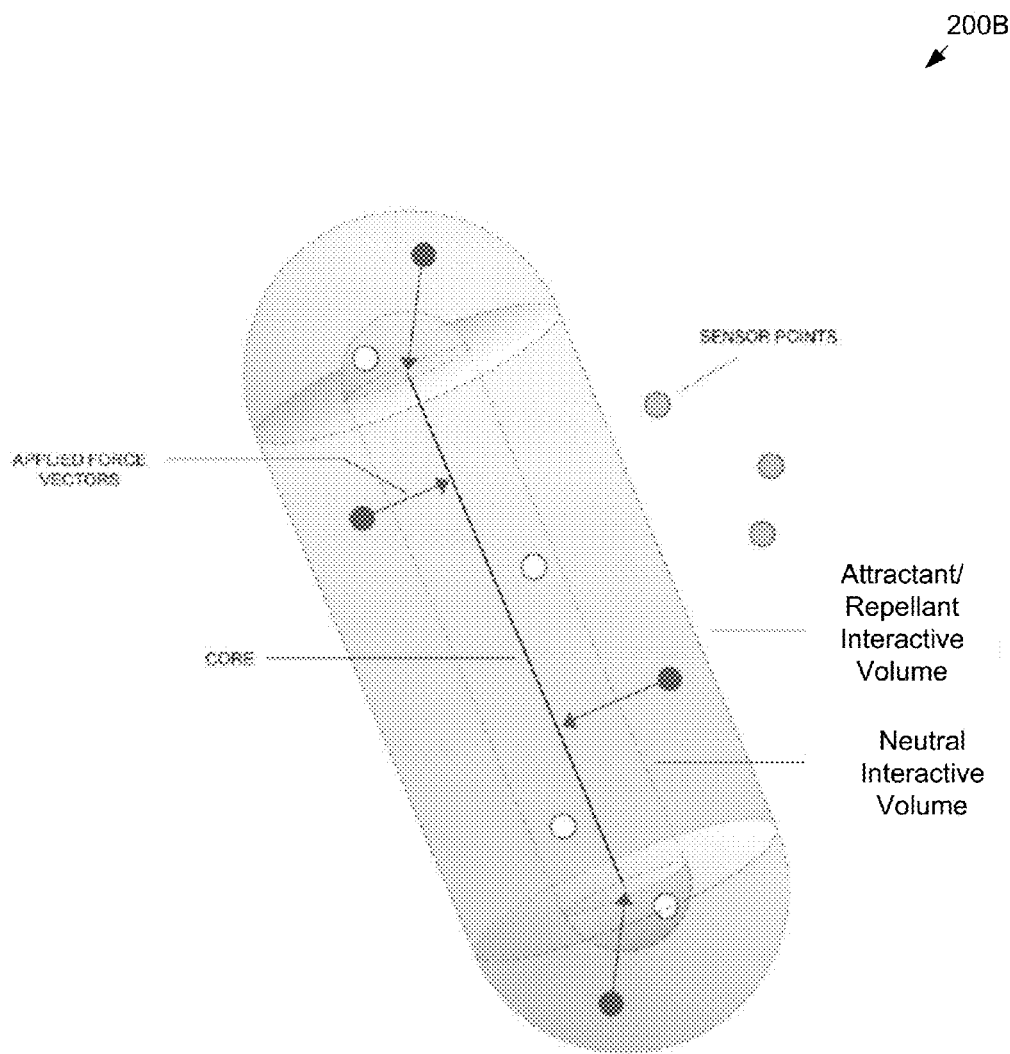
Figure 2C:
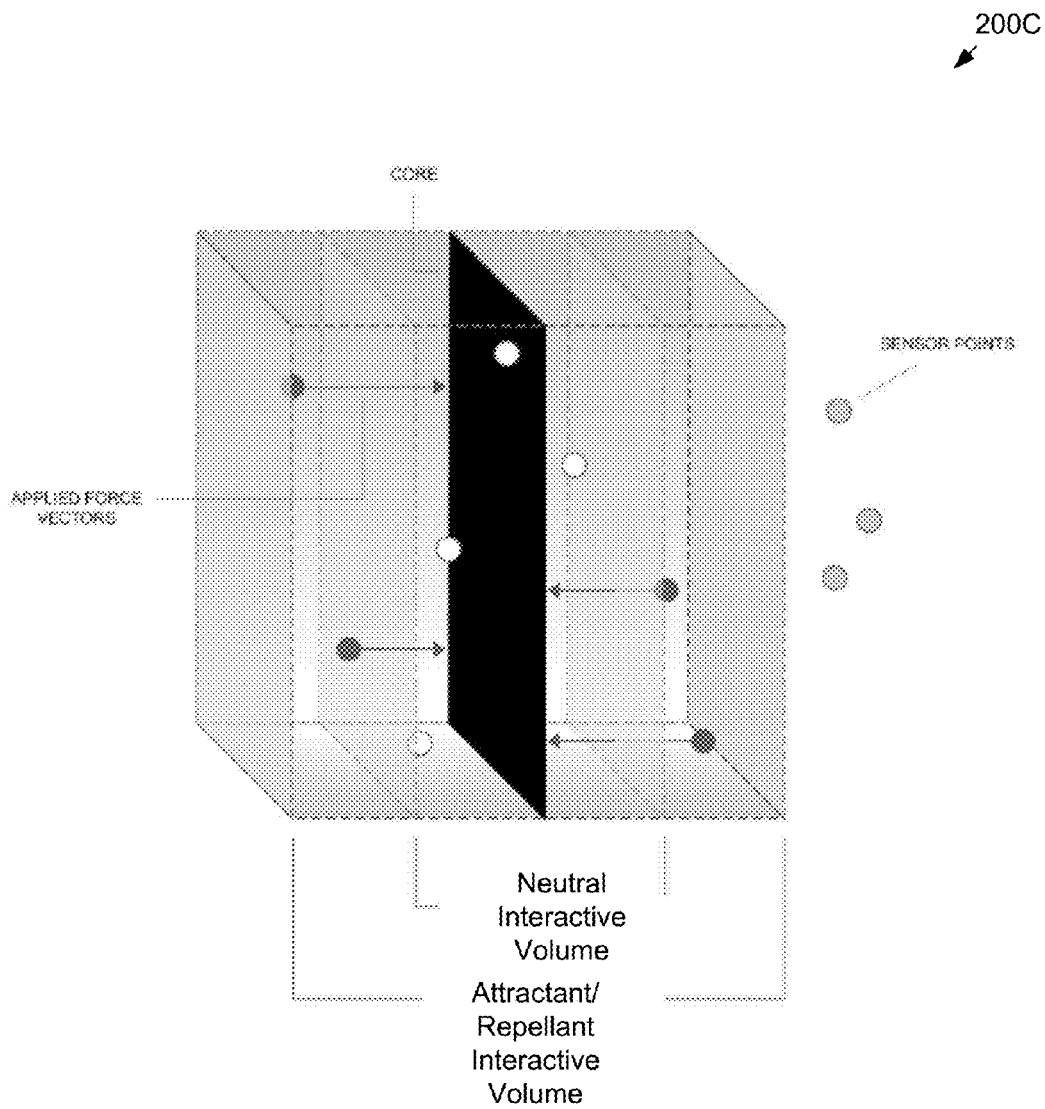
Figure 2D:
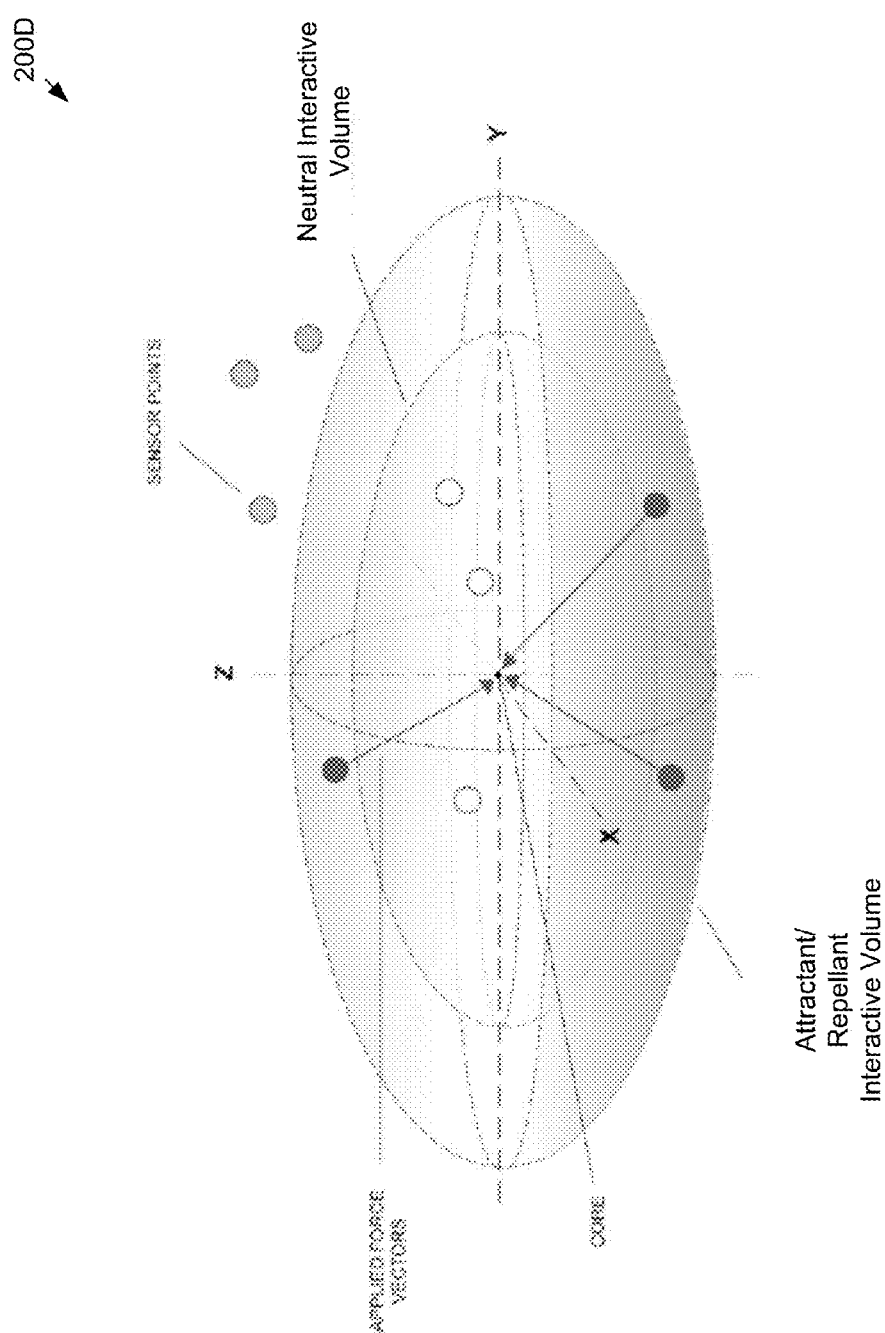
Figure 2E:
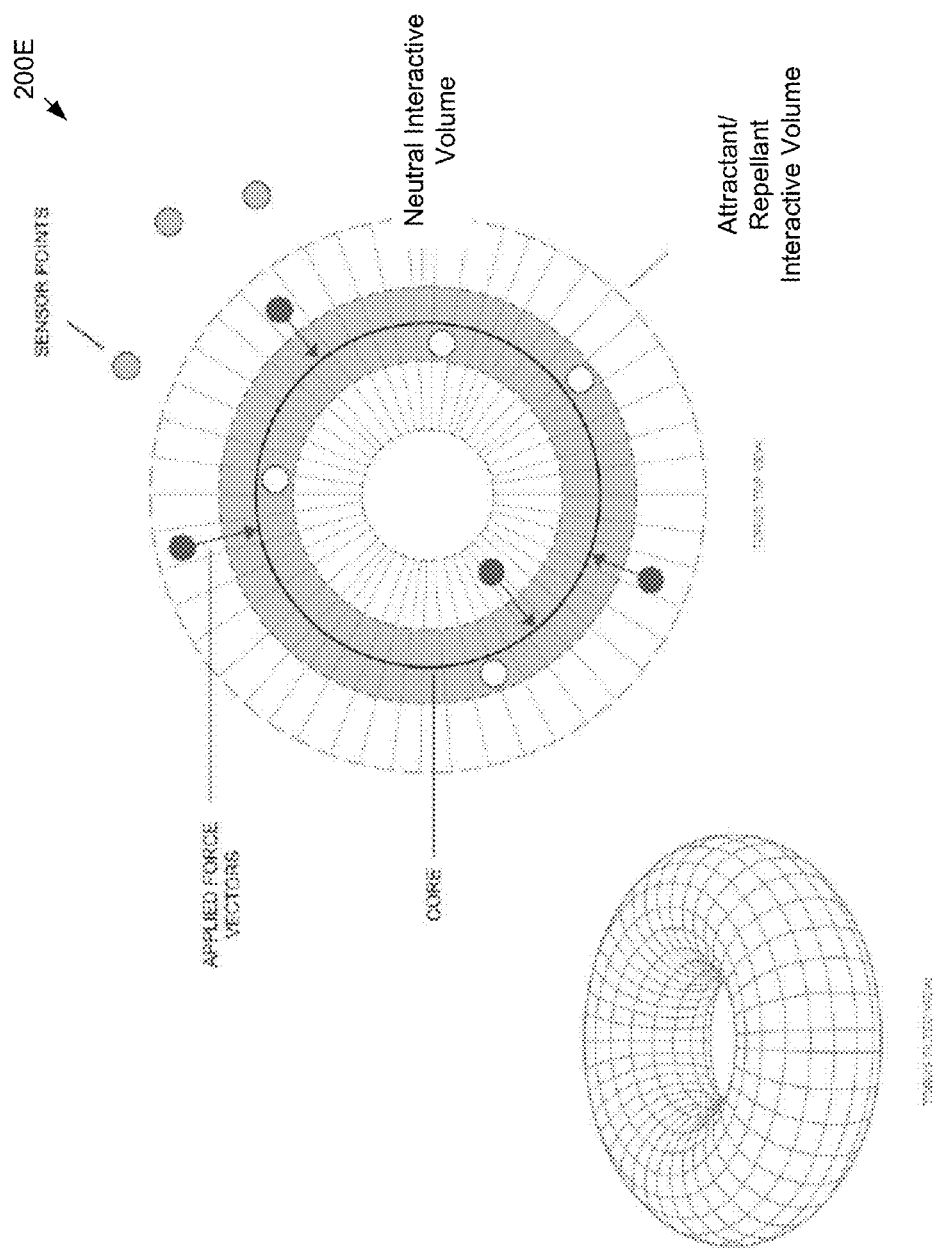
Figure 2F:
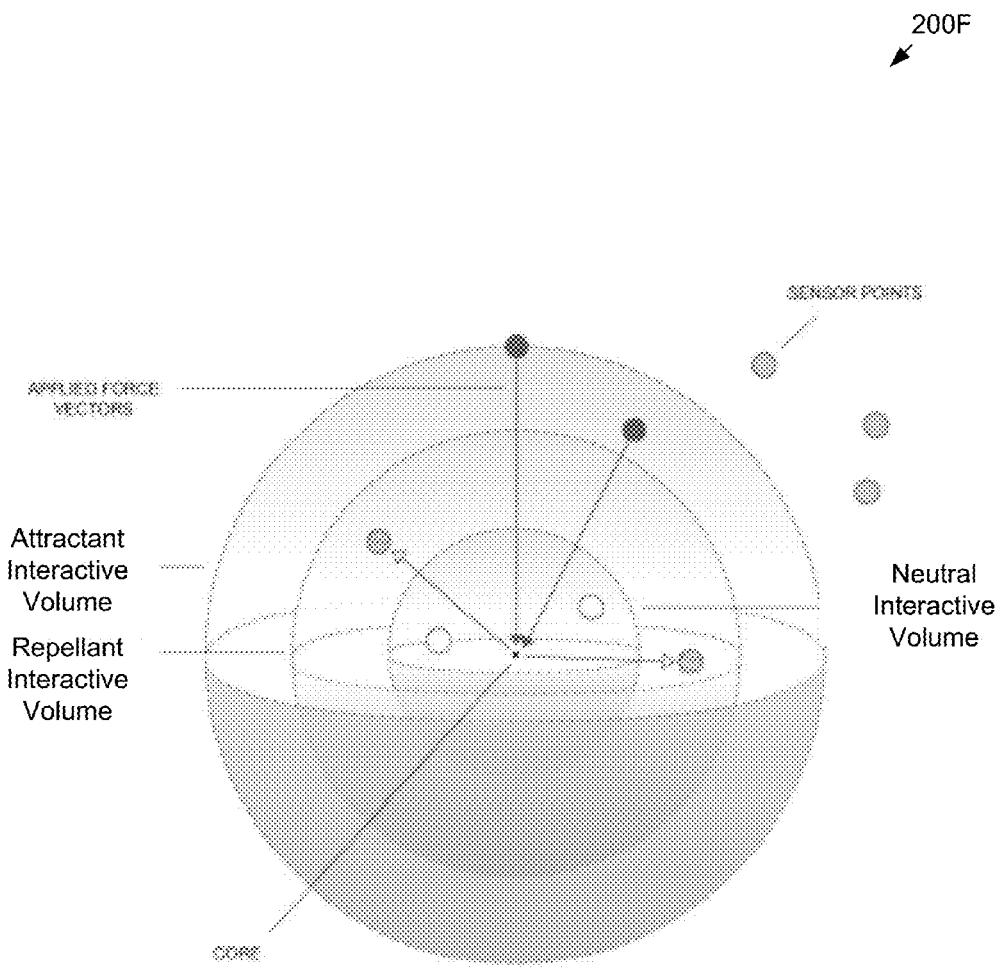

FIGS. 2A, 2B, 2C, 2D, 2E, and 2F show examples of primitives that may be used to build virtual elements. As previously stated, the primitives are the building blocks of the virtual elements in a virtual 3D space. For example, individual primitives may be used, or one or more of the same or a mixture of different primitives may be combined, to model virtual elements in a virtual 3D space. FIG. 2A illustrates an example of a point primitive with an associated interactive volume. A point primitive represents a single point in a virtual 3D space. FIG. 2B illustrates an example of a line primitive with an associated interactive volume. The line primitive represents a line or a line segment in the 3D space. FIG. 2C illustrates an example of a plane primitive with an associated interactive volume. The plane primitive represents a plane or a subset of a plane (i.e., a plane type object with a boundary condition forming a closed loop, such as, for example, a circle, a triangle, a rectangle or other 2D polygon). FIG. 2D illustrates an example of an ellipsoid primitive with an associated interactive volume. An ellipsoid primitive represents a 3D closed quadric surface analogue of an ellipse, including a tri-axial ellipsoid, oblate ellipsoid of revolution; a prolate ellipsoid of revolution, and a sphere. The cylinder primitive is a 3D object having a surface formed by the points at a fixed distance from a given straight line or axis. FIG. 2E illustrates an example of a torus primitive with an associated interactive volume. The torus primitive is a 3D object having a surface of revolution generated by revolving a circle in three-dimensional space about an axis coplanar with the circle. FIG. 2F illustrates an example of a sphere primitive (which is a special case of an ellipsoid primitive) with associated interactive volumes.

Additional primitives, or combination of primitives forming a superset (e.g., a rectangular frame formed by four lines joined as a rectangle as a rigid body) can be created and defined, and the above list and drawings are not meant to be the only examples of shapes that may be assigned to a primitive. This enables modeling of an infinite number of differently shaped virtual elements by combining primitives to simulate a rigid body and corresponding interactive volume approximating the shape of any virtual element.

One will appreciate, that one or more of the parameters may be designated as permanent or dynamic (e.g., changed by an application at a point in time to modify the behavior and/or appearance of the virtual element within the 3D virtual space). For example, the charge of an interactive volume of a primitive could be changed by an application during operation of the application from positive to negative to change the behavior of the primitive over time or in response to a particular event.

Interactive Volumes and Interactivity by Physics System Management Component 128

Returning to FIG. 1, in some implementations, the physics system management component 128 implements interactivity. As discussed herein, primitives can be assigned an interaction volume that forms an interactive boundary that is used to determine whether—and under what circumstances—a primitive is interactive (e.g., the primitive may respond to a force based on its associated properties). For example, the interaction volume can be expressed by at least one distance parameter $d_f$ and an associated charge. The distance defines a boundary formed around the primitive at the distance $d_f$ measured orthogonally from the core of a primitive. In another example, the interaction volume can be expressed by multiple boundaries $d_{inner}$ and $d_{outer}$ (e.g., $d_{inner} < d_f <= d_{outer}$) measured orthogonally from the core of a primitive and a charge. Examples of interaction volumes in relation to various sensor input points are illustrated in FIGS. 2A-2F for the various primitive types. When one or more sensor inputs (e.g., coordinates of a point from the point cloud associated with a real world element) are within the boundary defined by the interaction volume, the primitive becomes interactive and force may be applied to the primitive. Thus, in one example, the interaction volume boundary can reduce the computational burden associated with processing of virtual elements in a virtual 3D space by only determining forces and/or other computations associated with virtual element that is within range of a point cloud. As a result, any point cloud that is not within the boundary of the interaction volume is not is not involved in any computation associated with the virtual elements.

Figure 3B:
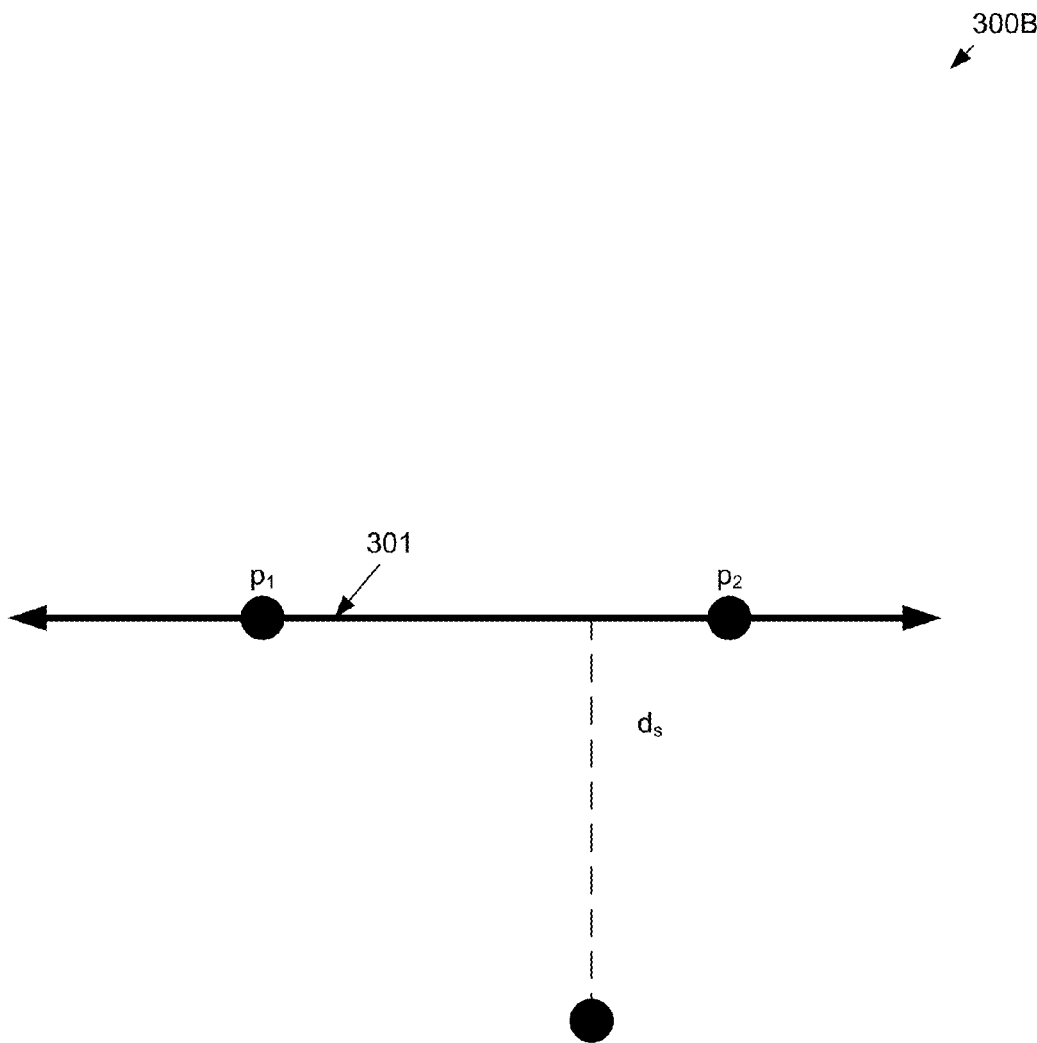
FIG. 3B illustrates an example of a boundary of an interactive volume of a primitive, in accordance with one or more implementations.

FIG. 3B illustrates an example 300B of a boundary of an interactive volume of a primitive, in accordance with one or more implementations. Included in FIG. 3B is a primitive 301. In this example, the primitive 301 may be interactive when the distance ds, corresponding to the length of a straight line segment orthogonal to a point on the core of the primitive extending from the point on the core to the coordinates of the point associated with an input from a sensor, is less than $d_f$. FIG. 3B illustrates one example of this determination for a line primitive. As shown in 3B, a line primitive is expressed by two points $p_1$ ($x_1$, $y_1$, $z_1$) and $p_2$ ($x_2$, $y_2$, $z_2$) on the line segment 301. $P_{input}$ ($X_{input}$, $Y_{input}$, $Z_{input}$) represents the input point from a sensor corresponding to a real world object. The shortest distance $d_s$ from $p_{input}$ to the line segment may be determined as:

$$d_s = \frac{|(p_{input} - p_1) \times ((p_{input} - p_2)|}{|p_2 - p_1|} \quad \text{Equation 5}$$

In this example, if $d_s < d_f$, then primitive 301 may be interactive

Virtual Element Manipulation by Physics System Management Component 128

Figure 4:
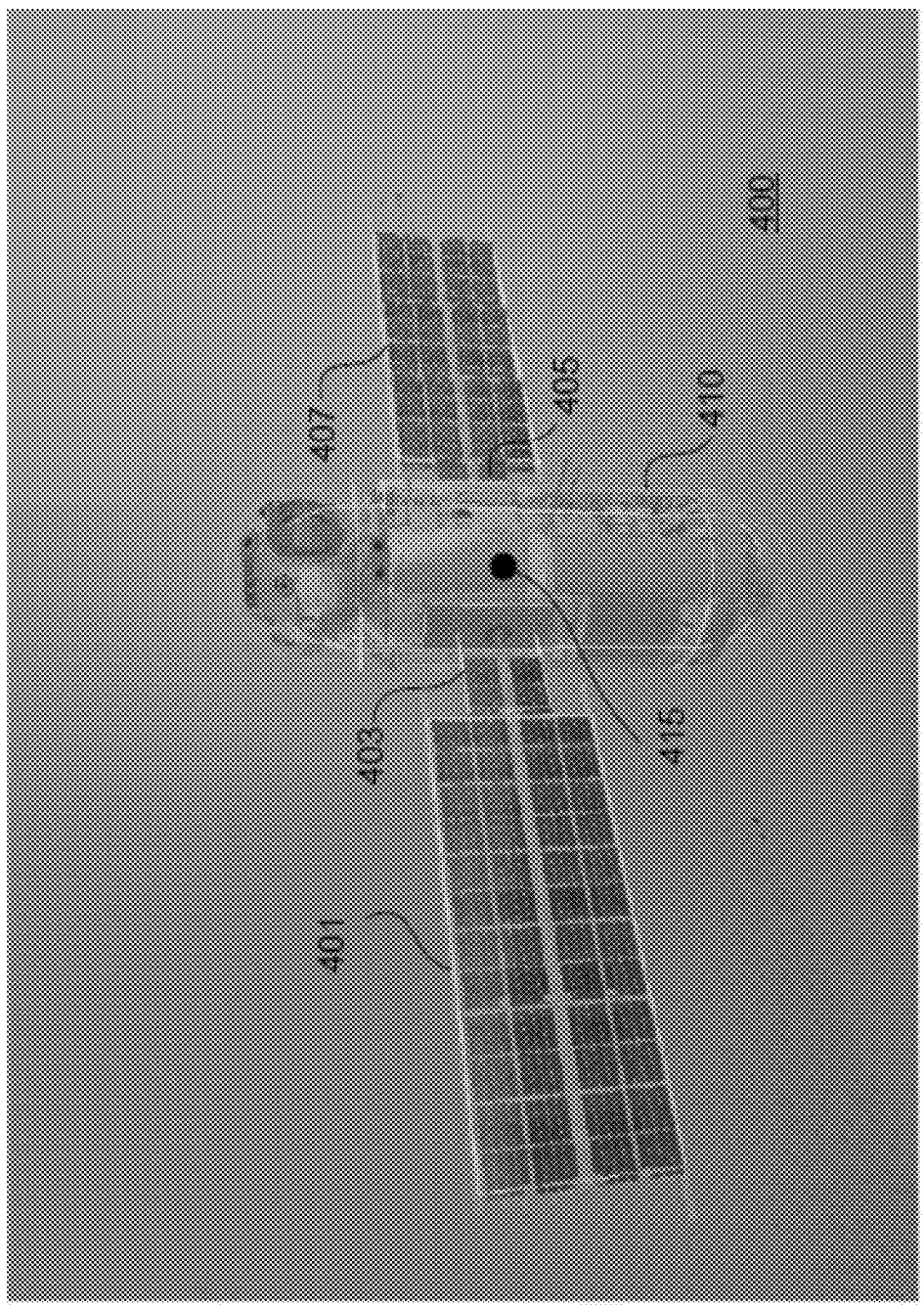
FIG. 4 illustrates an example of application of one or more primitives to content, in accordance with one or more implementations.

Returning to FIG. 1, in some implementations, the physics system management component 128 allows virtual elements to be manipulated. The manipulation of virtual elements may, but need not, depend on interactive force determinations, properties of primitives, and/or interactive volumes/interactivity discussed further herein. As an example, FIG. 4 illustrates an example 400 of the application of primitives to define content in a virtual 3D space and therefore make the content interactive (according to the parameters assigned to any underlying primitive associated with the content). In one example, content of a graphics data file includes data to render virtual 3D graphics depicting a satellite telescope in a virtual 3D space. In order to make the content interactive in the virtual space, one or more primitives are associated with the content. In one example, primitives may be utilized in a modular fashion to emulate the perceived shape of the content and to make content interactive in the virtual world. For example, four plane primitives 401, 403, 405, 407 and a cylinder primitive 410 are mapped to the content of the graphics file to create a virtual element with a center of mass 415. Together, the primitive and the graphics content create a rigid body, in which the rotation and translations of the body are coupled.

Figure 5A:
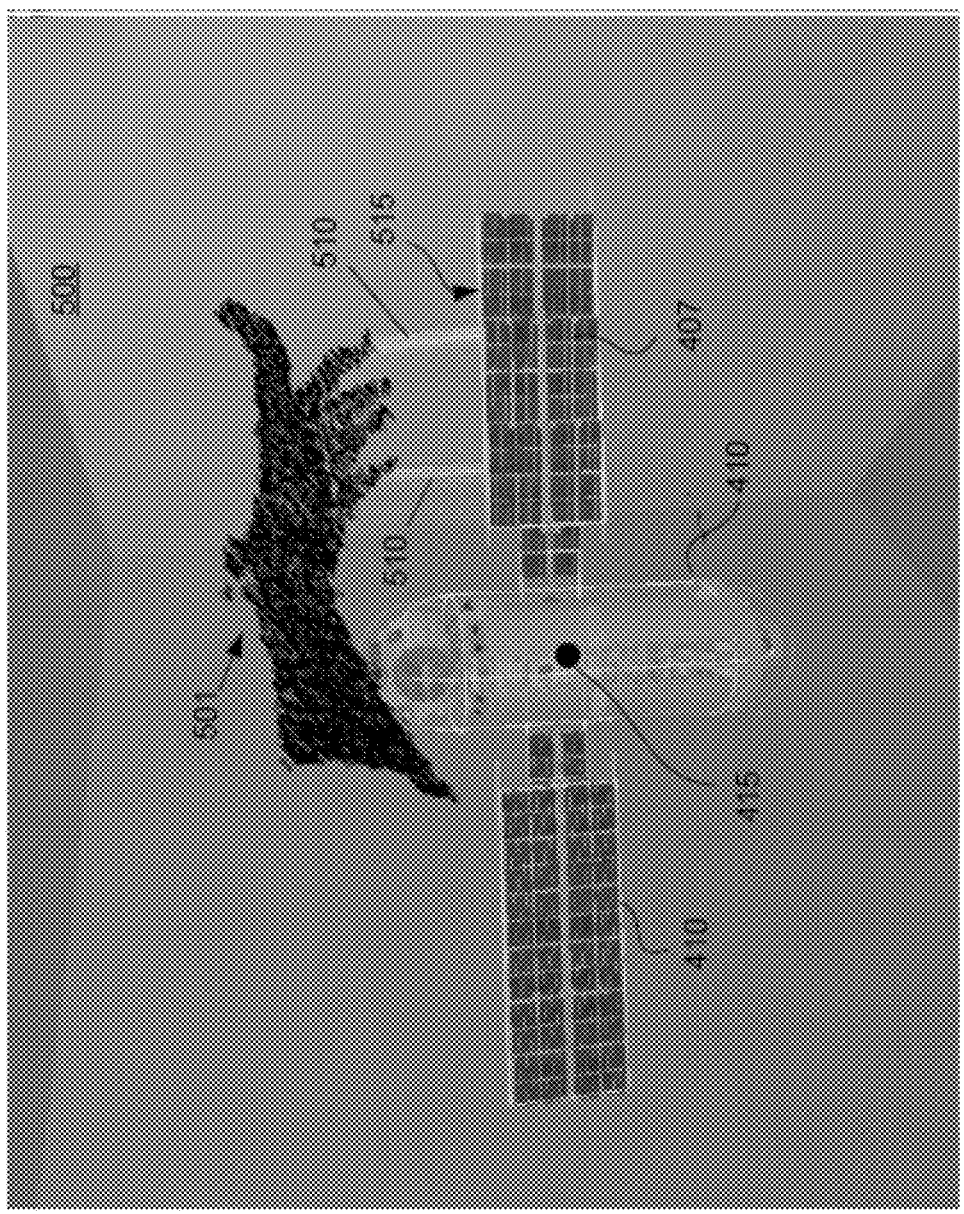
FIGS. 5A and 5B illustrate examples of application of sensor inputs, vectors, and primitives to content, in accordance with one or more implementations.
Figure 5B:
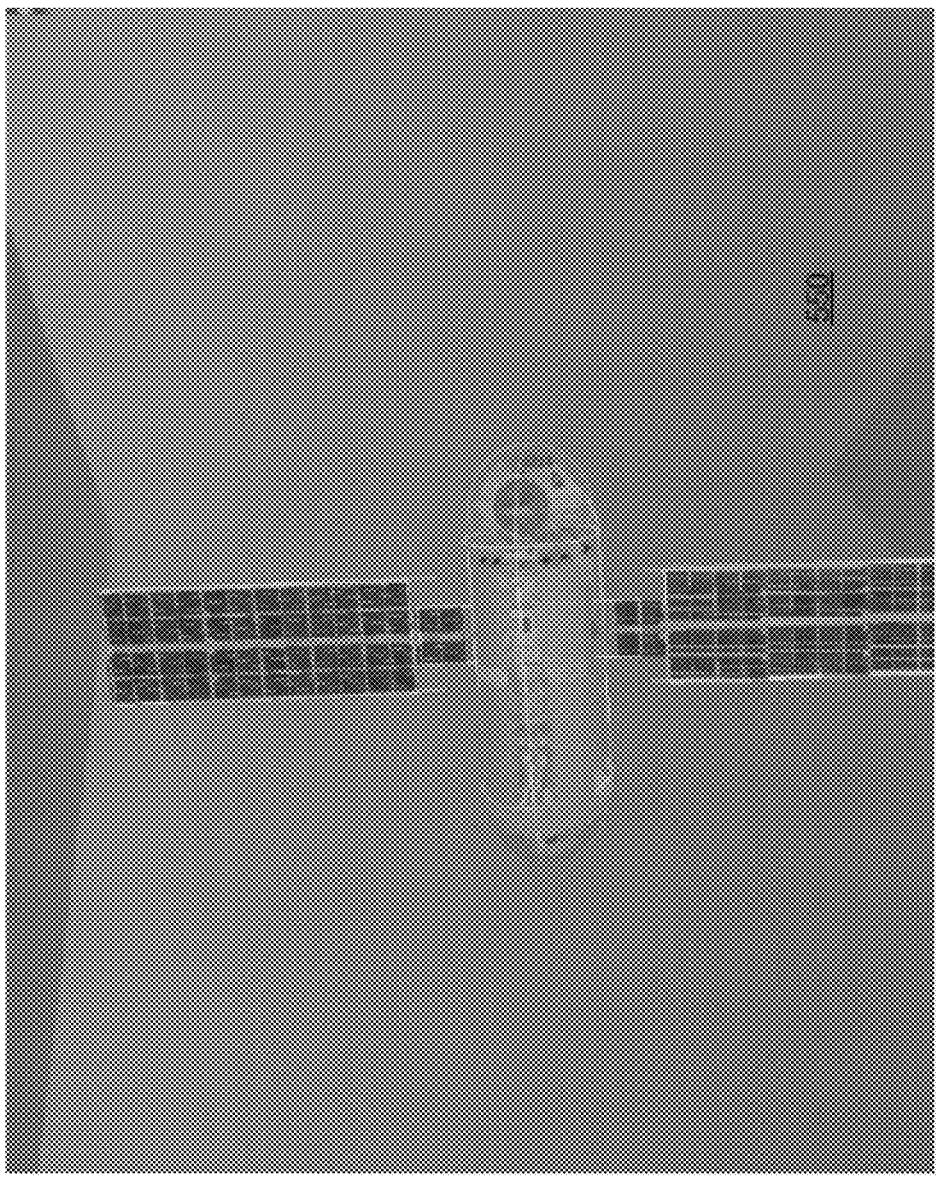

FIG. 5A illustrates an example 500 of the rendering of the virtual element of FIG. 4 (e.g., a satellite telescope) including a visual representation of point cloud 501 derived from sensor input (e.g., depth coordinates of a hand of user). FIG. 5A shows a first orientation 500 of the satellite telescope. Force vectors 510 are illustrated as lines extending from the hand to an edge 515 of the plane primitives 407. As the point cloud of the user's hand moves towards the edge of the plane primitive 407, a force is applied to the edge causing the primitives 401, 403, 405, 407, and 410 and the associated content to rotate about the center of mass 415 to a new orientation 550 in the virtual space, as shown in FIG. 5B. One skilled in the art will appreciate that the illustration of the force vectors 510 as white lines is shown in FIG. 5A to aid understanding of the implementation of FIGS. 4, 5A, and 5B, and actual rendering of a virtual 3D space does not require graphic depiction of the force (much in the way force is not seen in the real world), unless depicting the force is desired in any particular application (e.g., a user tutorial on how to interact with a virtual environment). Similarly, the point cloud 501 corresponding to the sensor input does not have to be rendered or depicted unless desired. For example, in an augmented reality application, the point cloud may not be illustrated; the hand of a user may be directly viewed within the rendered virtual space interacting with the virtual elements. In another example, in a virtual reality application, the point cloud or some other visualization associated therewith can be rendered in the virtual space to aid the user in controlling, manipulating, and interacting with virtual element to show a corresponding location of the real world element and translated into the virtual world in relation to the virtual elements.

Calculation of Applied Forces by Physics System Management Component 128

Returning to FIG. 1, the physics system management component 128 provides for determination and application of one or more forces to virtual elements. The physics system management component 128 may enable movement of the virtual element in response to forces applied to the virtual element.

Virtual Element Component 130

Returning to FIG. 1, the virtual element component 130 may include computer-readable instructions to identify one or more virtual elements in the virtual environment. One or more virtual elements may be identified based on real world objects (e.g., physical objects) and/or based on a program/software running on processor(s) 11. Virtual elements may be linked to real world objects in the vicinity of a user. For example, one physical object in the real world may correspond to multiple virtual elements. The multiple virtual elements may be positioned within the virtual environment according to a particular arrangement. The particular arrangement of multiple virtual elements may be changed.

Object recognition and/or tracking software may be used to detect and determine locations of one or more real world objects. The virtual elements corresponding to the detected real world objects may be identified and placed within the virtual environment based on the identities and the locations of the real world objects. Processor(s) 11 may be used to run an object modeling application and the virtual element component 130 may identify one or more virtual elements corresponding to one or more tools, objects, and/or other components of the object modeling application. Other types of virtual elements identification are contemplated.

Anchor Component 132

Figure 20A:
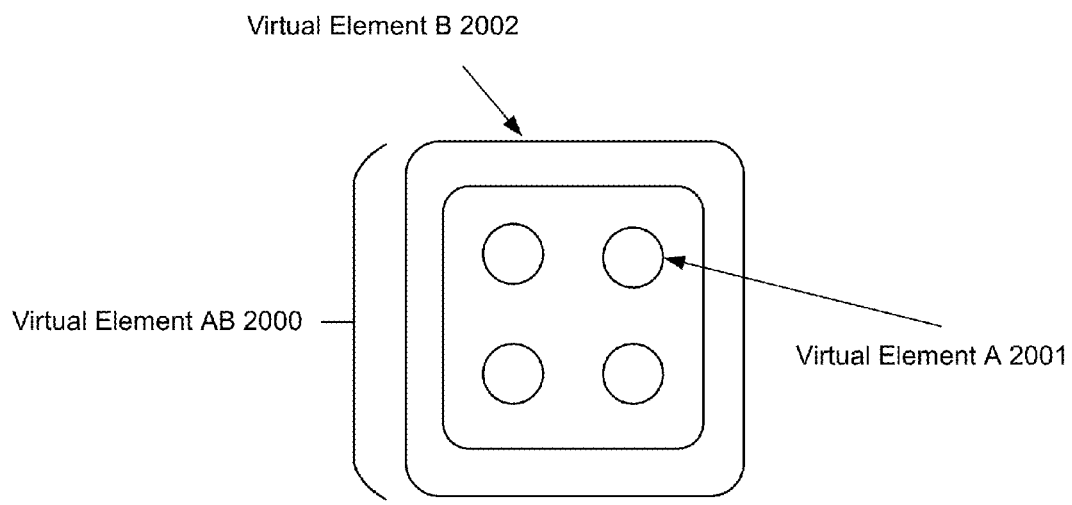
FIGS. 20A-20E illustrate examples of moving a virtual element toward an equilibrium position.

Returning to FIG. 1, the anchor component 132 may include computer-readable instructions to move one or more virtual elements within the virtual environment based on an anchor relationship between the virtual elements. For example, two or more virtual elements may correspond to a physical object. The virtual elements may be a portion of a larger virtual elements. For example, a physical object may correspond to a larger virtual element of an open box with four balls arranged within the box. Individual virtual elements of the larger virtual element may include the open box and the balls. For example, the larger virtual element may be arranged as shown in FIG. 20A. As shown in FIG. 20A, the virtual elements may include virtual element A 2001 (one of the ball virtual elements) and virtual element B 2002 (the box virtual element). Virtual element A 2001 may correspond to one of the inner parts of virtual element AB 2000. Virtual element B 2002 may correspond to the outer part of virtual element AB 2000. Changes in arrangements of virtual element A 2001 and virtual element B 2002 may correspond to changes to virtual element AB 2000.

Anchor component 132 may allow a virtual element to move within the virtual environment based on an anchor relationship between the virtual element and another virtual element. An anchor relationship may define an equilibrium position for a particular virtual element. In some implementations, an anchor relationship may be based on a physical property of an object. A physical property of an object may include a physical friction between two virtual elements. The anchor relationship may include an anchor strength that applies a physical friction to one or more virtual elements. A physical property of an object may include a physical momentum between two virtual elements. The anchor relationship may include an anchor momentum that applies a physical momentum to one or more virtual elements.

Figure 20B:
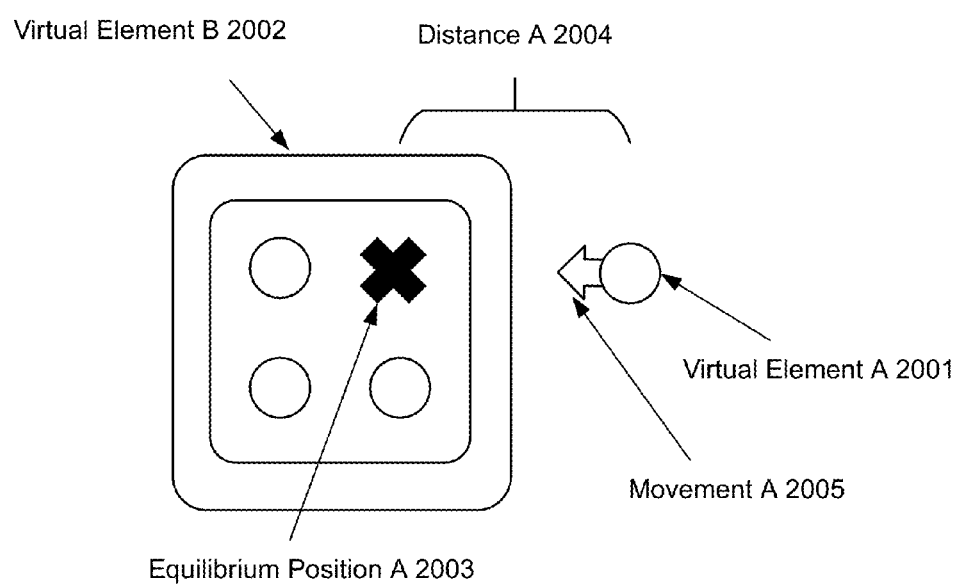

The equilibrium position may define a return position for the particular virtual element with respect to another virtual element. The equilibrium position may be fixed relative to another virtual element. For example, as shown in FIG. 20B, equilibrium position A 2003 may define a return position for virtual element A 2001. Equilibrium position A 2003 may be defined with respect to virtual element B 2002 (e.g., located in upper right part of the inside of virtual element B 2002). The equilibrium position A 2003 may define a return position for virtual element A 2001 to simulate the task of placing a virtual ball in a virtual box.

In some implementations, multiple virtual elements may be associated with multiple anchor points. For example, virtual element A 2001 may be associated with a first anchor point located at the center of virtual element A 2001. Virtual element B 2002 may be associated with a second anchor point located at upper right part of the inside of virtual element B 2002, indicated as equilibrium position A 2003. The anchor relationship may define the equilibrium position for virtual element A 2001 with respect to virtual element B 2002 based on a position of the first anchor point (located at the center of virtual element A 2001) and a position of the second anchor point (indicated as equilibrium position A 2003, located at upper right part of the inside of virtual element B 2002). Equilibrium position A 2003 may define a return position for virtual element A 2001 such that at the return position, the position of the first anchor point of virtual element A 2001 coincides with the position of the second anchor point of virtual element B 2002.

The use of multiple anchor points for one or more virtual elements may allow for adjustments of the positions and/or orientations of the virtual elements at the equilibrium positions. For example, if an anchor point for virtual element A 2001 is located at the center of virtual element A 2001, virtual element A 2001 may return to equilibrium position A 2003 such that virtual element A 2001 is centered at equilibrium position A 2003. If an anchor point for virtual element A 2001 is located at an edge of virtual element A 2001, virtual element A 2001 may return to equilibrium position A 2003 such that the edge of virtual element A 2001 is positioned at equilibrium position A 2003.

The use of multiple anchor points for one or more virtual elements may allow for different virtual elements to return to different positions based on a single equilibrium position. For example, equilibrium position A 2003 may define a return position for another virtual ball with an anchor point located at an edge of the virtual ball. When virtual element A 2001 and the other virtual ball returns to equilibrium position A 2003, virtual element A 2001 and the other virtual ball may not overlap.

The use of multiple anchor points for one or more virtual elements may allow a single virtual element to have multiple anchor points associated with each other. For example, a virtual square origami paper may have four anchor points, one at each corner. The virtual square origami paper may have two equilibrium positions. The first equilibrium position may define a return position for the top-right corner of the virtual square origami paper with respect to the top-left corner of the virtual square origami paper. The second equilibrium position may define a return position for the bottom-right corner of the virtual square origami paper with respect to the bottom-left corner of the virtual square origami paper. Based on the two equilibrium positions, the virtual square origami paper may return to an equilibrium state such that the right-half of the virtual square origami paper is folded over the left-half of the virtual square origami paper. At the equilibrium state, the top-right corner may be located over the top-left corner of the virtual square origami paper and the bottom right corner may be located over the bottom-left corner of the virtual square origami paper.

Figure 20C:
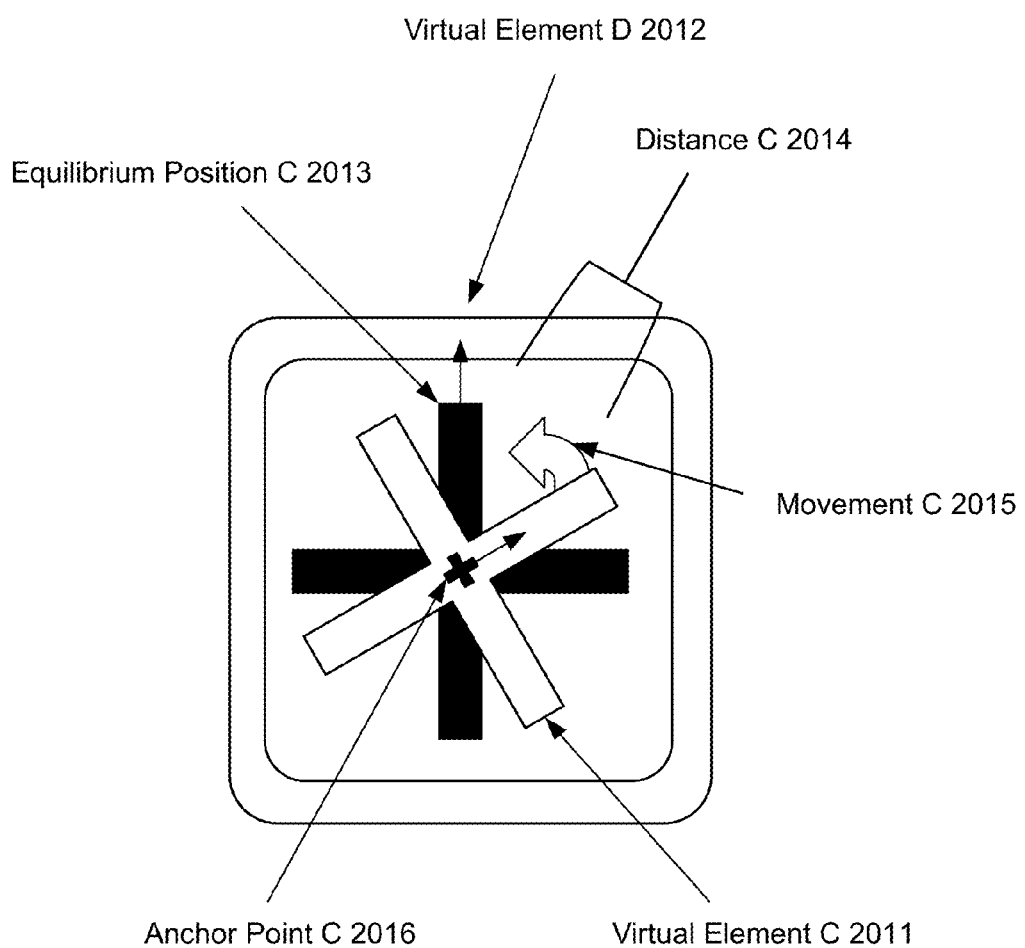

In some implementations, the anchor relationship may define the equilibrium position for the first virtual element based on an orientation of the first anchor point and an orientation of the second anchor point. For example, as shown in FIG. 20C, virtual element C 2011 may be associated with a first anchor point located within virtual element C 2011, indicated as anchor point C 2016. The top of anchor point C may be indicated with the arrow coming out of anchor point C 2016. Virtual element D 2012 may be associated with a second anchor point located within virtual element D 2012, indicated as equilibrium position C 2013. The top of equilibrium position C 2012 may be indicated with the arrow coming out of equilibrium position C 2012. The anchor relationship may define the equilibrium position for virtual element C 2011 with respect to virtual element D 2012 based on an orientation of the first anchor point and an orientation of the second anchor point. Equilibrium position C 2013 may define a return position for virtual element C 2011 such that at the return position, the orientation of the first anchor point of virtual element C 2011 aligns with the orientation of the second anchor point of virtual element D 2012.

In response to a virtual element being displaced from its equilibrium position, the system may move the virtual element back towards the equilibrium position once the displacing force has ceased. A new arrangement of virtual elements may be determined based on the movement of the virtual element back towards the equilibrium position. For example, in FIG. 20B, in response to a force displacing virtual element A 2001 (e.g., translational displacement) from equilibrium position A 2003, virtual element A 2001 may be moved back towards equilibrium position A 2003 upon the cessation of the displacing force, as indicated by movement A 2005. A new arrangement of virtual element A 2001 and virtual element B 2002 (e.g., virtual element A 2001 located closer to or at equilibrium position A 2003, etc.) may be determined based on movement A 2005. In FIG. 20C, in response to a force displacing virtual element C 2011 (e.g., angular displacement) from equilibrium position C 2013, virtual element C 2011 may be moved back towards equilibrium position C 2013 upon the cessation of the displacing force, as indicated by movement C 2015. A new arrangement of virtual element C 2011 and virtual element D 2012 (e.g., virtual element C 2011 being more aligned with equilibrium position C 2013, etc.) may be determined based on movement C 2015.

In some implementations, moving a virtual element to an equilibrium position may include applying one or more forces to the virtual element. The force(s) may be directed towards the equilibrium position. In some implementations, an amount of the force applied to a virtual element away from equilibrium position may be based on a distance between the virtual element and the equilibrium position. Such a determination of the amount of the force may allow modeling of a spring relationship between one virtual element (one portion of a larger virtual element) and another virtual element (another portion of the larger virtual element).

In some implementations, the application of a force to the virtual element may be localized such that the force does not affect other virtual element. For example, in FIG. 20B, a force exerted on virtual element A 2001 may not affect virtual element B 2002. A force exerted on virtual element A 2001 may not affect other virtual elements within virtual element B 2002 (e.g., other circular virtual elements within virtual element B 2002). A force exerted on virtual element A 2001 may be isolated to virtual element A 2001 so that it has no effect on virtual element B 2002. No reciprocal or associated force may be applied to virtual element B 2002 based on the separation of virtual element A 2001 from equilibrium position A 2003 and/or movement of virtual element A 2001 towards equilibrium position A 2003 (e.g., movement A 2005).

In some implementations, moving a virtual element towards an equilibrium position may include stopping a motion of the virtual element away from the equilibrium position. For example, in FIG. 20B, virtual element A 2001 may be moving away from equilibrium position A 2003 (e.g., opposite of movement A 2005). In response to virtual element A 2001 moving away from equilibrium position A 2003, movement of virtual element A 2001 away from equilibrium position A 2003 may be stopped based on pre-defined parameters. Virtual element A 2001 may then be moved towards equilibrium position A 2003, as indicated by movement A 2005.

Stopping movement of virtual element A 2001 away from equilibrium position A 2003 may be determined based on an anchor strength that applies a physical friction to virtual element A 2001. Higher anchor strength/higher physical friction may result in movement of virtual element A 2001 away from equilibrium position A 2003 being stopped more quickly (e.g., distance that virtual element A 2001 moves away from equilibrium position A 2003 is shorter) than with lower anchor strength/lower physical friction.

In some implementations, the movement of a virtual element towards the equilibrium position may be characterized by an anchor momentum. The anchor momentum may define an amount of distance the virtual element overshoots the equilibrium position during the movement of the virtual element towards the equilibrium position. For example, in FIGS. 20D and 20E, the amount of overshoot of virtual element E 2021 may be determined based on an anchor momentum that applies a physical momentum to virtual element E 2021. Higher anchor momentum/physical momentum may result in a larger overshoot of virtual element E 2021 than with lower anchor momentum/physical momentum.

Figure 20D:
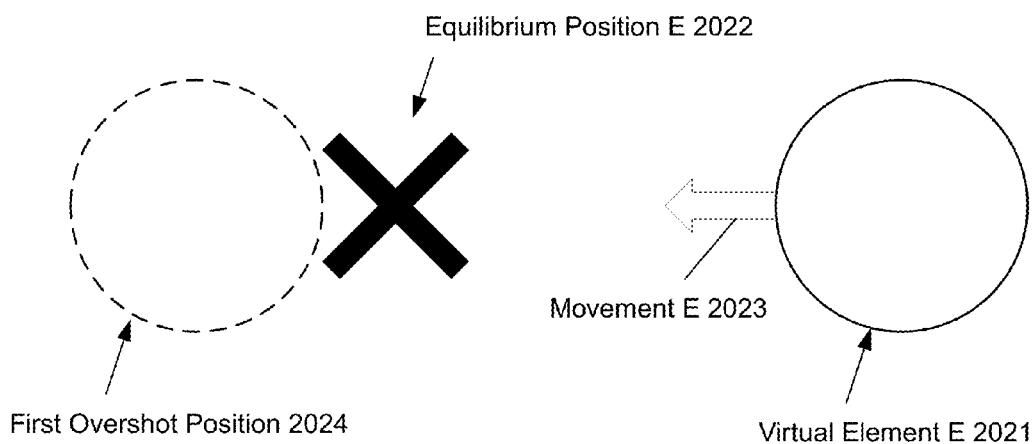
Figure 20E:
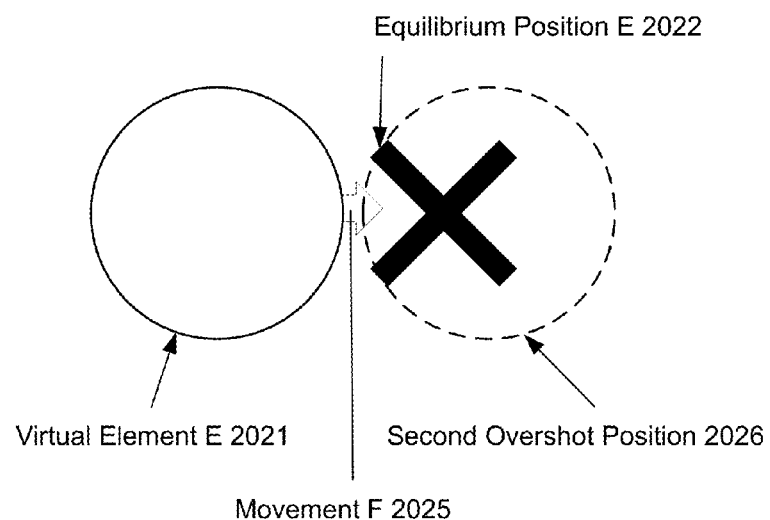

For example, in FIG. 20D, virtual element E 2021 may be moved towards equilibrium position E 2022 (e.g., based on a force directed towards equilibrium position E 2022). Based on the anchor momentum/physical momentum applied to virtual element E 2021, virtual element E 2021 may overshoot equilibrium position E 2022 to first overshoot position 2024. Virtual element E 2021 may stop at first overshoot position 2024 based on an application of a force defined by anchor strength/physical friction. Virtual element E 2021 may then be moved towards equilibrium position E 2022 as shown in FIG. 20E (e.g., based on another force directed towards equilibrium position E 2022). Based on the anchor momentum/physical momentum applied to virtual element E 2021, virtual element E 2021 may overshoot equilibrium position E 2022 to second overshoot position 2026. Virtual element E 2021 may stop at second overshoot position 2026 based on an application of another force defined by anchor strength/physical friction. Second overshoot position 2026 may be closer to equilibrium position E 2022 than first overshoot position 2024. Overshoot positions may decrease with each iteration of movement towards/past equilibrium position E 2022 through the application of a series of forces defined by anchor strength/physical friction until virtual element E 2021 stops at equilibrium position E 2022.

In some implementations, anchor component 132 may allow a virtual element to move within the virtual environment based on an anchor relationship between the virtual element and a physical object. The equilibrium position may define a return position for the virtual element with respect to the physical object. The equilibrium position may be fixed relative to the physical object. For example, the equilibrium position may define a return position for a virtual bookshelf/panel with respect to a surface of a physical desk. The equilibrium position may be fixed relative to the surface of the physical desk such that the virtual bookshelf/panel, at its equilibrium position, appears to be sitting on top of the surface of the physical desk. The equilibrium position may include a particular orientation such that the virtual bookshelf/panel, at its equilibrium position, appears to be sitting on the surface of the physical desk at a certain angle.

The virtual element may move to the equilibrium position based on the virtual element being moved out of the equilibrium position (e.g., the virtual bookshelf/panel being pushed in the virtual space, away from the equilibrium position, etc.) and/or the physical object being moved in the real world space (e.g., the physical desk being moved in the real world, etc.). In some implementations, the physical object may correspond to a virtual element (e.g., the physical desk may correspond to a virtual desk, etc.), and an anchor relationship may exist between the virtual element corresponding to the physical object (e.g., the virtual desk, etc.) and another virtual element (e.g., the virtual bookshelf/panel, etc.).

Virtual Element Datastore 114, Primitive Datastore 116, and User Interaction Datastore 118

The virtual element datastore 114, the primitive datastore 116, and the user interaction datastore 118 may comprise electronic storage media that electronically stores information. The electronic storage media may include one or both of system storage that is provided integrally (i.e., substantially non-removable) with virtual environment management system 100 and/or removable storage that is removably connectable to the virtual environment management system 100 via, for example, a port (e.g., a USB port, a firewire port, etc.) or a drive (e.g., a disk drive, etc.). The virtual element datastore 114, the primitive datastore 116, and the user interaction datastore 118 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. The electronic storage media may include one or more virtual storage resources (e.g., cloud storage, a virtual private network, and/or other virtual storage resources). The electronic storage media may store software algorithms, information determined by processor(s) 110, information received from the virtual environment management system 100, and/or other information that enables the virtual environment management system 100 to function as described herein.

In an implementation, the virtual element datastore 114 is configured to store information relating to virtual elements. The primitive datastore 116 may be configured to store information relating to primitives. The user interaction datastore 118 may be configured to store information relating to user interaction data.

Flowcharts of Example Methods of Operation

Flowcharts of example methods of operation of the virtual environment management system 100 shown in FIG. 1 and further discussed in the context of FIGS. 1, 2A-2F, 3A-3B, 4 and 5A-5B are now presented herein. The operations of the methods of operation presented below are intended to be illustrative. In some implementations, methods may be accomplished with one or more additional operations not described, and/or without one or more of the operations discussed. Additionally, the order in which the operations of methods are illustrated in the figures and described below is not intended to be limiting.

Process 600 for Interacting with Virtual Elements in a Virtual Environment

Figure 6:
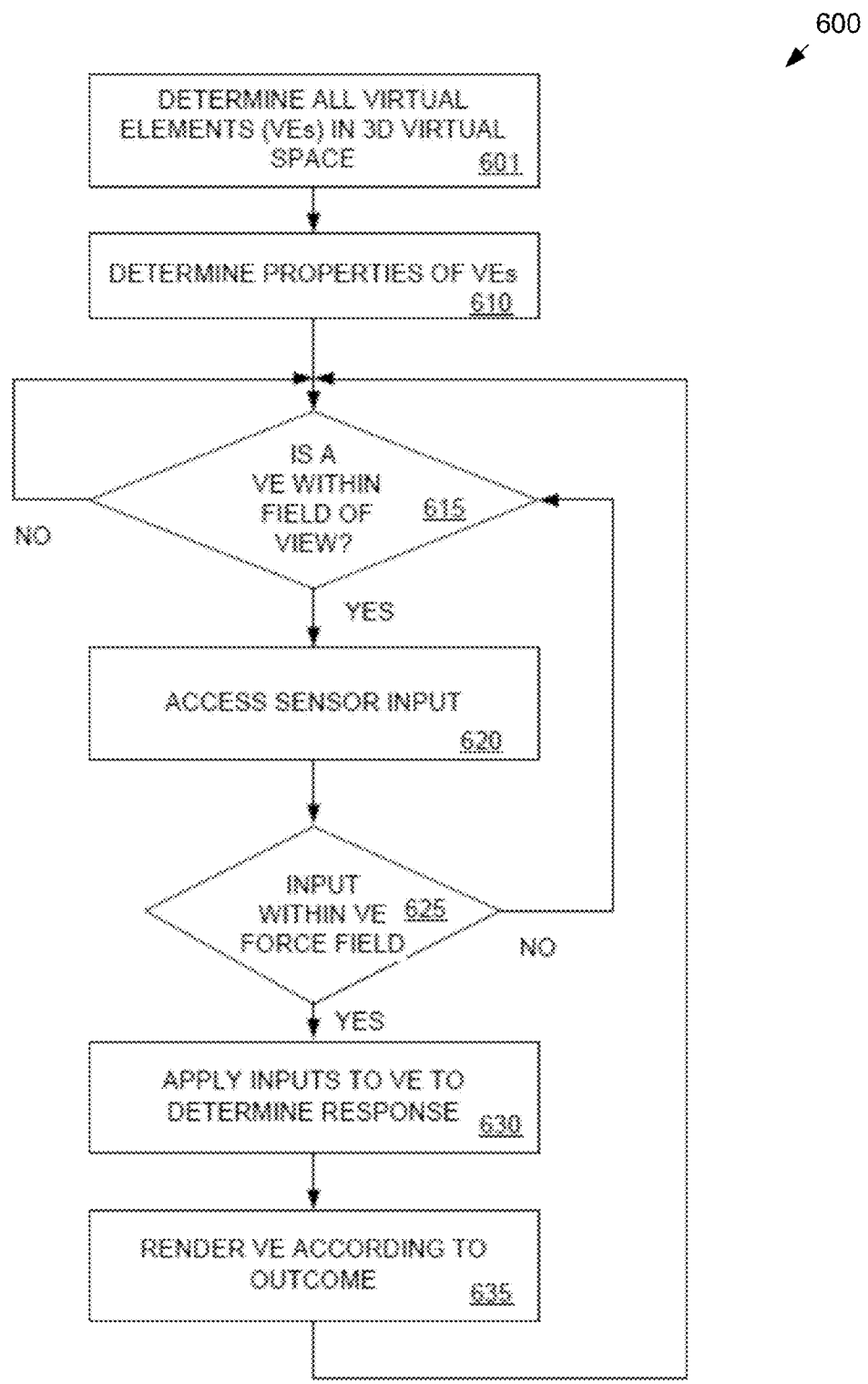
FIG. 6 is a flow chart showing an exemplary process for interacting with virtual elements.

FIG. 6 is a flowchart showing an example of a process 600 for interacting with virtual elements in a virtual environment, in accordance with one or more implementations. The process 600 may be implemented by one or more of the modules of the virtual element component 130 and/or other modules discussed herein. At an operation 601, all of the virtual elements in the 3D virtual space may be determined. For example, one or more files corresponding to the virtual 3D space may be accessed from a memory device. The virtual elements may be mapped to initial coordinates within the 3D virtual space.

At an operation 610, the properties of all the virtual elements determined to be in the virtual 3D space may be accessed from a corresponding file in a memory device. For example, the primitives and their corresponding parameters may be accessed, such as an interaction volume (e.g., charge and one or more field boundaries).

At an operation 615, it may be determined whether a virtual element may be in a field of view of a sensor. For example, a sensor detecting real world objects may be oriented to coincide with the field of view of a user of a head mounted display (HMD). As the camera may be pointed in a direction corresponding to the movement of the head of user, the view in the virtual 3D space may be mapped to coincide with the movement of the sensor and head. Scanning continues with movement of the user's and/or camera's field of view.

When one or more virtual elements may be detected, any sensor input corresponding to the field of view may be accessed, in operation 620. For example, frames of input from a depth sensor may be accessed and inputs of real world elements mapped to the virtual 3D space. In one example, a hand of user may be detected and mapped or translated to coordinates in the virtual 3D space.

At an operation 625, for any sensor input, it may be determined whether any of the sensor input may be within an interaction volume of a virtual element. For example, a shortest distance calculation as explained above in association with FIG. 3B may be performed to determine whether a coordinate in the virtual space corresponding to a sensor input may be within boundary of a virtual element as defined by the interaction volume parameter. A spatial partitioning method (i.e., a process of dividing space into indexed and searchable regions) may be applied to speed up the boundary-checking process, and may reduce the computation overhead on the distance calculation. If no sensor input may be detected within the interaction volume of a virtual element, the process returns to operation 615.

At an operation 630, for a virtual element having its interaction volume penetrated by a sensor input, the sensor inputs may be applied to the virtual element to determine how the virtual element responds. For example, a force may be determined and applied to the virtual element to determine a response of the virtual element to the applied force.

At an operation 635, the virtual elements may be rendered according to the outcome of the response determined in operation 630, and the process returns to operation 615. For example, the orientation of a virtual element may be rotated around a center of mass associated with the virtual element in response to sensor input corresponding to the user's hand "pushing" on a portion of the virtual element to rotate it (e.g., as shown in FIGS. 5A and 5B).

Process 700 for Application of Sensor Inputs to Virtual Elements

Figure 7:
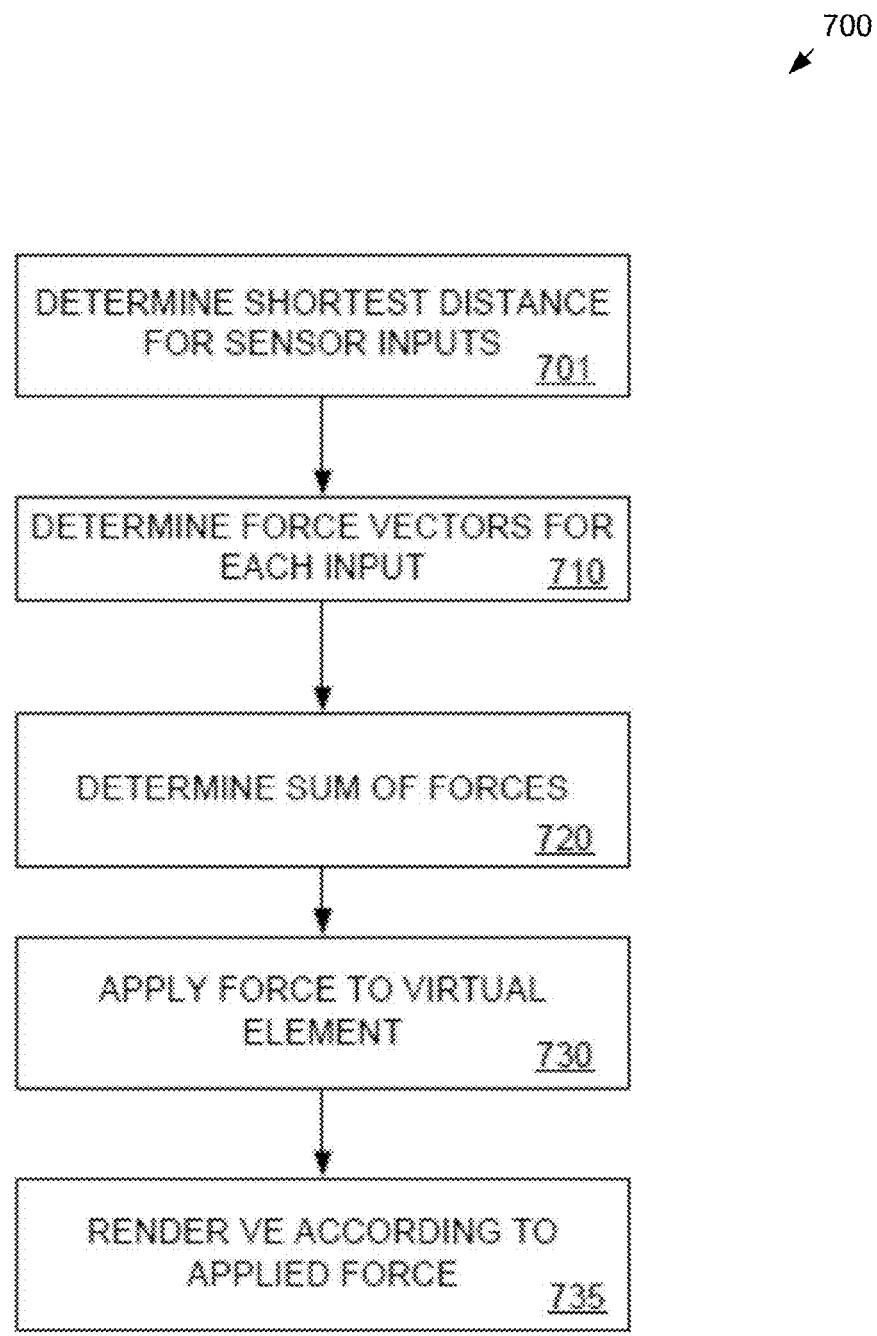
FIG. 7 is a flow chart showing an exemplary process for application of force to a virtual element

FIG. 7 is a flowchart showing an example of a process 700 for application of sensor inputs to a virtual element in a virtual environment, in accordance with one or more implementations. In an example, the process 700 may be implemented as part of operation 630 in the process 600.

At an operation 701, the shortest distance ds to a virtual element for a sensor input may be determined. For example, the length of a straight line segment orthogonal to a point on the core extending from the point on the core to the coordinates of a point pi (e.g., associated with an input from a sensor) may be determined.

At an operation 710, a force vector for a sensor input may be determined. For example, the charge and magnitude of the interaction volume may be determined (e.g., q1) and the charge and magnitude of the input from the sensor may be determined (e.g., qi) and the force may be calculated as:

$$F_1 = k_e \frac{q_1 q_i}{|r_{i1}|^2} d_s^{i1} \qquad \text{Equation 6}$$

At an operation 720, the forces for all vectors of points within the interaction volume of the virtual element may be summed to determine the total force exerted on the element. For example, the total force exerted on the element can be calculated through the use of the equation: F_f=Sum(F_i)

At an operation 730, the sum of the forces may be applied to the virtual element and an outcome may be determined based on the result of that application. For example, the calculated force for a vector and the parameters of the primitive (e.g., a constraint such as mass and center of mass) may be put into to a physics engine or other logic that defines the nature of a manipulation of virtual elements in the virtual 3D space. In one implementation, the physics engine may be a process or application including a collection of equations simulating real world physics and the application of forces. For example, given the force, mass, and center of mass of the virtual element, the physics engine determines a direction and distance traveled in the virtual space from the application of the force, such as determining the linear and angular momentum of a primitive by determining the position and velocity of the primitive relative to the coordinate for the primitive's center of mass.

At an operation 735, the outcome may be rendered and acted upon. For example, the output from the physics engine describing a direction of movement, an end move coordinate and an orientation may be provided to processor for translation to a graphics rendering of the virtual element in space over time. For example, an application of force to a virtual element may move the virtual element in the virtual 3D space from a first coordinate to a second coordinate along a line and distance determined by the engine. In another example, a force may be applied to a virtual button or touch panel. The movement of the button along a direction of constraint may cause the button to be rendered as depressed and an input corresponding to depressing the button may be activated (e.g., hitting an enter button on a virtual keypad).

Slider Interface Example

FIGS. 8A, 8B, 8C, and 8D show an example 800 of a manipulation of a slider bar interface using the interaction process with application of a force, in accordance with some implementations. As shown in FIGS. 8A-8D a slider bar interface 800 includes a button 801 rendered on a line 810 depicting a visual display representation of a virtual user interface. For example, the position of the button on the line may correspond to a volume of an audio device controlled by the user interface. As the position of the button moves along the bar, a corresponding trigger event adjusts the volume level of the audio device.

Figure 8A:
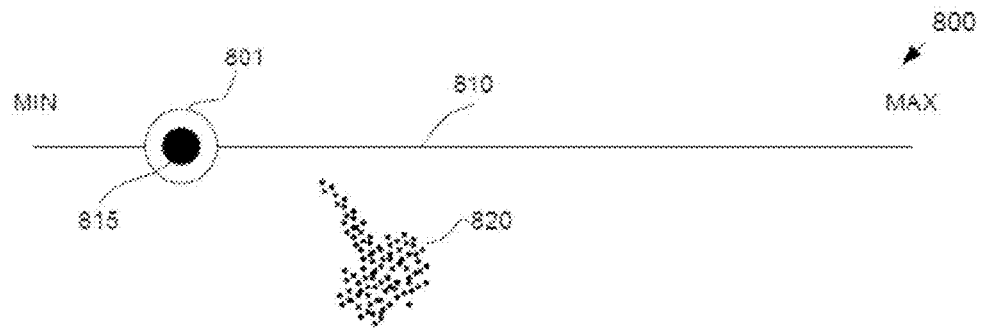
FIGS. 8A, 8B, 8C, and 8D show an example 800 of a manipulation of a slider bar interface using the interaction process with application of a force, in accordance with some implementations.
Figure 8B:
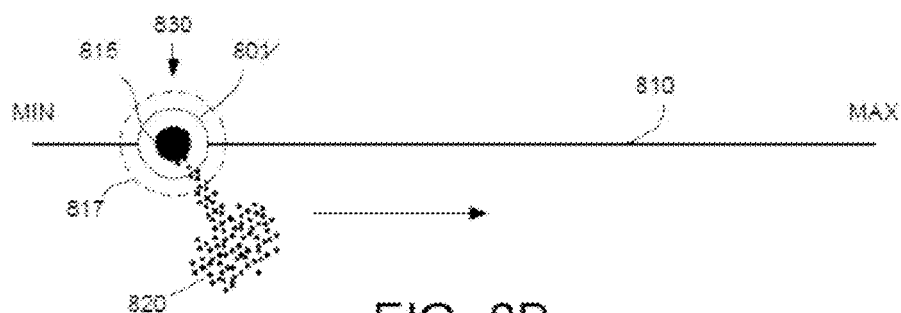
Figure 8C:
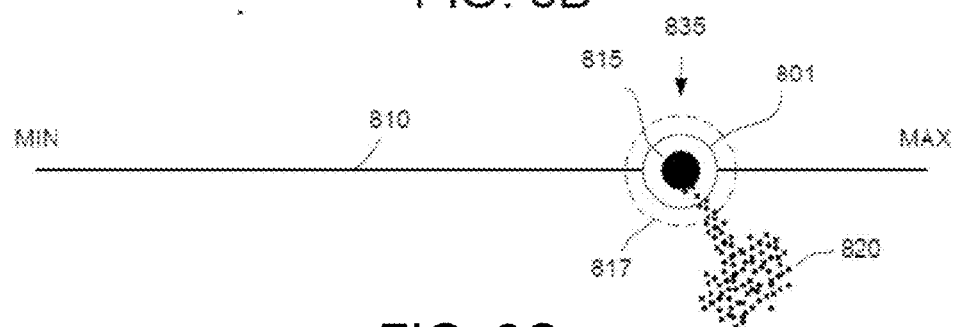

For example, a sphere primitive 815 is constrained to only allow movement along a single dimension (e.g., the x-axis) and thus form a slider interface in this dimension. In this example, a large drag constraint may be placed on two of the three dimensions of the virtual space, where drag.x=1, drag.y=100, drag.z=100. In addition, the interaction volume 817 of a sphere primitive are set, for example, the sphere.charge=+10 and sphere.boundary=1-5 cm. In addition, a trigger for an event may be defined with the following pseudo code, for example:

if (position.cloud>interface.boundary){create_event(adjust volume)};

In this example, assume a point cloud 820 from an input sensor (e.g., corresponding to the hand of user) is given a charge=−10. In FIG. 8A, the point cloud is outside of the 5 cm interaction volume boundary of the button virtual element so the button 801 is not active. In FIG. 8B, the point cloud moves inside of the 1 cm to 5 cm interaction volume boundary 817. In this case, the force applied to the button is determined. Because the charges of the virtual button and the point cloud are opposite, the force applied to the button is attractive. Because the force is attractive, the button may be thought of as "sticky"—or in other words, it is constrained so that the button moves with the point cloud. Therefore, as long as the point cloud remains with the boundary 817, as the point cloud moves, the button moves with the point cloud. In this example, the virtual element is constrained only allowing movement along one axis. Therefore, as the point cloud 820 moves along the line 810 of the slider interface, the button 801 moves from position 830 (e.g., associated with volume level 15%) in FIG. 8B to position 835 in FIG. 8C (e.g., associated with volume level 75%). This activity can trigger, for example, the event "adjust volume" which uses the position 835 associated with the sphere primitive relative to the line 810 to increase the volume of the associated audio device to 75% of max volume.

Figure 8D:
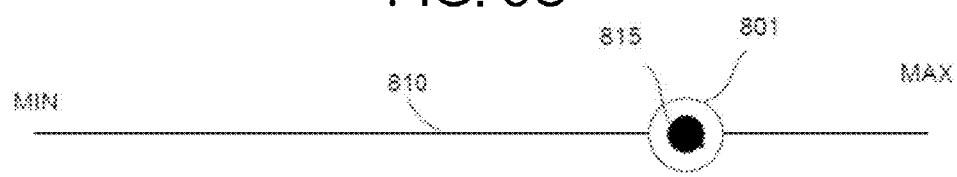

In FIG. 8D, the point cloud moves outside of the 5 cm interaction volume boundary of the button virtual element, and the event therefore ends, with the volume remaining at 75% because the button is no longer interacting with the point cloud. Of course, one skilled in the art will appreciate that, in another example, the charge associated with the point cloud 820 can be +10. In this case, the force applied by the point cloud 820 on the button is repellent to the button 801 (the charge of which is also +10, as described above). Therefore, the user input associated with the point cloud 820 can be used to "push" the button along the slider to a desired position. In another example, an additional line primitive may be associated with the line 810 of the virtual volume user interface, and the graphics, sphere, and line primitives form the virtual element within a virtual 3D space. In this example, sphere primitive may be used to adjust the volume of the interface by movement along a single axis as describe above, and the line primitive may be used to adjust the position and orientation of the visual representation of the interface within the 3D space.

Button or Touch Panel Interface

Figure 9:
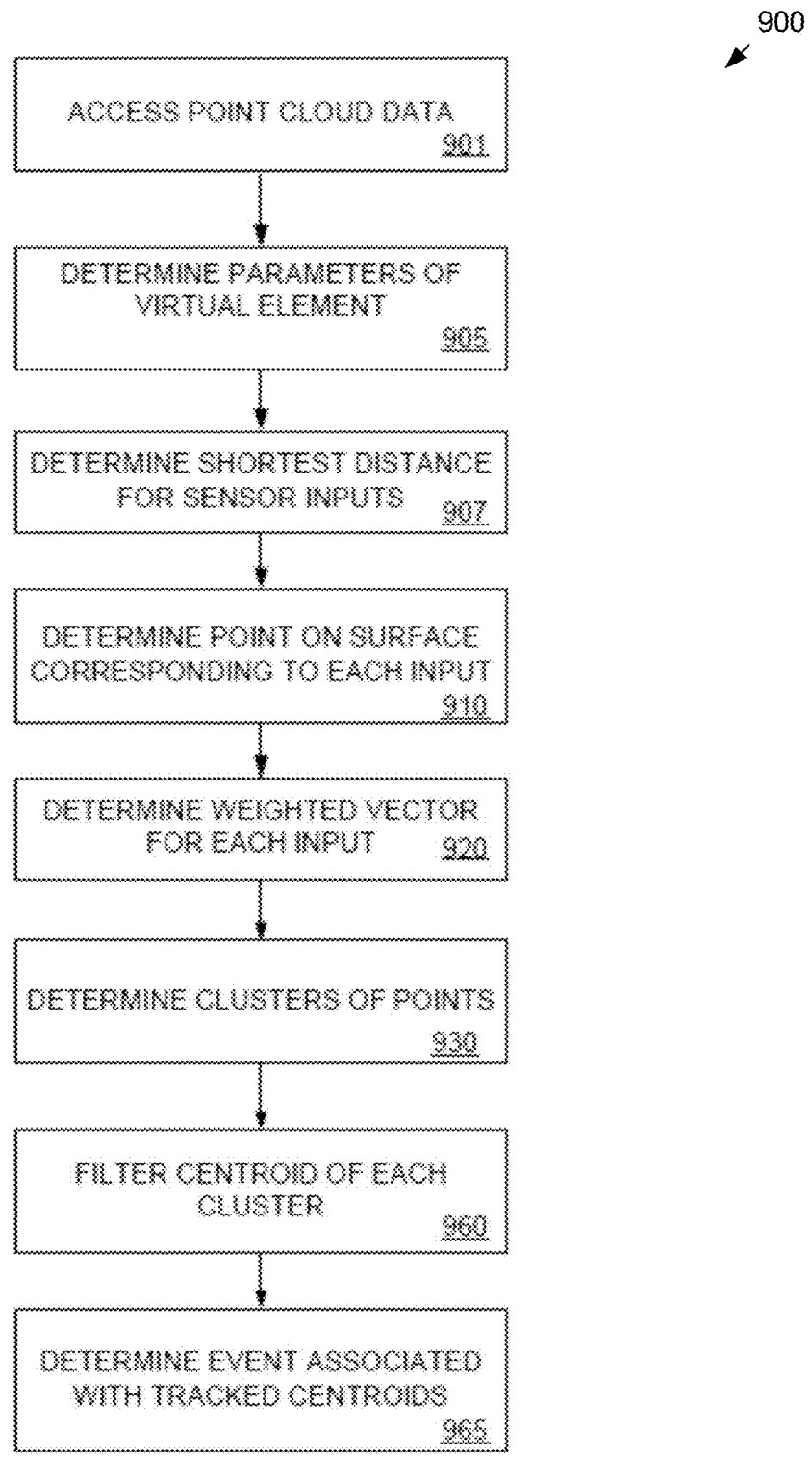
FIG. 9 illustrates a method for interaction with a virtual element, in accordance with some implementations.

FIG. 9 illustrates a method for interaction with a virtual element, in accordance with some implementations.

In operation 901, a point cloud from a sensor is received or accessed. Each point of the cloud corresponds to a sensor output. For example, for one frame of the output from a depth camera, the location of all points within a 3D virtual space corresponding to a sensor input for the frame may be determined.

At an operation 905, the parameters of a virtual element may be determined. For example, the primitive type, the position of the primitive within the 3D virtual space, and the interaction volume parameters may be determined for the virtual element. In this example, a plane primitive may be used to simulate the surface of a touch panel interface (the "panel") having an interaction volume parameter with a charge of zero from 0 cm to 5 cm from the core plane of the primitive.

At an operation 907, the shortest distance from the points of the cloud to the panel may be calculated. For example, a line orthogonal to the surface of the primitive and intersecting a point of the cloud may be determined for points of the cloud.

At an operation 910, points of the cloud within the interaction volume boundary may be back-projected onto the surface of the virtual element. For example, all points of the cloud having a shortest distance that may be less than the distance of the interaction volume parameter may be determined. All points determined to be within the interaction volume of the virtual element may be back-projected on the surface of the primitive at the point located where one or more orthogonal lines corresponding to the shortest distance to a sensor input intersects the surface of the primitive of the virtual element.

At an operation 920, a weighted vector (e.g., (x, y, w) where x, y may be the coordinates of the vector and w may be the weight of the interaction with the primitive) may be determined for back-projected point(s). For example, a weight w for sensor input i may be determined as $w_i = f(c) \cdot g(d_i)$ where c may be a confidence value of the point cloud data and d may be the distance of the input i from the primitive, and f(x) and g(x) may be penalty functions for the parameters c and d. In this example, w implements a noise filter and penalty functions to decrease the significance of the weight of an input when the 25 data may be noisy. In one example, a penalty function observes the distribution of the points (i.e., the variance) of the point of cloud to adjust the w (e.g., when the points of the cloud may be clustered tightly the variance may be considered to be lower confidence may be higher, and when the points may be distributed variance may be greater and confidence may be lower).

At an operation 930, "clusters"—a group of points that may be contained within a fixed boundary—may be determined and tracked from the back-projected points. When a group of back-projected points may be clustered on surface of a primitive modeling a virtual element that resembles and functions as a multi-touch panel, it may indicate that a user may be interacting with the surface of the panel (e.g., entering an input of a button or adjusting the presentation of content, such as pinch to zoom). In this example, a clustering algorithm may be applied to all the back-projected points to determine clusters or groups of related points and track them (e.g., to determine an event related thereto such as a scroll event). To do this, first, a cluster list may be created. For the first frame of sensor data received, the cluster list does not contain any clusters, as the clusters have not yet been calculated from the back-projected points. The back projected points determined from the first frame may be then clustered.

In one example of the clustering process, a bounding box of a predetermined size may be used (e.g., a 3×3 cm box) to determine a cluster. The primitive surface may be first scanned for back-projection points. When a back-projection point of the back-projected image may be detected, it may be determined whether the point falls into the bounding box of a previously-identified cluster. If no previously-identified cluster exists around the point, a new cluster may be created, a unique ID may be assigned to the cluster, the point may be added to the cluster, and the ID may be added to the list. For new cluster(s), it may be determined if any additional points may be within the bounding box around the point.

For additional point(s) within the box, the point may be added to the cluster ID. The scan continues until all points may be assigned to a cluster ID. The clusters may be then filtered to remove clusters that may be associated with noise. For example, any cluster having too few back projection points may be removed and its ID may be deleted from the cluster list.

A centroid (e.g., the arithmetic mean ("average") position of all the points in the cluster) may be 20 determined for cluster ID(s) and the position of the centroid may be stored with the cluster ID. The centroid may be considered the location of the cluster on the panel virtual element.

The cluster list with the IDs and location of cluster(s) may be matched against the cluster list derived from the last input frame to determine whether any cluster corresponds to a previous cluster. For example, if the distance between the locations of two clusters may be less than the size of the cluster bounding box, the clusters may be considered matching clusters. In this case, the ID of the current cluster may be removed from the list, and the position of the centroid of the current cluster (e.g., the location on the panel) of the cluster position may be added to the ID for the previous matching cluster. For any cluster not matching a previous cluster, the unique ID may be preserved in the list. In this manner, the movement of a cluster may be traced from one sensor input frame to the next.

At an operation 960, the location saved for cluster(s) of an ID in the list may be filtered. For example, a motion filter, for example, such as Kalman filter or the like may be applied to tracked location(s) associated with an ID to reduce effects such as jitter. The filtered location may be then saved to the cluster list.

At an operation 965, it may be determined whether an event associated with the centroids stored in the cluster may be triggered. For example, in an implementation of multi-touch panel virtual element, the position of one or more tracked centroids may indicate a trigger event, such as a swipe, a tap, or a multi-finger gestures (e.g., a pinch to zoom event). For example, movement of a cluster along a line for a predetermined distance in the same direction may indicate that a scroll up event has been triggered causing the content presented in association with the virtual panel to scroll up.

In various implementations, operations 901-965 are repeated for frame(s) input from the sensor.

FIGS. 10A, 10B, 10C, 10D, 10E, 10F illustrate an example of the interaction process of FIG. 9 to a virtual 3D environment for interaction with a virtual element, such as, for example, a button or user interface of a touch panel.

Figure 10A:
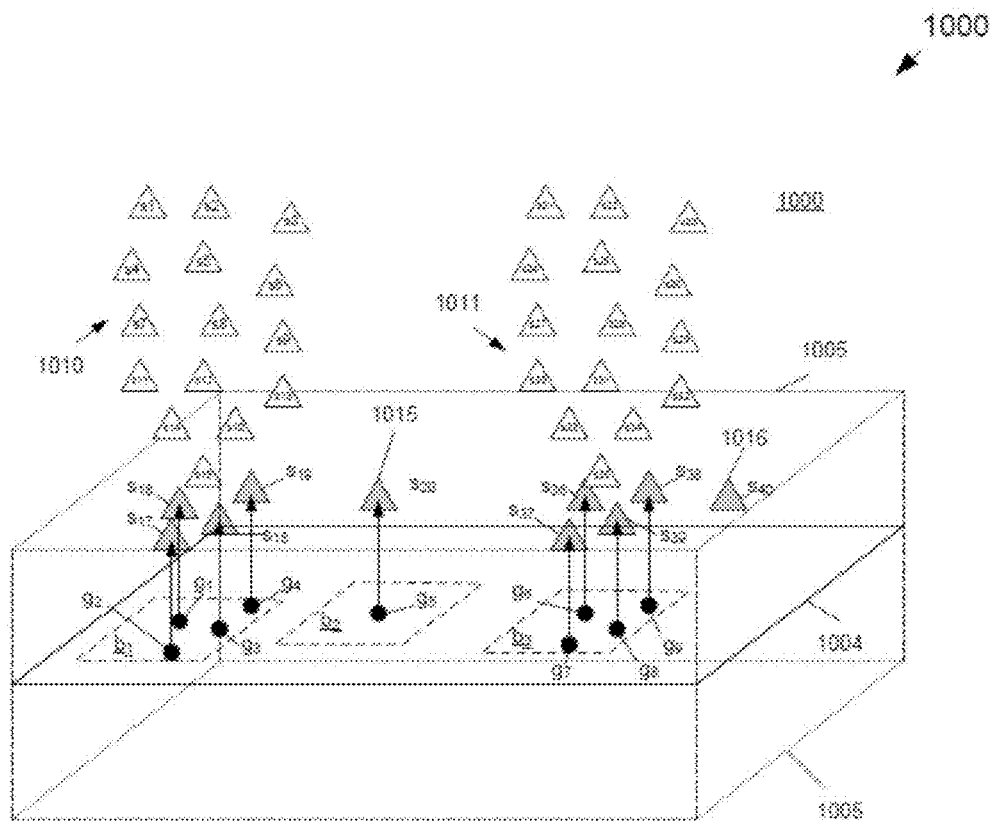
FIGS. 10A, 10B, 10C, 10D, 10E, 10F illustrate an example of the interaction process of FIG. 9 to a virtual 3D environment.

FIG. 10A shows a touch panel primitive 1001. The primitive may be a plane primitive 1004 having a interaction volume boundary 1005 of 5 cm and a charge of 0. In addition, the lines forming the outer perimeter of the plane may be implemented with the line primitives having a interaction volume boundary of 1 cm to 2 cm and charge of +10 allowing the position and orientation of the plane primitive to be moved, positioned, and oriented within the 3D space using a force application (e.g., as described above in connection with FIGS. 1-7 (and not depicted in the example shown in FIGS. 10A-10F). Content (e.g., a web page) may be rendered in the plane associated with the core of the plane primitive at a position corresponding to the position of the plane within the 3D virtual space to provide a touch panel webpage interface implementation.

At a time to there is no sensor input and a gesture input list has no elements. At time $t_1$, an input frame from one or more depth sensors is received corresponding to the input illustrated in FIG. 10A. As shown in FIG. 10A, two point clouds 1010 (e.g., {$s_1$-$s_{19}$}), 1011 (e.g., {$s_{21}$-$s_{39}$}) are shown, which are associated with the sensor input corresponding to two fingers of a user (e.g., a thumb and index finger of the same hand), and random points 1015 (e.g., $s_{20}$), 1016 (e.g. $s_{40}$) associated with a noise input from the sensor (e.g., infra-red reflectance detected by the sensor from the environment around the user's hand). Four points from point cloud 1010 (e.g., {$s_{16}$-$s_{19}$}), four points from point cloud 1011 (e.g., {$s_{36}$-$s_{39}$}) and the points 1015 (e.g., $s_{20}$), 1016 e.g. $s_{40}$) associated with noise are within the interaction volume boundary 1005 of the plane primitive of the virtual touch panel element.

The points within the boundary are back-projected onto the plane associated with the primitive. For example, the shortest distance to the primitive is determined for each sensor input within the field boundary of the primitive. In this example, a line drawn orthogonal to the plane of the primitive and intersecting each of the sensor inputs ($S_{16i}$, $S_{17}$, $S_{18}$, $S_{19}$, $S_{20}$, $S_{36}$, $S_{37}$, $S_{38}$, $S_{39}$, and $S_{40}$) is determined. A corresponding point is back-projected onto the plane associated with the primitive at the point where each orthogonal line interests the primitive (e.g., $g_1$, $g_2$, $g_3$, $g_4$, $g_5$, $g_6$, $g_7$, $g_8$, $g_9$, $g_{10}$), and a weighted vector is determined for each back projected point. The back projected points are then filtered to remove poorly weighted points. For example, the weight w for the back projected point $g_{10}$ associated with input 1016 is below a threshold, determined to be noise, and is removed.

The primitive is then scanned for all the remaining back projected points and the points are grouped into clusters. Scanning from left to right, bottom to top, a point $g_1$ is located first. In this example, a cluster box for the interface is set to a box having dimensions 3 cm×3 cm. A first box $b_1$ is assigned to the point $g_1$, and cluster ID B 1 is generated and added to the cluster list. The primitive is scanned to determine any other back-projected points that are within the 3 cm×3 cm box surrounding the point $g_1$. In this example, additional back-projected points $g_2$, $g_3$ and $g_4$ are determined to be within the box, and points $g_1$, $g_2$, $g_3$ and $g_4$ are stored in association with unique ID B 1 in the cluster list.

The scanning continues, determining clusters ID B2 for box $b_2$ with point $g_5$, and ID $B_3$ for box $b_3$ with points $g_6$, $g_7$, $g_8$, and $g_9$. The boxes $b_1$-$b_3$ are filtered. For example, the box $b_2$ is determined to include a single point and is eliminated as noise and the ID B2 is deleted from the list.

Figure 10B:
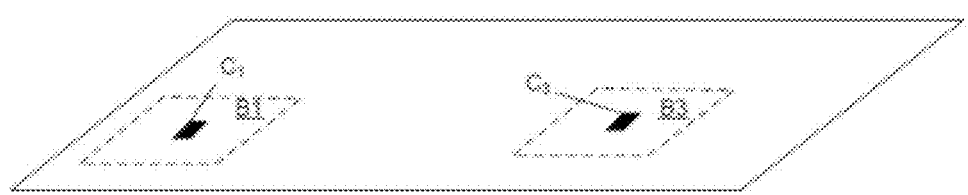

For the remaining boxes b1 and b3, centroids c1 and c2 are determined as shown in FIG. 10B. The positions of the centroids are stored in a cluster list associated with the IDs B1 and B3 respectively. After t1, the cluster list is shown in table 1:

TABLE 1

| | |
|---|---|
| B1 | $c_1$ ($x_1$, $y_1$) |
| B3 | $c_3$ ($x_3$, $y_3$) |

Figure 10C:
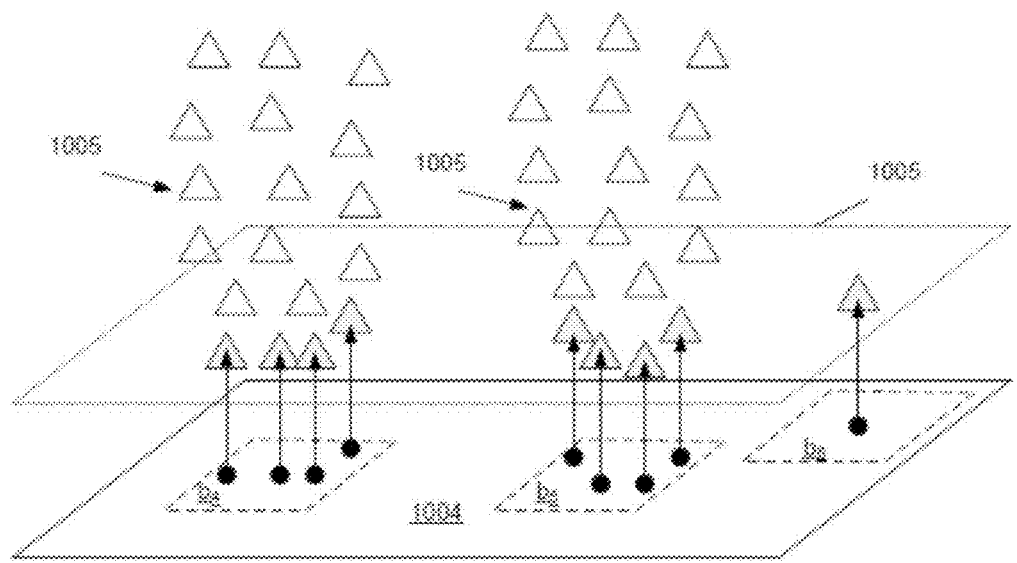
Figure 10D:
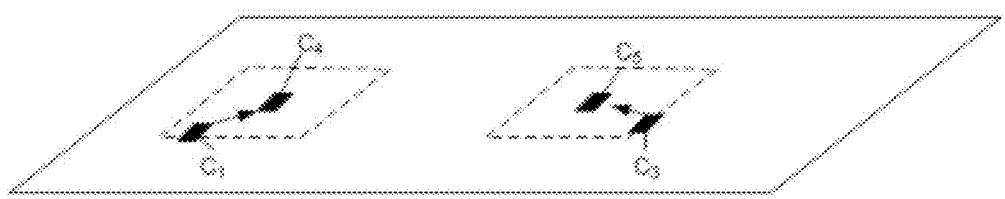

At time $t_2$, an input frame from the one or more depth sensors is received corresponding to the input illustrated in FIG. 10C. The process is repeated, resulting in new IDS B4 and B5 for the new input points resulting boxes $b_4$ and $b_5$ with centroids $c_4$ and $c_5$, as shown in FIG. 10D. At this point the cluster list is shown in table 2:

TABLE 2

| | |
|---|---|
| B1 | $c_1$ ($x_1$, $y_1$) |
| B3 | $c_3$ ($x_3$, $y_3$) |

TABLE 2-continued

| | |
|---|---|
| B4 | $c_4$ ($x_4$, $y_4$) |
| B5 | $c_5$ ($x_5$, $y_5$) |

However, the distance between $c_1$ ($x_1$, $y_1$) and $c_4$ ($X_4$, $y_{4i}$) and the distance between $c_3$ ($x_3$, $y_3$) and $c_5$ ($x_5$, $y_5$) is less than the size of a bounding box (e.g., 3 cm×3 cm). Therefore, it is determined that these centroids are part of the same cluster, and their unique IDs are removed and their positions added to unique IDs B1 and B3 respectively, as shown in Table 3:

TABLE 3

| | |
|---|---|
| B1 | $c_1$ ($x_1$, $y_1$), $c_4$ ($x_4$, $y_4$) |
| B3 | $c_3$ ($x_3$, $y_3$), $c_5$ ($x_5$, $y_5$) |

Figure 10E:
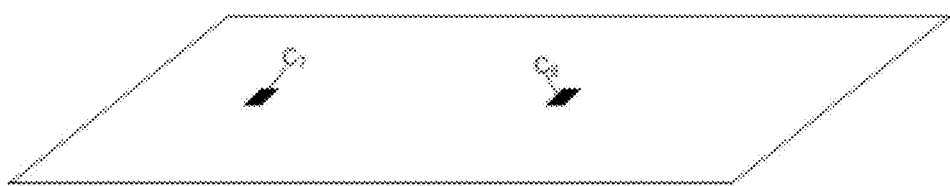

Similarly, at time t3, centroids c7 and c8 for unique IDs B7 and B9 are determined as shown in FIG. 10E. However, the distance between c4 (x4, y4) and c7 (x7, y7) and the distance between c5 (x5, y5) and c8 (x8, y8) are less than the size of a bound box. Therefore, it is determined that these centroids are part of the same cluster and their unique IDs are removed and their positions added to unique IDs B1 and B3 respectively, as shown in Table 4:

TABLE 4

| | |
|---|---|
| B1 | $c_1$ ($x_1$, $y_1$), $c_4$ ($x_4$, $y_4$), $c_7$ ($x_7$, $y_7$) |
| B3 | $c_3$ ($x_3$, $y_3$), $c_6$ ($x_6$, $y_6$), $c_8$ ($x_8$, $y_8$) |

Figure 10F:
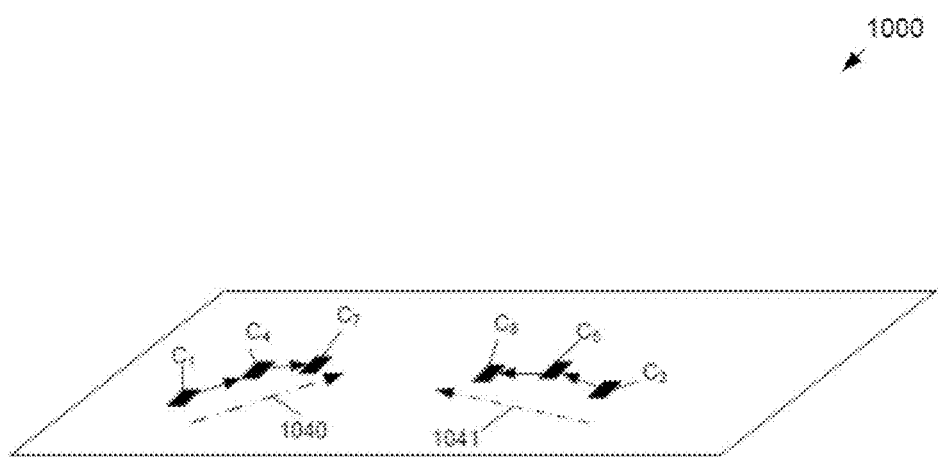

As the points are added to the table and the table is processed and filtered, the data from the table is continually input to a gesture algorithm or engine to determine if an event is triggered (e.g., through the execution of a recognized "gesture"). In this example, at t3, it is determined that the centroid locations for each unique ID indicate that locations forming two lines 1040, 1041 moving towards each other over a sufficient distance, for example, as shown in FIG. 10F, to trigger a pinch to zoom event causing the content associated with the plane primitive 1004 to zoom out. As a result, the content is resized in rendering on the virtual panel. The above described manipulation of computer-generated elements in a virtual 3D space—based on, for example, input translated from the real world 3D point data observed by at least one sensor and various interfaces—may be implemented as part of an overall virtual 3D space interface and combined therein with other tools for manipulating the 3D space. For example, a gesture based interface may be used in conjunction with a force-based system for manipulation of virtual elements (as described above). For example, in a gestured based interface, the point cloud may be processed to determine one or more gestures corresponding to the movement of the point cloud.

In this example, a recognized gesture may be used to manipulate a virtual element when the point cloud is outside the interaction volume of a virtual element. For example, when the point cloud acts in a predetermined manner, for example, hovering in proximity to a virtual element outside of the virtual elements interaction volume, the point cloud may be observed to determine a gesture. For example, movement of the point cloud is processed to determine a "grab" gesture (e.g., corresponding to opening and closing of a hand)/The grab gesture may be used to select or grasp a virtual element in the virtual 3D space. Once grasped, the virtual element may be interacted with and manipulated (e.g., moved, repositioned, activated, and/or the like). In the same example, when the point cloud enters the interaction volume of the virtual element, the virtual element may be manipulated based on calculated forces and the primitives of the virtual element. In this manner, an virtual element may be manipulated based on a gesture based input or a force based determination. One example of a gesture based interface is described in U.S. patent application Ser. No. 14/147, 199, titled "Extramissive Spatial Imaging Digital Eye Glass Apparatuses, Methods and Systems for Virtual or Augmediated Vision, Manipulation, Creation, or Interaction with Objects, Materials, or Other Entities," filed Jan. 3, 2014, which is incorporated herein by reference in its entirety.

Example Hardware Implementations
Example Processing Device Components

Figure 11:
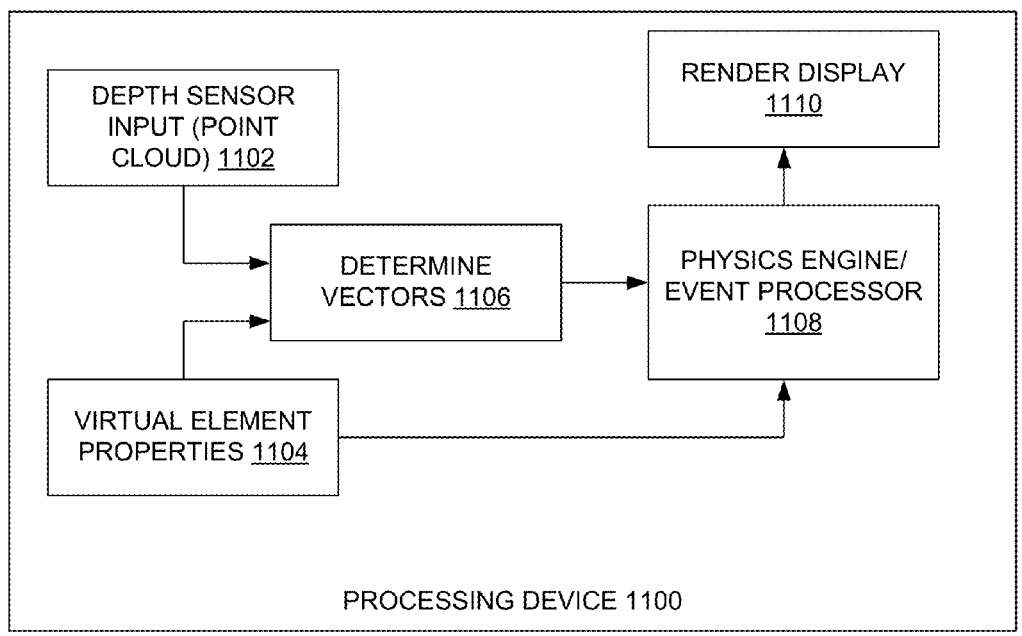
FIG. 11 illustrates examples of components of a processing system used to facilitate interactions with a virtual Three Dimensional (3D) environment, in accordance with one or more implementations.

FIG. 11 shows a block diagram illustrating example components of a processing device 1100, in accordance with some implementations. The processing device 1100 may include a depth sensor input system 1102, a virtual element properties system 1104, a vector determination system 1106, a physics engine/event processor 1108, and a display rendering system 1110. One or more of the elements of the processing system 1100 may correspond to one or more of the elements of the virtual environment management system 100, shown in FIG. 1.

In some implementations, inputs from a depth sensor input system 1102 and parameters for a virtual element provided to the virtual element properties system 1104 may be input to the vector determination system 1106. In various implementations the vector determination system 1106 may implement one or more of the vector determinations derived by the processes 600, 700, 900 shown in FIGS. 6, 7, and 9. The determined vectors along with the parameters are inputs to the physics engine/event processor 1108 (which may comprise physics engine(s), event engine(s), gesture engine(s), and/or any other defined logic to determine events and render of content associated with a virtual element within a 3D virtual environment based on the input from the sensors). The data may be output to another program or application to cause rendering of the content associated with an event for viewing by a user. For example, the output may be provided to the display rendering system 1110 for rendering in a display or other visual output device. In this manner, input corresponding to real world objects may be used influence and manipulate virtual elements using a charge and interaction volume.

Example 3D Virtual Environment System

Figure 12:
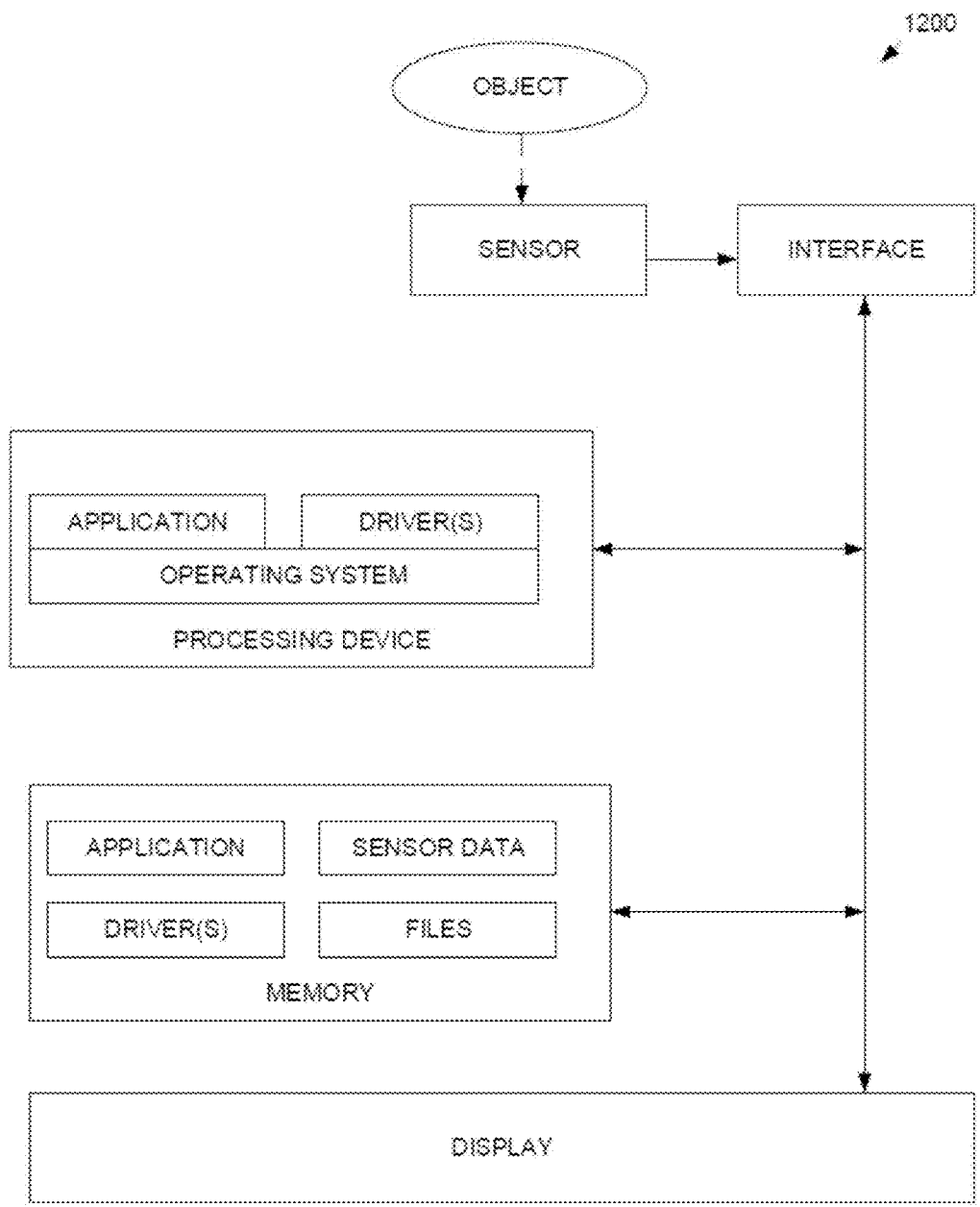
FIG. 12 illustrates examples of components of a system for manipulation a virtual element, in accordance with one or more implementations.

FIG. 12 shows a block diagram illustrating some basic components of a 3D virtual environment system for manipulation of a virtual element. As shown in FIG. 12, a real world object is detected by a sensor. For example, the sensor may be one or more depth sensors, such as a depth camera or time of flight camera. The sensor input is provided via an interface (e.g., a wireless interface or wired interface) and communications path (e.g., a communication bus) to a processing device implementing a virtual 3D environment application.

The processing device may operate one or more applications including an operating system, a virtual 3D environment application, a physic engine and/or a gesture. In addition, a storage device is provided, such as a memory, to store the virtual environment application, sensor data, data files, drivers, and other applications and data used by the system. The processing device processes the sensor data to implement the 3D environment, which is then output to a display device for presentation to a user of the system.

Figure 13A:
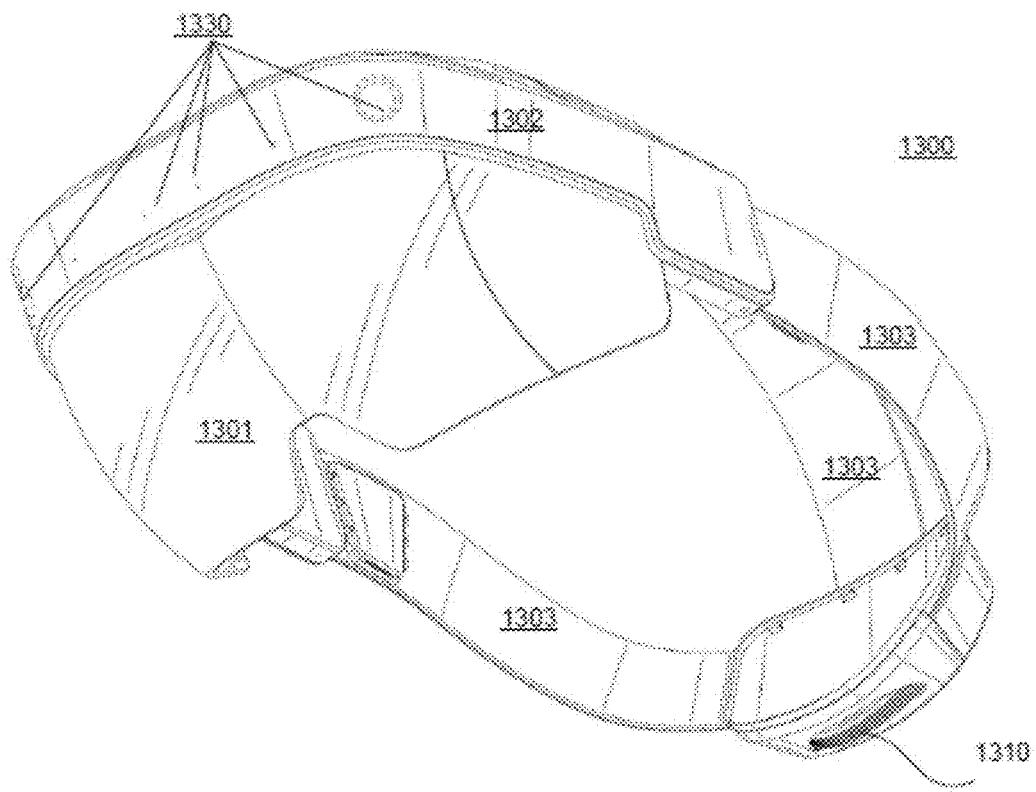
FIGS. 13A, 13B, 13C, 13D, and 13E illustrate examples of head mounted display components of a system for manipulation a virtual element, in accordance with one or more implementations.
Figure 13B:
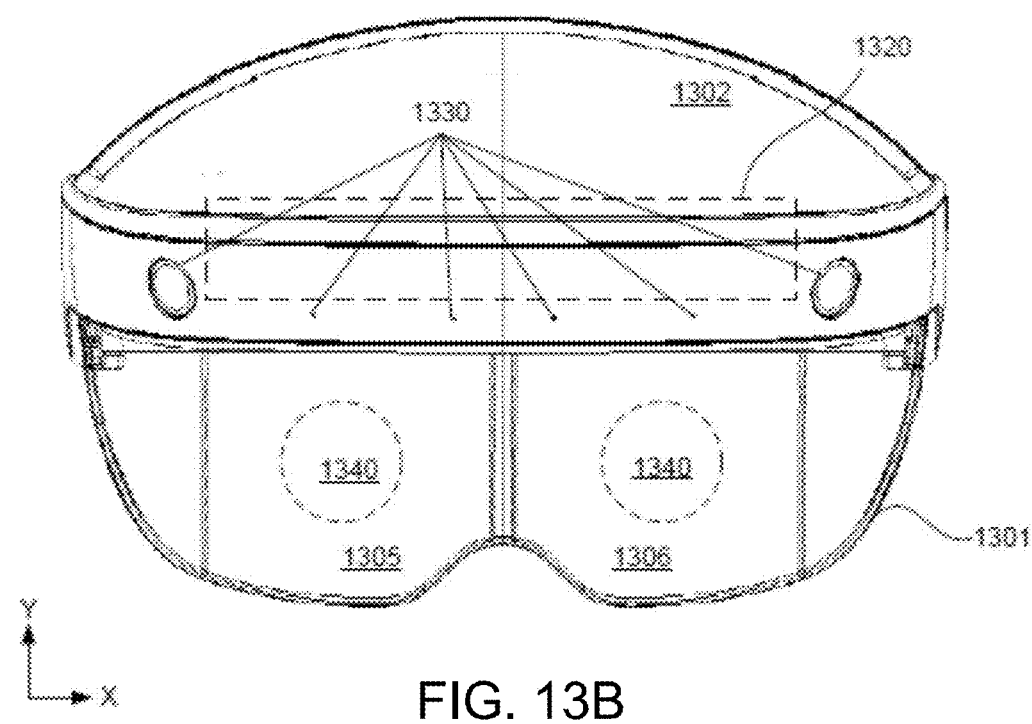
Figure 13C:
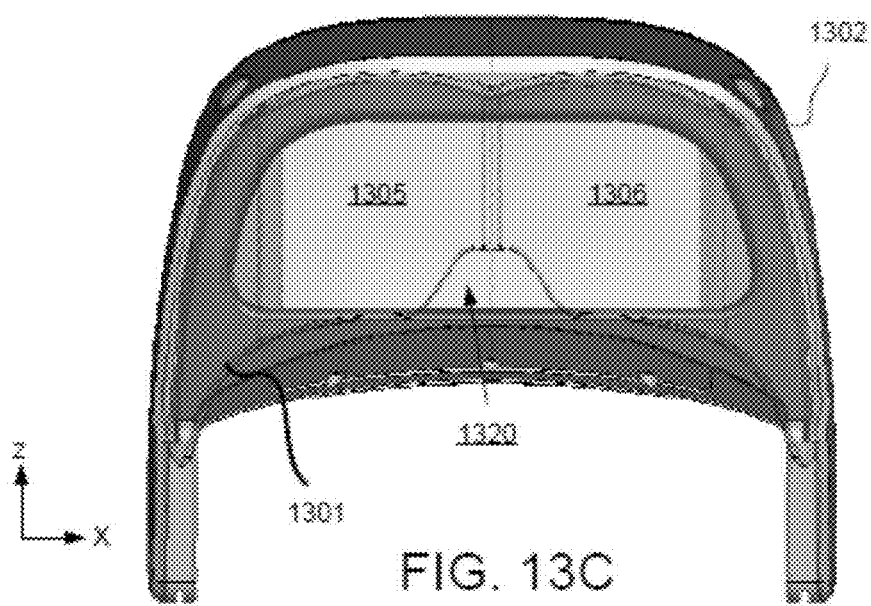

FIGS. 13A, 13B, 13C show examples of an implementation of the system of FIG. 12 in a head mounted display (HMD) system to allow manipulation of virtual objects by a user wearing the HMD.

FIGS. 13A, 13B, 13C shows a perspective view, front view, and bottom view, respectively, of one example of an HMD 1300. As shown the HMD includes a visor 1301 attached to a housing 1302, straps 1303, and a mechanical adjuster 1310 used to adjust the position and fit of the HMD to provide comfort and optimal viewing by a user of the HMD 1300. The visor 1301 may include one or more optical elements, such as an image combiner, that includes a shape and one or more reflective coatings that reflect an image from an image source 1320 to the eyes of the user. In one example, the coating is partially reflective allowing light to pass through the visor to the viewer and thus create a synthetic image in the field of view of the user overlaid on the user's environment and provide an augmented reality user interface. The visor 1301 can be made from a variety of materials, including, but not limited to, acrylic, polycarbonate, PMMA, plastic, glass, cyclo-olefin polymer (e.g., Zeonex, etc.), and/or the like and can be thermoformed, single diamond turned, injection molded, and/or the like to position the optical elements relative to an image source and eyes of the user and facilitate attachment to the housing of the HMD.

In one implementation, the visor 1301 may include two optical elements, for example, image regions 1305, 1306 or clear apertures. In this example, the visor 1301 also includes a nasal or bridge region, and a two temporal regions. The image regions are aligned with the position 1340 of one eye of a user (e.g., as shown in FIG. 13B) to reflect an image provided from the image source 1320 to the eye of a user of the HMD. A bridge or nasal region is provided between the two image regions to connect the image regions 1305 and the image regions 1306. The image regions 1305 and 1306 mirror one other through the y-z plane that bisects the nasal rejoin. In one implementation, the temporal region extends to an outer edge of the image region wrapping around the eyes to the temple housing of the HMD to provide for peripheral vision and offer support of the optical elements such that the image regions 1305 and 1306 do not require support from a nose of a user wearing the HMD.

Figure 13D:
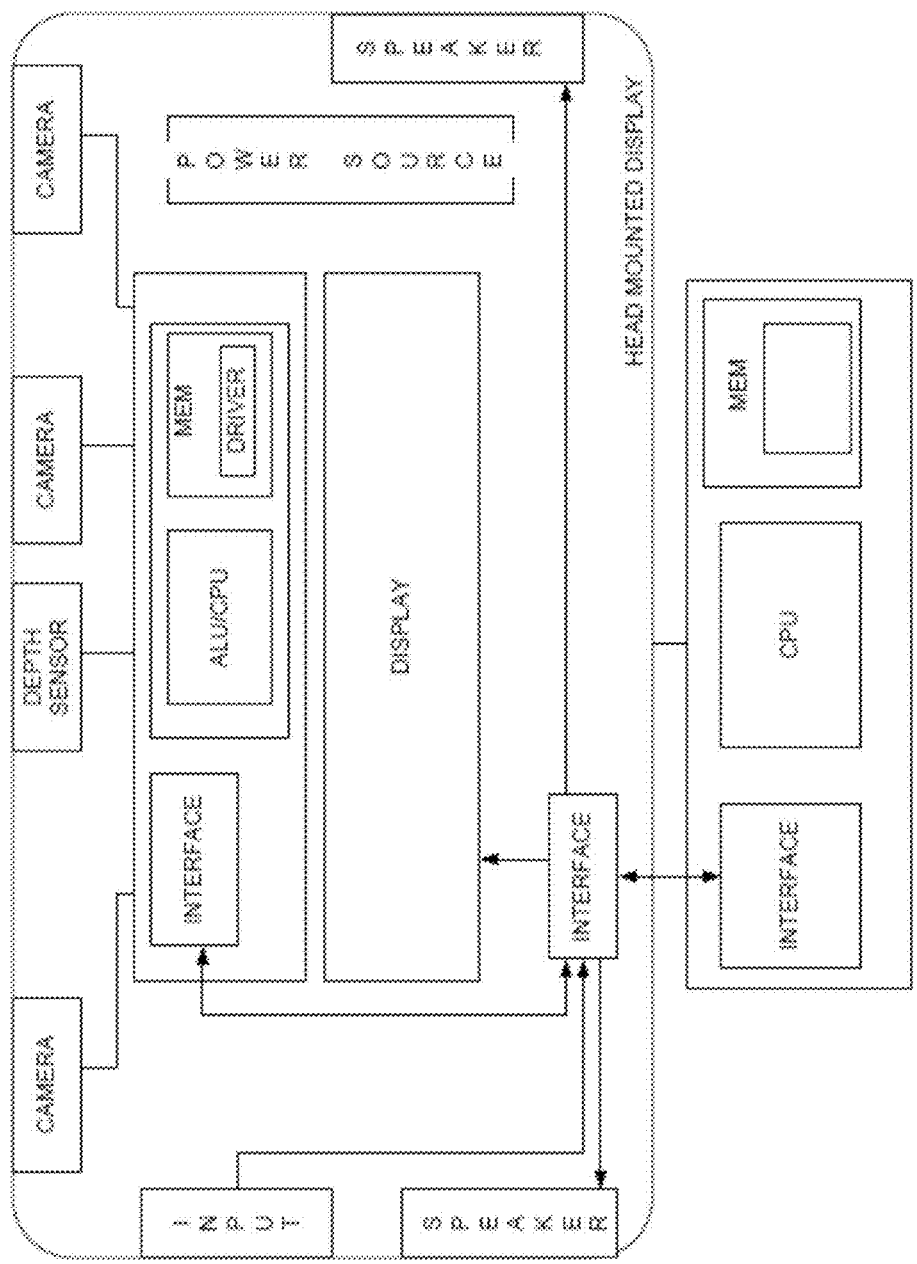

In one implementation, the housing may include a molded section to roughly conform to the forehead of a typical user and/or may be custom-fitted for a specific user or group of users. The housing may include various electrical components of the system, such as sensors 1330, a display, a processor, a power source, interfaces, a memory, and various inputs (e.g., buttons and controls) and outputs (e.g., speakers) and controls in addition to their various related connections and data communication paths. FIG. 13D shows an example implementation in which the processing device is implemented outside of the housing 1302 and connected to components of the HMD using an interface (e.g. a wireless interface, such as Bluetooth or a wired connection, such as a USB wired connector), FIG. 13E shows an implementation in which the processing device is implemented inside of the housing 1302.

The housing 1302 positions one or more sensors 1330 that detect the environment around the user. In one example, one or more depth sensors are positioned to detect objects in the user's field of vision. The housing also positions the visor 1301 relative to the image source 1320 and the user's eyes. In one example, the image source 1320 may be implemented using one or more displays. For example, the image source may be a single display. If an optical element of the image regions 1305, 1306 of the visor is provided for eyes of user(s), the display may be partitioned into at least two halves. For example, the halves may display an image intended for a separate eye. In another example, two displays may be provided. In this example, the display is paired with a corresponding optical element or image area, where the pair provides an image to an eye of the user. Examples of displays include a liquid crystal display (LCD), a Light Emitting Diode (LED) display, a flexible organic LED (OLED) display, a Liquid Crystal on Silicon (LCoS or LCOS), and/or a fiber optic projection system. In one example, a single 4.5- to 5.2-inch diagonal Liquid Crystal Display (LCD) may be used. In another example, dual 2.8-3.4-inch diagonal LCDs, one for eyes, may be used.

In some implementations, the display may be part of a mobile phone or other mobile device that is separate from, but placed within and/or affixed to, the HMD and/or HMD housing and is subsequently detachable or removable therefrom. For example, a user-accessible opening may be provided to accept and position a mobile phone or other mobile device with a display to provide an image source for the HMD. In this example, a hatch or a slot is configured to accept the mobile phone or other mobile device and provide access to a guide, a rail, one or more walls, or a shelf to position the display of the mobile device or mobile phone outside the field of view and at the geometries according to the descriptions and examples provided herein. In yet another example, an opening may provide one or more fasteners, such as a clip or deformable member that accept and detachably lock and position the display of the mobile device or mobile phone outside the field of view and at the geometries allowing reflection to the user's eyes.

Figure 13E:
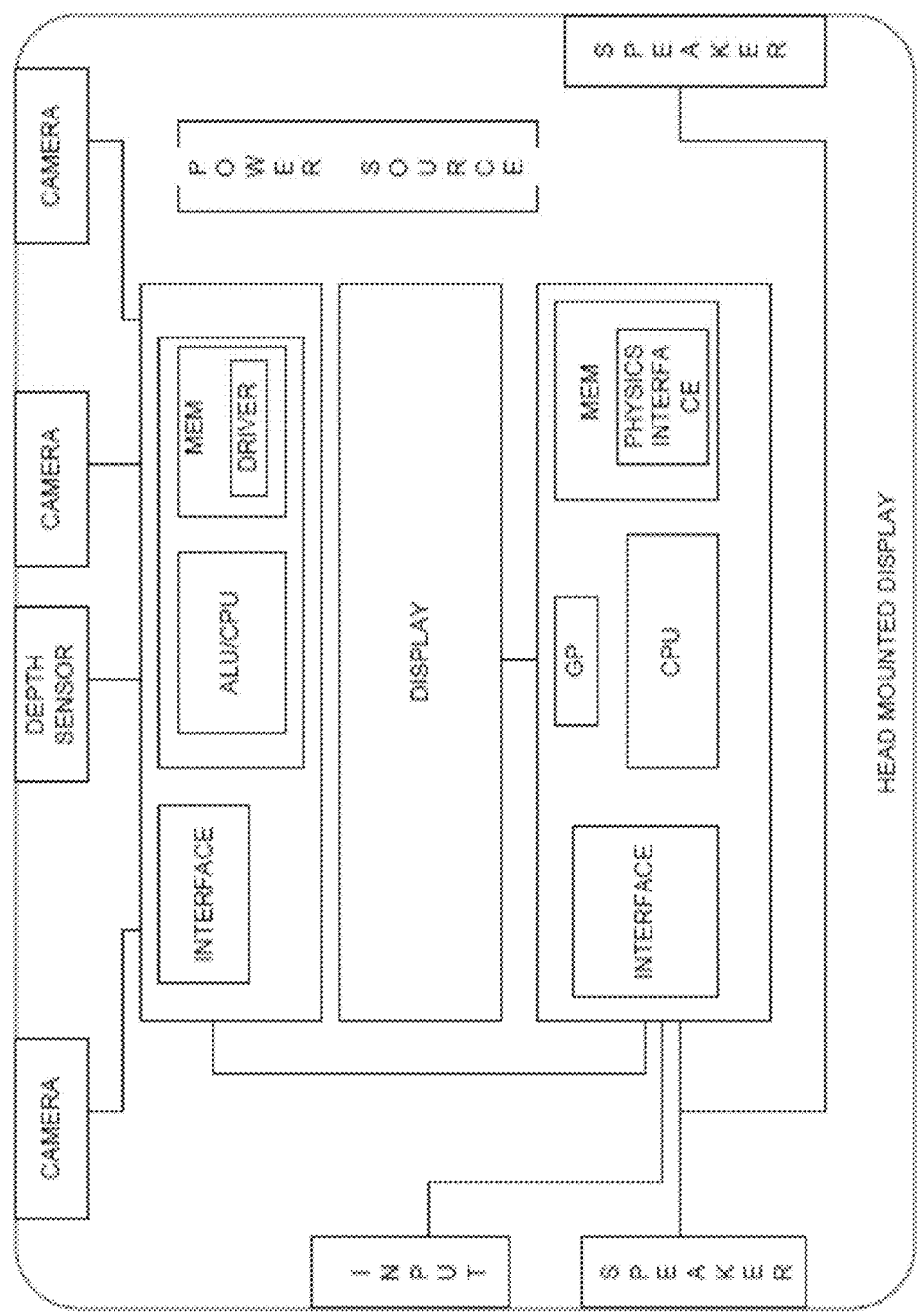

As shown in FIGS. 13D and 13E, a processing device may implement one or more applications or programs. In one example, the processing device includes an associated memory storing one or more applications implemented by the processing device that generate digital image data depicting one or more of graphics, a scene, a graphical user interface, a computer game, a movie, content from the Internet, such as web content accessed from the World Wide Web, among others, that are to be presented to a viewer of the wearable HMD. Examples of applications includes media players, mobile applications, browsers, video games, and graphic user interfaces, to name but a few. In addition, virtual elements corresponding to output of the various applications may be made interactive through use of a 3D environment application that implement, for example, the processes 600, 700, 900, and 2100 described herein.

One example of a head mounted display system and components thereof is described in U.S. patent application Ser. No. 14/945,372 titled "Wide Field of View Head Mounted Display Apparatuses, Methods and Systems" filed Nov. 18, 2015, which is herein incorporated by reference in its entirety.

As described above, the techniques described herein for a wearable AR system can be implemented using digital electronic circuitry, or in computer hardware, firmware, software, or in combinations of them in conjunction with various combiner imager optics. The techniques can be implemented as a computer program product, i.e., a computer program tangibly embodied in a non-transitory information carrier, for example, in a machine-readable storage device, in machine readable storage medium, in a computer-readable storage device or, in computer-readable storage medium for execution by, or to control the operation of, data processing apparatus or processing device, for example, a programmable processor, a computer, or multiple computers. A computer program can be written in any form of programming language, including compiled or interpreted languages, and it can be deployed in any form, including as a stand-alone program or as a module, component, subroutine, or other unit suitable for use in the specific computing environment. A computer program can be deployed to be executed by one component or multiple components of the vision system.

The exemplary processes and others can be performed by one or more programmable processing devices or processors executing one or more computer programs to perform the functions of the techniques described above by operating on input digital data and generating a corresponding output. Method steps and techniques also can be implemented as, special purpose logic circuitry, e.g., an FPGA (field programmable gate array) or an ASIC (application-specific integrated circuit).

Processing devices or processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. The processing devices described herein may include one or more processors and/or cores. Generally, a processing device will also include, or be operatively coupled to receive data from or transfer data to, or both, one or more mass storage devices for storing data, such as, magnetic, magneto-optical disks, or optical disks. Non-transitory information carriers suitable for embodying computer program instructions and data include all forms of non-volatile memory, including by way of example semiconductor memory devices, such as, EPROM, EEPROM, and flash memory or solid state memory devices; magnetic disks, such as internal hard disks or removable disks; magneto-optical disks; and CD-ROM and DVD-ROM disks. The processor and the memory can be supplemented by, or incorporated in special purpose logic circuitry.

The HMD may include various other components including various optical devices and frames or other structure for positioning or mounting the display system on a user allowing a user to wear the vision system while providing a comfortable viewing experience for a user. The HMD may include one or more additional components, such as, for example, one or more power devices or connections to power devices to power various system components, one or more controllers/drivers for operating system components, one or more output devices (such as a speaker), one or more sensors for providing the system with information used to provide an augmented reality to the user of the system, one or more interfaces from communication with external output devices, one or more interfaces for communication with an external memory devices or processors, and one or more communications interfaces configured to send and receive data over various communications paths. In addition, one or more internal communication links or busses may be provided in order to connect the various components and allow reception, transmission, manipulation and storage of data and programs.

In order to address various issues and advance the art, the entirety of this application (including the Cover Page, Title, Headings, Detailed Description, Claims, Abstract, Figures, Appendices and/or otherwise) shows by way of illustration various implementations in which the claimed inventions may be practiced. The advantages and features of the application are of are representative sample of implementations only, and are not exhaustive and/or exclusive. They are presented only to assist in understanding and teach the claimed principles. It should be understood that they are not representative of all claimed inventions. In addition, the disclosure includes other inventions not presently claimed. Applicant reserves all rights in those presently unclaimed inventions including the right to claim such inventions, file additional applications, continuations, continuations in part, divisions, and/or the like thereof. As such, it should be understood that advantages, implementations, examples, functional, features, logical, organizational, structural, topological, and/or other aspects of the disclosure are not to be considered limitations on the disclosure as defined by the claims or limitations on equivalents to the claims.

Figure 14A:
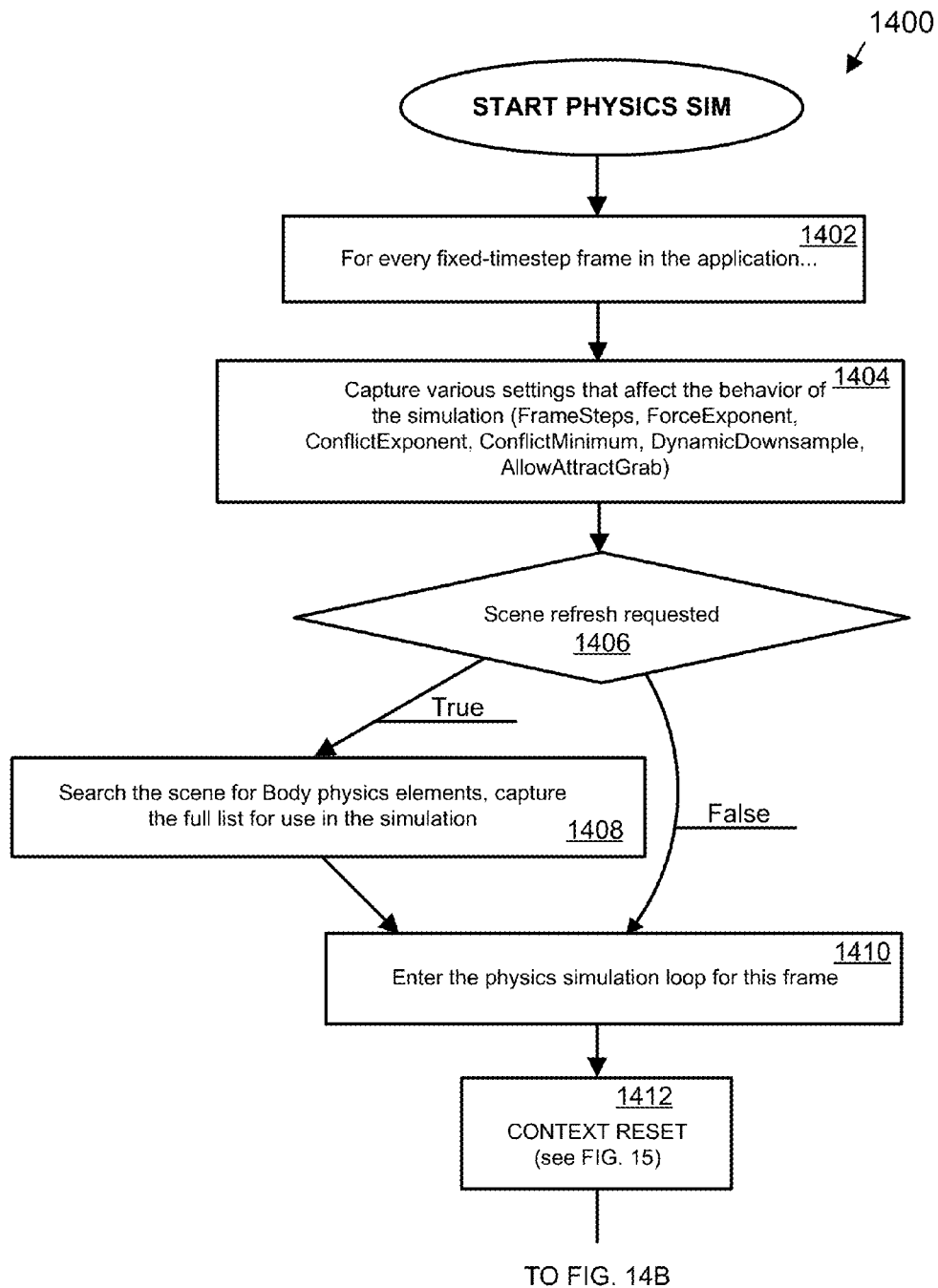
FIGS. 14A-14B illustrate a method for simulating physical elements in a virtual environment, in accordance with one or more implementations.
Figure 14B:
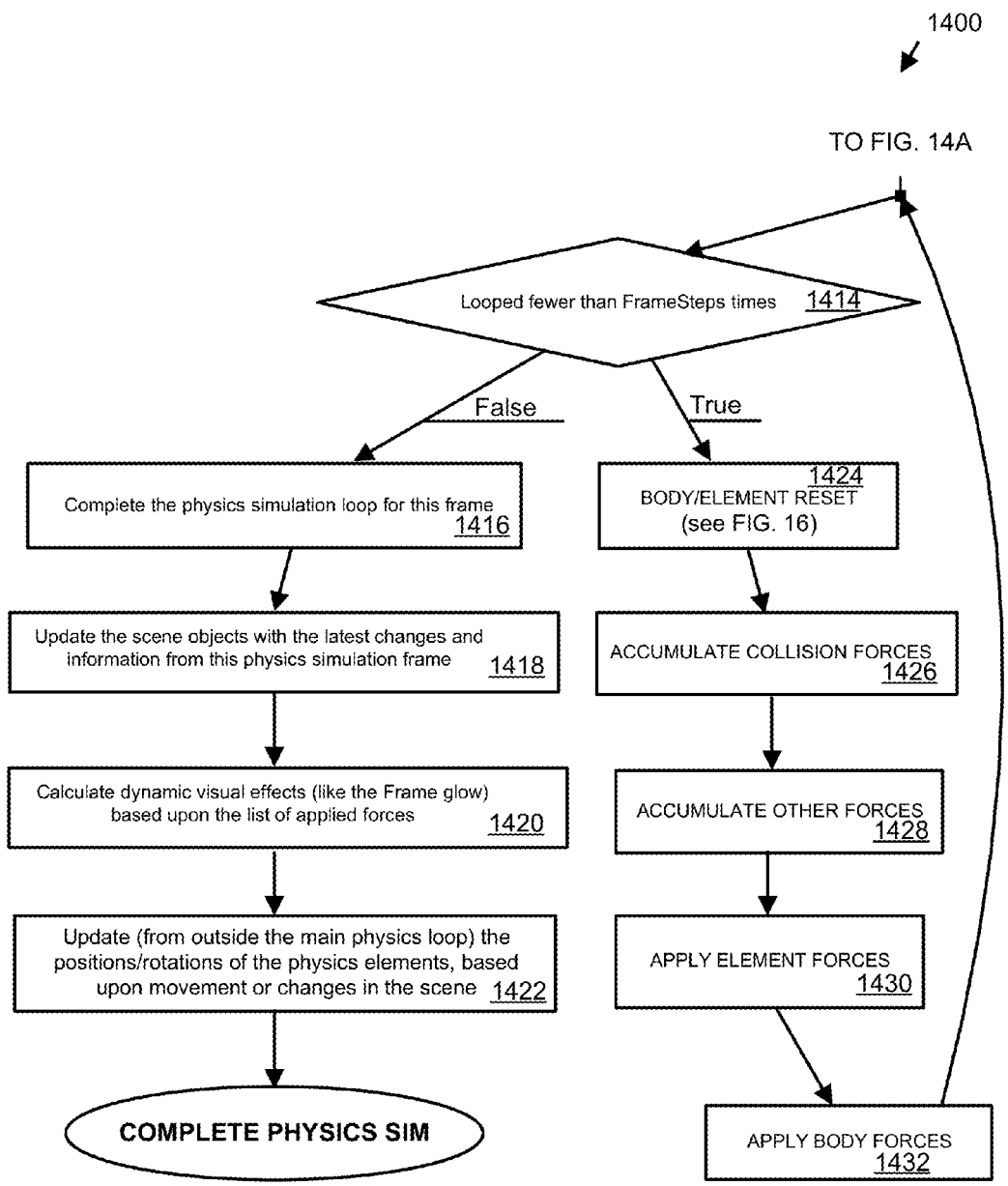

Modifying Virtual Objects in a Virtual Environment Using Hierarchical Anchors Incorporated into Virtual Objects FIGS. 14A and 14B illustrate a method 1400 for simulating physical elements in a virtual environment, in accordance with one or more implementations. In various implementations, the method 1400 corresponds to an overall flow/structure of a simulation.

At an operation 1402, each fixed timestamp frame in an application is identified. At an operation 1404, various settings that affect the behavior of the simulation are captured. Examples of settings include FrameSteps, ForceExponent, ConflictExponent, ConflictMinimum, DynamicDownsample, and AllowAttractGrab.

Figure 15:
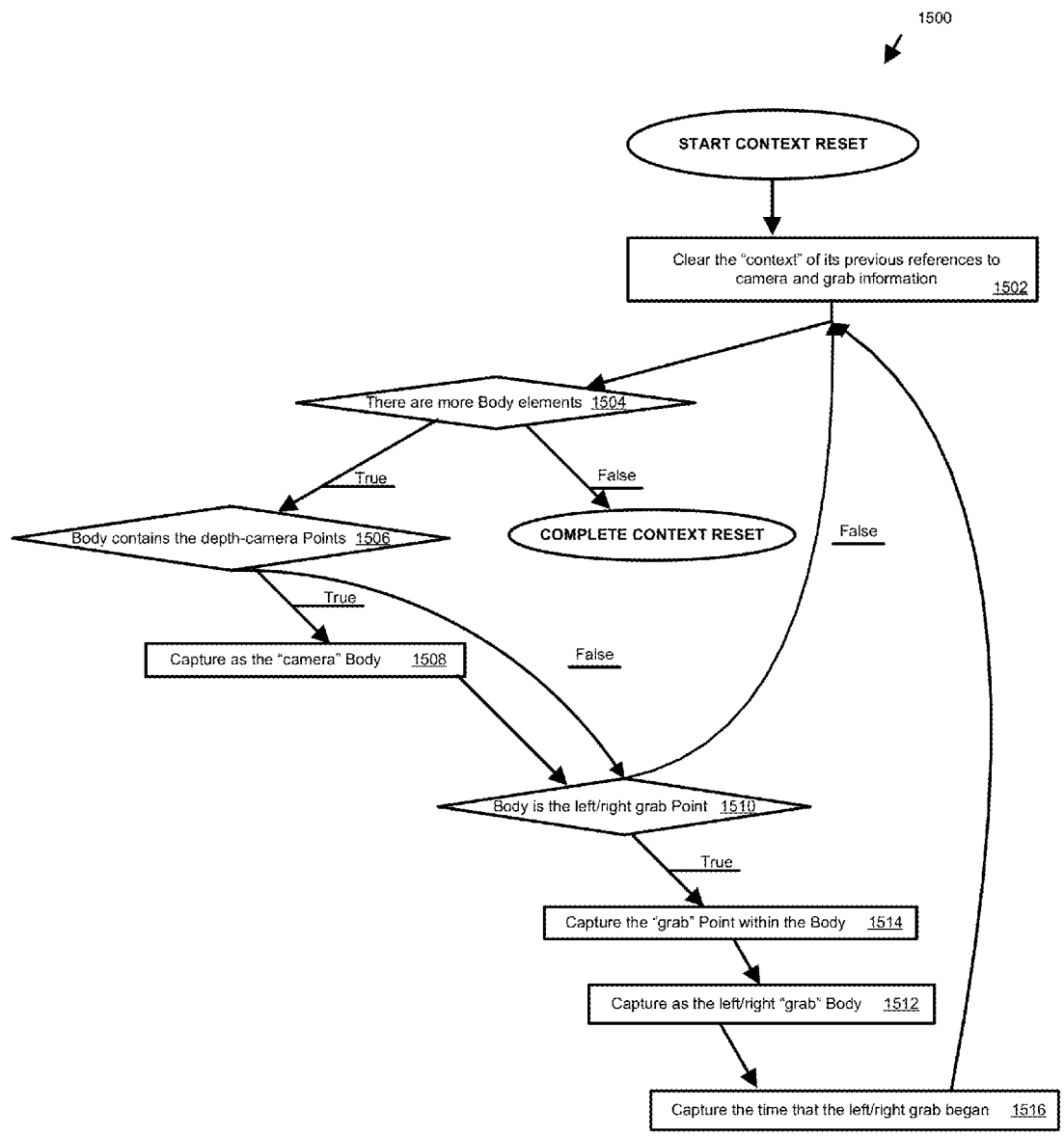
FIG. 15 illustrates a method for resetting a context of a virtual environment, in accordance with one or more implementations.

At a decision point 1406, it is determined whether or not a scene refresh is requested. If so, the method 1400 continues to an operation 1408, in which the scene is searched for Body physics elements, and the full list is captured for use in the simulation. If the scene refresh is not requested, the method 1400 continues to an operation 1410, in which the physics simulation loop is entered for the identified frame. The flowchart 1400 continues to an operation 1412, in which a context reset is performed. In some implementations, the context reset is performed in accordance with the method 1500, shown in FIG. 15.

The flowchart 1400 may further continue to a decision point 1414, in which it is determined whether or not the physics simulation loop has been looped less than a specified number of times (e.g., a FrameSteps number of times). If the physics simulation loop has been looped less than a specified number of times, the flowchart 1400 continues to an operation 1424, in which a body or element reset is performed. In some implementations, the body and/or element reset is performed in accordance with the method 1600, shown in FIG. 16. At an operation 1426, collision forces are accumulated. At an operation 1428, other forces are accumulated. At an operation 1430, element forces are applied. At an operation 1432, body forces are applied. Collision forces, other forces, element forces, and/or body forces may include forces based on user interactions, drag, displacements from equilibrium positions, and/or other parameters. The flowchart 1400 returns to the decision point 1414.

If the physics simulation loop has not been looped less than a specified number of times, the flowchart 1400 continues to an operation 1416, in which the physics simulation is completed for the identified frame. At an operation 1418, the scene is updated with the latest changes and information from this physics simulation frame. At an operation 1420, dynamic visual effects (e.g., the Frame glow) are calculated based upon the list of applied forces. At an operation 1422, the positions and/or rotations of the physics elements are updated based upon movement or changes in the scene.

15 illustrates a method 1500 for resetting a context of a virtual environment, in accordance with one or more implementations. In various implementations, the method 1500 corresponds to allowing certain information to be captured (one time per frame) for reuse across the rest of the simulation frame (with its multiple passes).

At an operation 1502, the context of previous references to the camera is cleared and information is obtained. The method 1500 proceeds to a decision point 1504, at which it is determined whether there are more body elements. If there not more body elements, the method 1500 terminates.

If there are more body elements, the method 1500 proceeds to an operation 1506, at which it is determined whether or not the body contains the depth camera points. If the body contains the depth camera points, the method 1500 proceeds to an operation 1508. If the body does not contain the depth camera points, the method 1500 proceeds to a decision point 1510.

At the operation 1508, the "camera" is captured as the body. At the decision point 1510, it is determined whether the body is the left or the right grab point. If not, the method returns to the decision point 1504. If the body is the left or the right grab point, the method 1500 continues to an operation 1512, in which the left/right "grab" is captured as the body. At an operation 1514, the "grab" point is captured within the body. At an operation 1516, the time that the left/right grab began is captured. The method 1500 continues to the decision point 1504.

Figure 16:
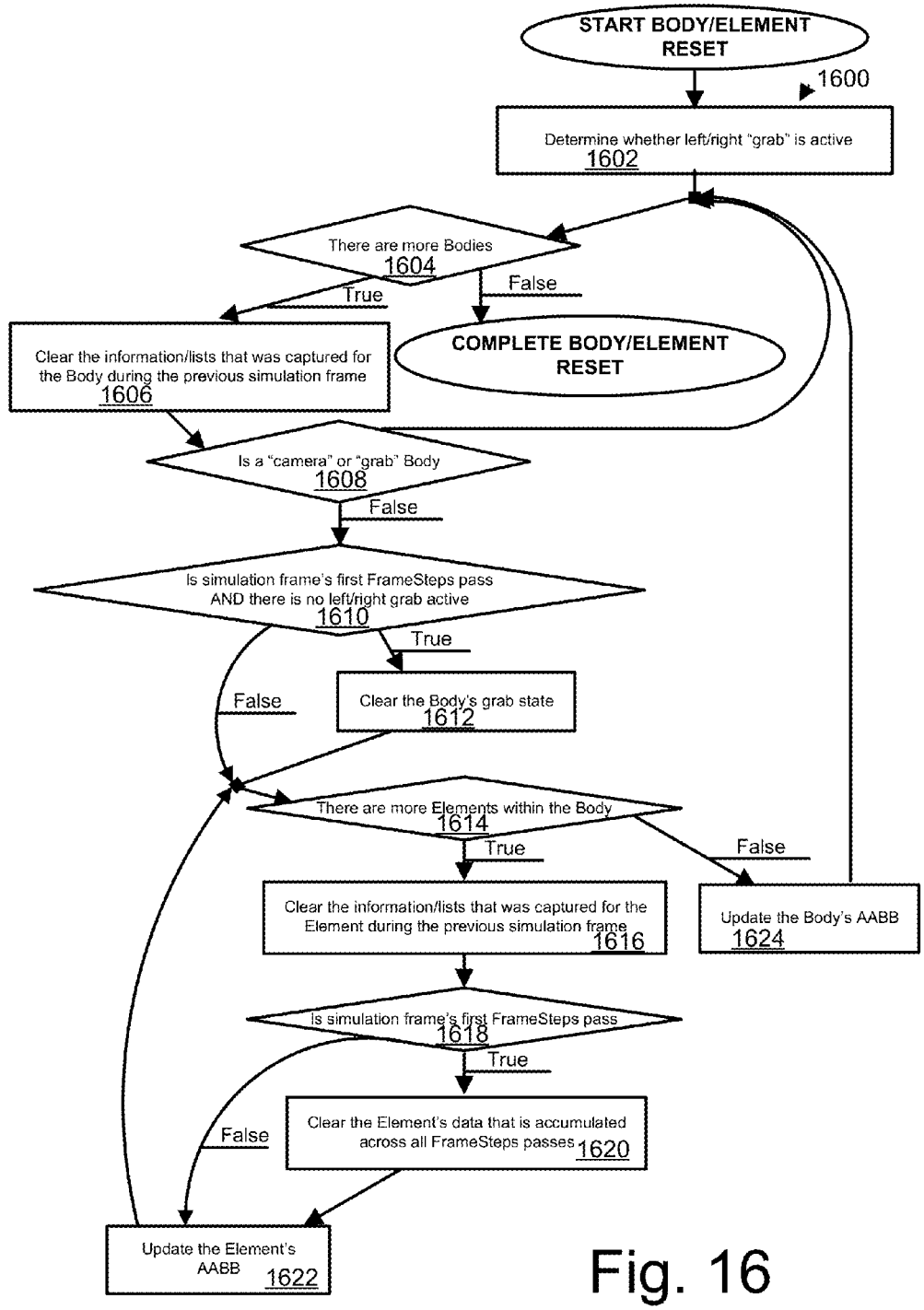
FIG. 16 illustrates a method for resetting elements in a virtual environment, in accordance with one or more implementations.

FIG. 16 illustrates a method 1600 for resetting elements in a virtual environment, in accordance with one or more implementations. In various implementations, the method 1600 includes allowing a simulation to clear state and/or information that was captured in a previous simulation frame. This information may be reset at the beginning (rather than at the end) so that an application outside the physics simulation will have a chance to access and use it (for things like the Frame glow).

At an operation 1602, it is determined that the left or right "grab" is active. At a decision point 1604, it is determined whether or not there are more bodies. If not, the method 1600 terminates.

If there are more bodies, the method 1600 continues to an operation 1606, in which the information/lists that were captured for the body during the previous simulation frame are cleared. The method 1600 continues to a decision point 1608, in which it is determined whether or not a camera or a grab body was obtained. If not, the method 1600 returns to the decision point 1604. If a camera or a grab body was obtained, the method continues to a decision point 1610, in which it is determined whether or not the simulation frame's first FrameSteps pass and there is no left/right grab active. If so, the method 1600 continues to an operation 1612, in which the body's grab issue is cleared. If not, the method 1600 continues to a decision point 1614 in which It is determined if there are more elements within the body. If not, the method 1600 continues to an operation 1624, in which the body's AABB is updated.

If there are more elements within the body, the method 1600 continues to an operation 1616, in which the information/lists that were captured for the element during a previous simulation are cleared. At a decision point 1618, it is determined whether or not it is the frame's first FrameSteps pass. If so, the method 1600 continues to an operation 1620, in which the element's data that is accumulated across all FrameSteps passes. If is determined it is not the frame's first FrameSteps pass, the method 1600 continues to an operation 1622, in which the element's AABB is updated.

Figure 17A:
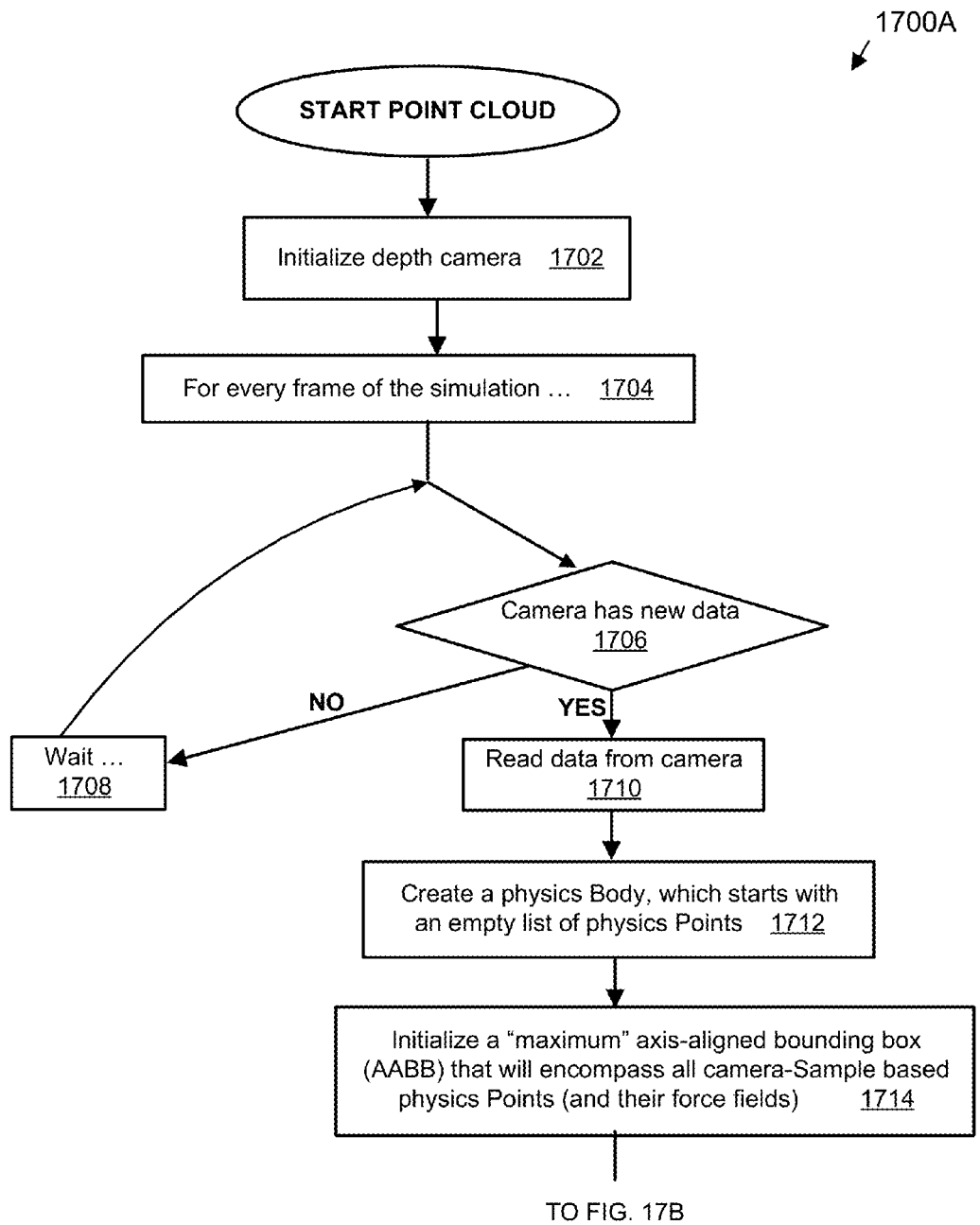
FIGS. 17A, 17B, and 17C illustrate a method for using point clouds to determine interactions in a virtual environment, in accordance with one or more implementations.
Figure 17B:
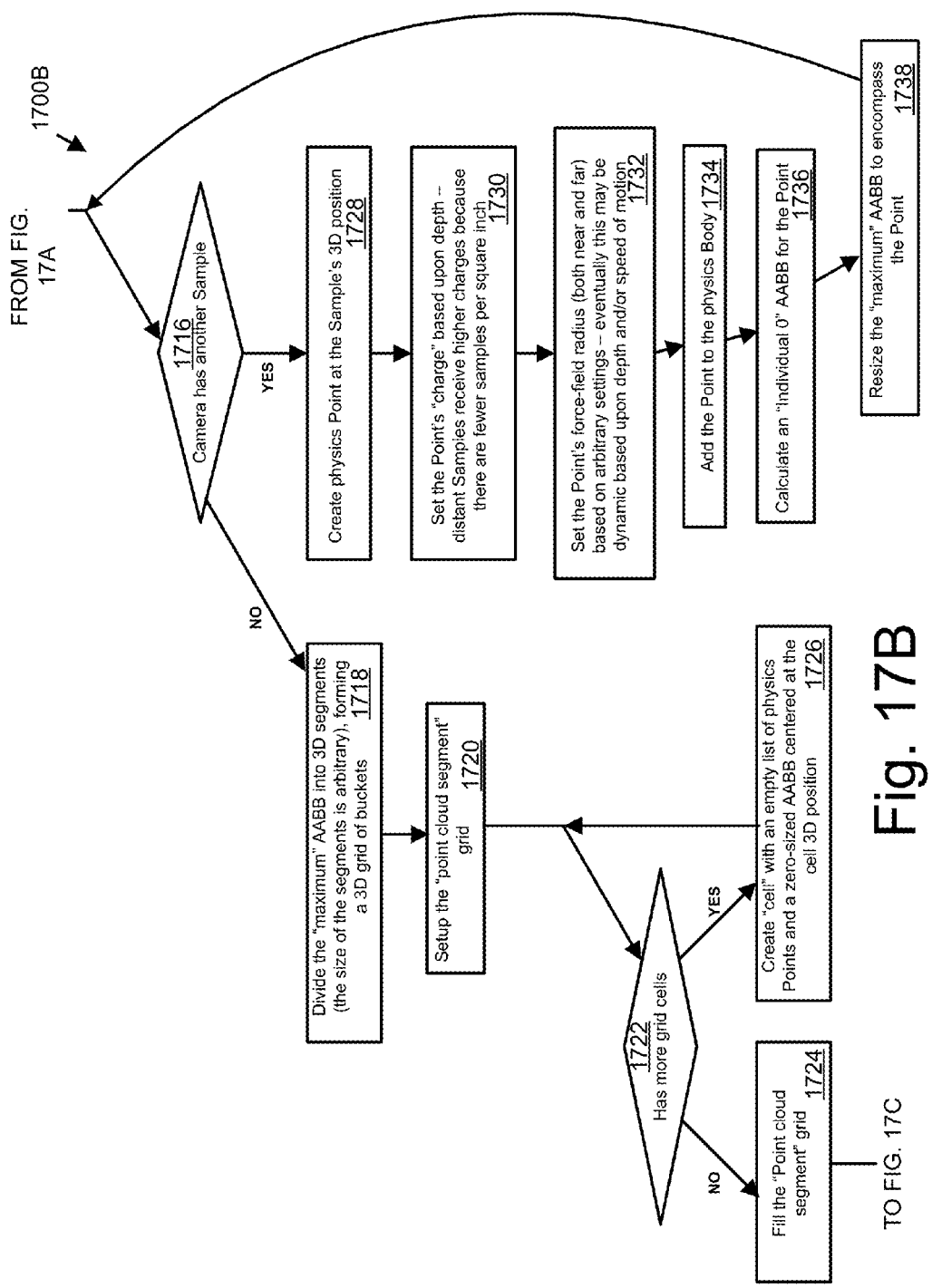
Figure 17C:
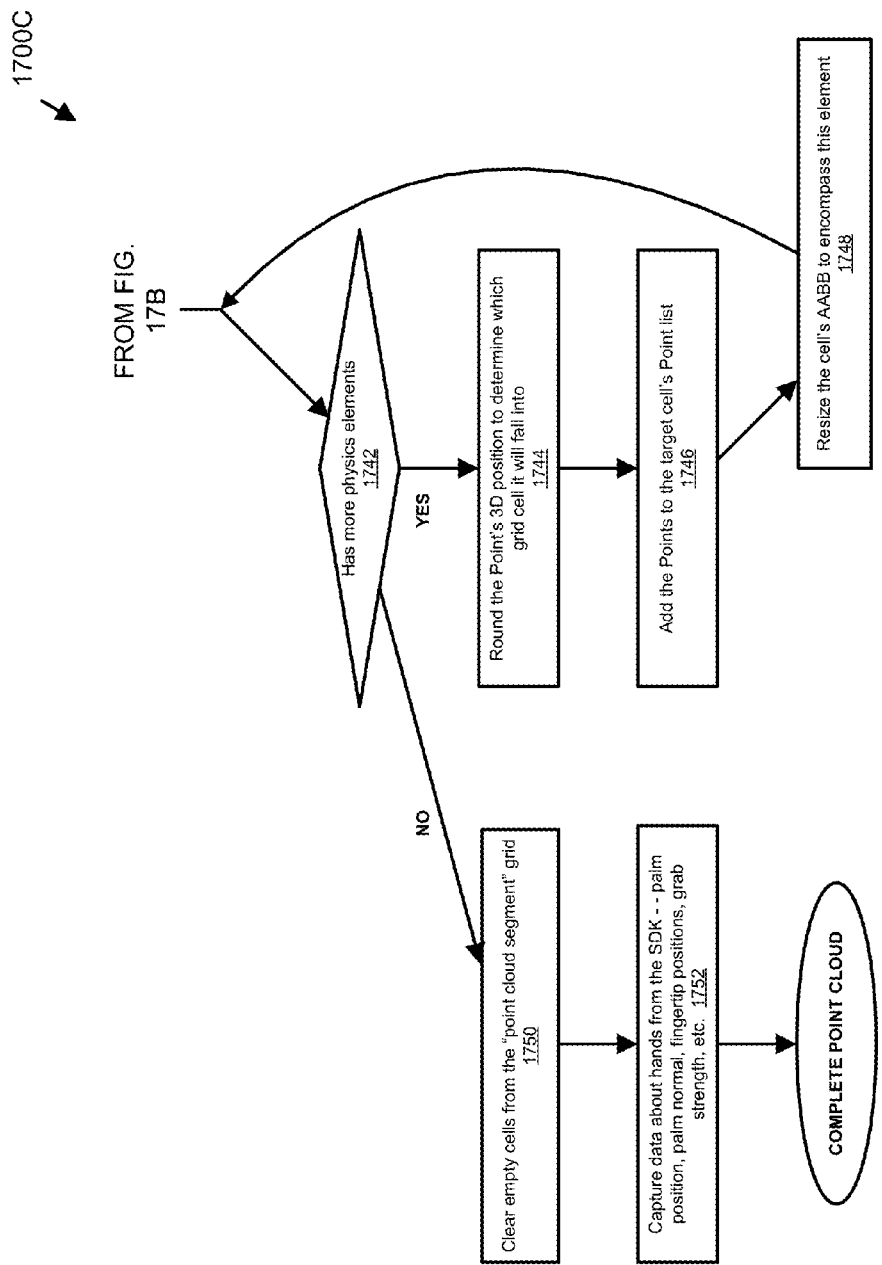

FIGS. 17A, 17B, and 17C illustrate a method 1700 for using point clouds to determine interactions in a virtual environment, in accordance with one or more implementations.

In some implementations, the method 1700 allows depth camera samples to be converted into "physics" point elements. The points may get segmented into groups, which are later used in a simulation for performance/optimization. In some implementations, each point cloud element may have an interaction volume, just like a "point" element that a user would add manually to a scene. The physics simulation may be allowed to treat a "hand point" vs. "scene point" interaction in the same way that it treats a "scene point" vs. "scene point" interaction. These points are contained with a Body (in the same way "scene" points are within a Body). The Body may comprise the main container for groups of elements that move/rotate/behave as a rigid or semi-rigid unit.

At an operation 1702, a depth camera is initialized. At an operation 1704, each frame of the simulation is analyzed. At a decision point 1706, it is determined if the camera has new data. If not, the method 1700 proceeds to an operation 1708, which includes waiting. If so, the method 1700 proceeds to an operation 1710, reading data from the camera. At an operation 1712, a physics Body is created, where the creation starts with an empty list of physics Points. At an operation 1714, a "maximum" axis-aligned bounding box (AABB) that will encompass all camera-Sample-based physics Points (and their force-fields) is initialized.

The method 1700 continues to a decision point 1716, at which It is determined whether the camera has another sample. If the camera does not have another sample the method 1700 proceeds to an operation 1718, in which the maximum" AABB is divided into 3D segments (the size of the segments is arbitrary), forming a 3D grid of buckets. At an operation 1720, the "point cloud segment" grid is set up. At a decision point 1722, it is determined whether or not the system has more grid cells. If the system has more cell grids, the method 1700 continues to an operation 1726, in which a "cell" is created with an empty list of physics Points and a zero-sized AABB centered at the cell 3D position. If the system does not have more cell grids, the method 1700 continues to an operation 1724, in which the "point cloud segment" grid is filled. The method 1700 then continues to a decision point 1742.

If the camera has another sample the method 1700 proceeds to an operation 1728, in which a physics point is created at the Sample's 3D position. At an operation 1730, the Point's "charge" based is set upon depth distant Samples receive higher charges because there are fewer samples per square inch. At an operation 1732, the Point's interactive volume radius is set (both near and far) based on one or more settings. It is noted that this may be dynamic based upon depth and/or speed of motion. At an operation 1734, the point is added to the physics body. At an operation 1736, an "individual0" AABB is calculated for the point. At an operation 1738, the "maximum" AABB is resized to encompass the Point.

At the decision point 1742, it is determined whether or not the system has more physics elements. If the system has more physics elements, the method 1700 continues to an operation 1744, in which the Point's 3D position is rounded to determine which grid cell it will fall into. At an operation 1746, the point is added to the target cell's points list. At an operation 1748, the cell's AABB is resized to encompass this element. The method 1700 continues to the decision point 1742.

If the system does not have more physics elements, the method 1700 continues to an operation 1750, in which empty cells are cleared from the "point cloud segment" grid. At an operation 1752, data about hands from the SDK are captured. Examples of data include data related to palm position, palm normal, fingertip positions, grab strength, etc. The method 1700 may then terminate.

Figure 18:
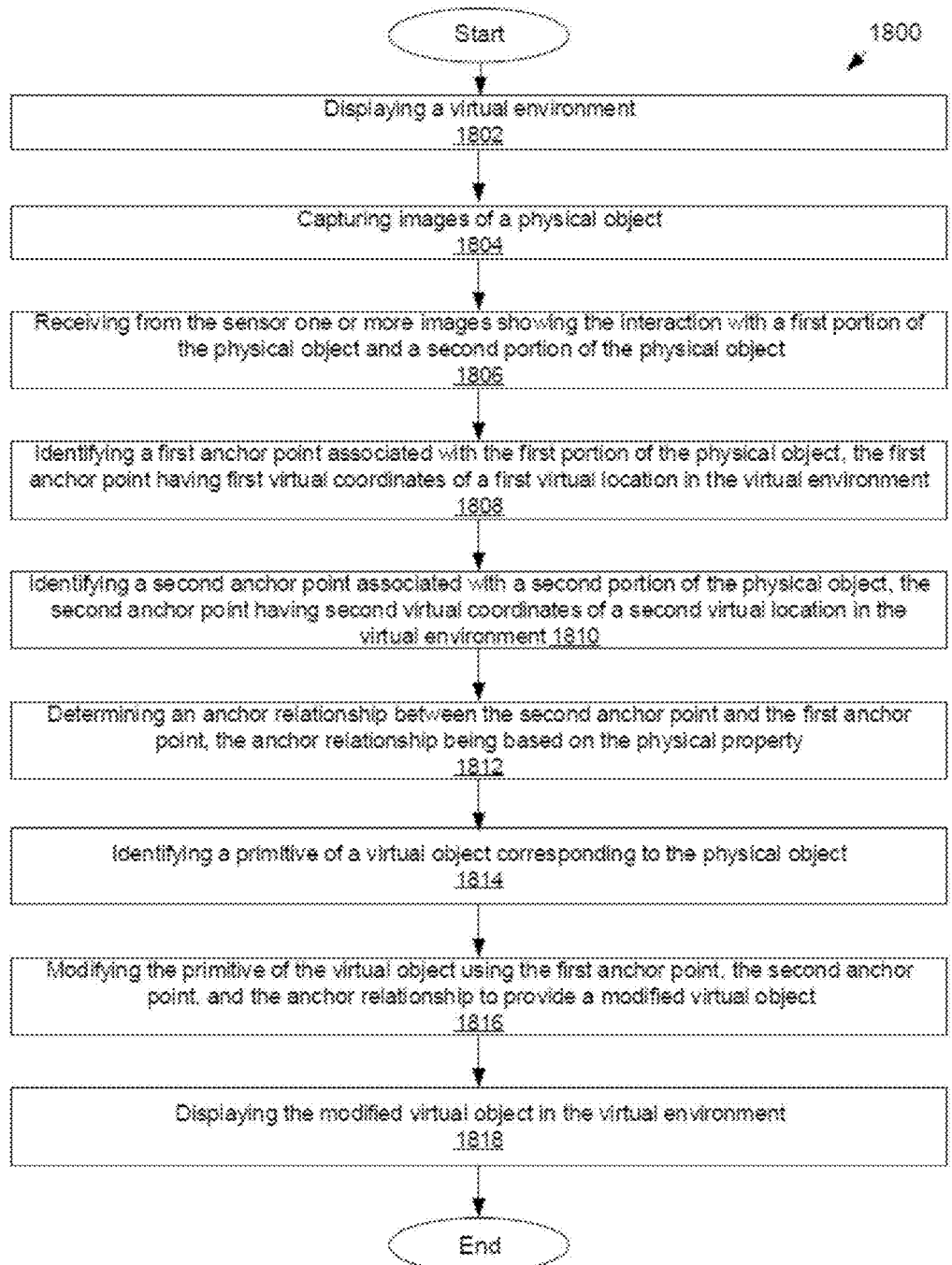
FIG. 18 illustrates a method for displaying an interaction with a physical object in a virtual environment.

FIG. 18 illustrates a method 1800 for displaying an interaction with a physical object in a virtual environment. At an operation 1802, a virtual environment is displayed. At an operation 1804, images of a physical object are captured. In various implementations, a sensor, such as a depth-sensing camera, may capture the images. At an operation 1806, one or more images showing the interaction with a first portion of the physical object and a second portion of the physical object may be received. In some implementations, the images may be received from the sensor.

At an operation 1808, a first anchor point associated with the first portion of the physical object may be identified. The first anchor point may have first virtual coordinates of a first virtual location in the virtual environment. At an operation 1810, a second anchor point associated with a second portion of the physical object may be identified. The second anchor point may have second virtual coordinates of a second virtual location in the virtual environment. At an operation 1812, an anchor relationship between the second anchor point and the first anchor point may be determined. The anchor relationship may be based on the physical property. In some implementations, the anchor relationship provides a basis for how to model the physical property in the virtual environment. As an example, the anchor relationship may provide a basis to model friction by providing the extent the first portion and the second portion appear to stretch away from one another and/or return to an unstretched state. At an operation 1814, a primitive of a virtual object corresponding to the physical object may be identified.

At an operation 1816, the primitive of the virtual object may be modified using the first anchor point, the second anchor point, and the anchor relationship to provide a modified virtual object. At an operation 1818, the modified virtual object may be displayed in the virtual environment.

Figure 19:
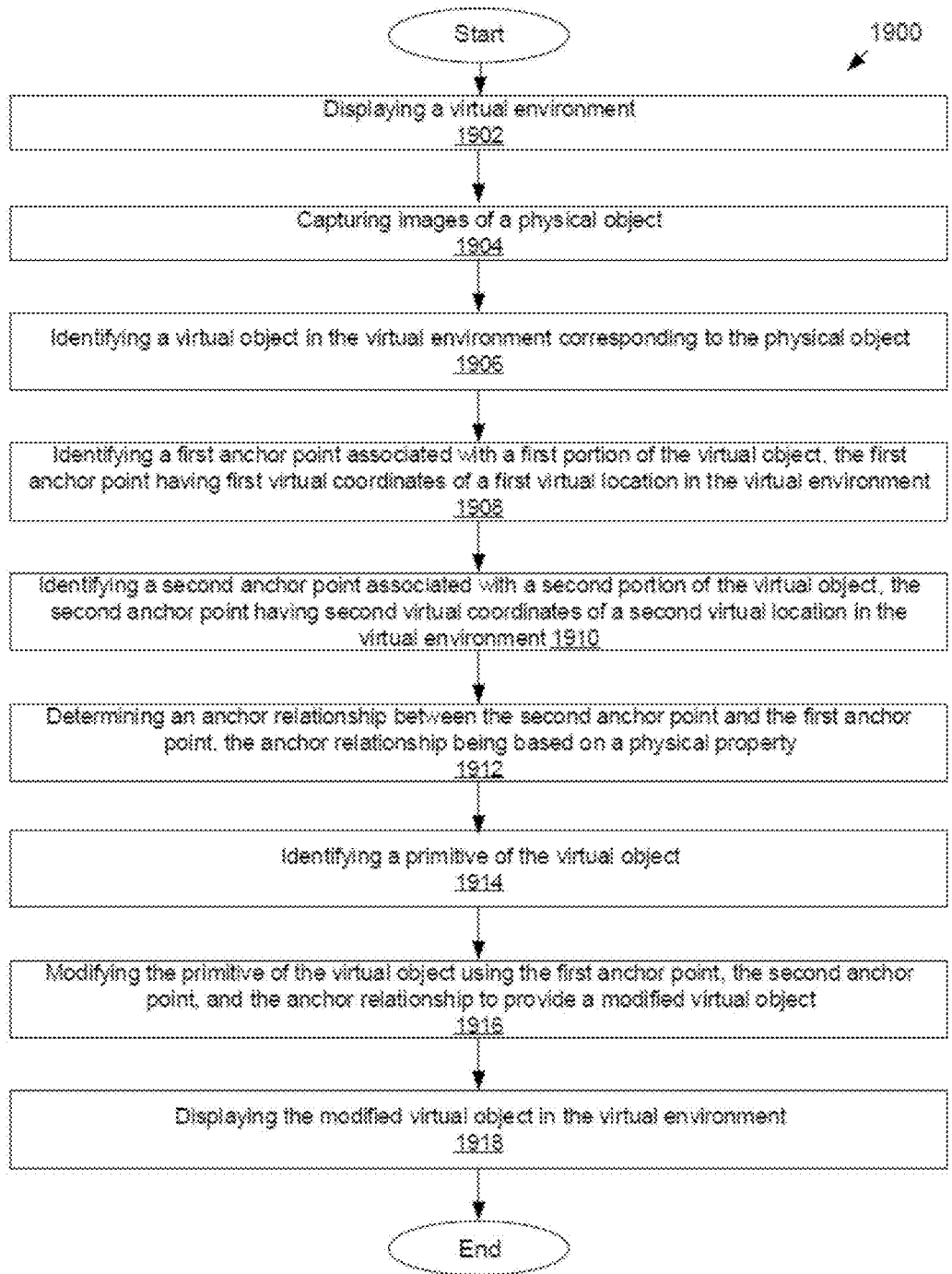
FIG. 19 illustrates a method for displaying an interaction with a physical object in a virtual environment.

FIG. 19 illustrates a method 1900 for displaying an interaction with a virtual object linked to a physical object in a virtual environment. At an operation 1902, a virtual environment is displayed. At an operation 1904, images of a physical object are captured. In various implementations, a sensor, such as a depth-sensing camera, may capture the images. At an operation 1906, received virtual object in the virtual environment that corresponds to the physical object is identified.

At an operation 1908, a first anchor point associated with the first portion of the virtual object may be identified. The first anchor point may have first virtual coordinates of a first virtual location in the virtual environment. At an operation 1910, a second anchor point associated with a second portion of the virtual object may be identified. The second anchor point may have second virtual coordinates of a second virtual location in the virtual environment. At an operation 1912, an anchor relationship between the second anchor point and the first anchor point may be determined. The anchor relationship may be based on a property that relates the second portion to the first portion. In some implementations, the anchor relationship provides a basis for how to model the property in the virtual environment. As an example, the anchor relationship may provide a basis to model friction by providing the extent the first portion and the second portion appear to stretch away from one another and/or return to an unstretched state. At an operation 1914, a primitive of the virtual object may be identified.

At an operation 1916, the primitive of the virtual object may be modified using the first anchor point, the second anchor point, and the anchor relationship to provide a modified virtual object. At an operation 1918, the modified virtual object may be displayed in the virtual environment.

Figure 21:
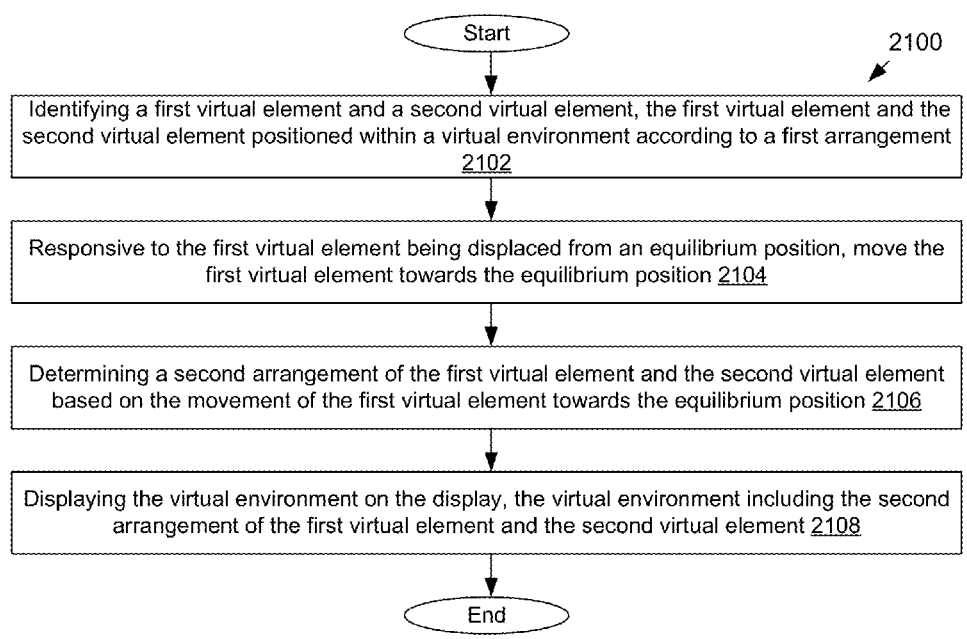
FIG. 21 illustrates a flowchart showing an example of a process for moving a virtual element toward an equilibrium position.

FIG. 21 illustrates a method 2100 for moving a virtual element toward an equilibrium position. At an operation 2012, a first virtual element and a second virtual element may be identified. The first virtual element and the second virtual element may be positioned within a virtual environment according to a first arrangement. An anchor relationship between the first virtual element and the second virtual element may define an equilibrium position for the first virtual element. The equilibrium position may define a return position for the first virtual element with respect to the second virtual element.

At an operation 2104, in response to the first virtual element being displaced from the equilibrium position, the first virtual element may be moved towards the equilibrium position. The movement of the first virtual element may simulate the first virtual element stretching or springing away. For example, the movement of the first virtual element may simulate the first virtual element stretching away from the second virtual element and/or returning to an unstretched state.

At an operation 2106, a second arrangement of the first virtual element and the second virtual element may be determined. The second arrangement of the first virtual element and the second virtual element may be determined based on the movement of the first virtual element towards the equilibrium position.

At an operation 2108, the virtual environment may be displayed on a display. The virtual environment may include the second arrangement of the first virtual element and the second virtual element.

Although the disclosed technology has been described in detail for the purpose of illustration based on what is currently considered to be the most practical and preferred implementations, it is to be understood that such detail is solely for that purpose and that the disclosure is not limited to any particular implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system configured to display an interaction with a physical object in a virtual environment, the system comprising:
   a display configured to display the virtual environment;
   a sensor coupled to the display, the sensor configured to capture images of the physical object;
   one or more physical computer processors coupled to the sensor and to the display, the one or more physical computer processors configured by computer readable instructions to:
      identify a first virtual element and a second virtual element corresponding to the physical object, the first virtual element and the second virtual element positioned within the virtual environment according to a first arrangement, the first virtual element movable within the virtual environment based on an anchor relationship between the first virtual element and the second virtual element, the anchor relationship defining an equilibrium position for the first virtual element, the equilibrium position defining a return position for the first virtual element with respect to the second virtual element;
      responsive to the first virtual element being displaced from the equilibrium position, move the first virtual element towards the equilibrium position by applying a simulated force to the first virtual element, the force being directed towards the equilibrium position, the application of the force to the first virtual element being localized such that the force does not affect the second virtual element, and wherein an amount of the force is based on a distance between the first virtual element and the equilibrium position;
      determine a second arrangement of the first virtual element and the second virtual element based on the movement of the first virtual element towards the equilibrium position; and
      effectuate displaying of the virtual environment on the display, the virtual environment including the second arrangement of the first virtual element and the second virtual element.

2. The system of claim 1, wherein the first virtual element is associated with a first anchor point and the second virtual element is associated with a second anchor point, and the anchor relationship defines the equilibrium position for the first virtual element based on a first position of the first anchor point and a second position of the second anchor point.

3. The system of claim 2, wherein the anchor relationship defines the equilibrium position for the first virtual element further based on a first orientation of the first anchor point and a second orientation of the second anchor point.

4. The system of claim 1, wherein the equilibrium position is fixed relative to the second virtual element.

5. The system of claim 1, wherein the movement of the first virtual element towards the equilibrium position is characterized by an anchor momentum, the anchor momentum defining an amount of distance the first virtual element overshoots the equilibrium position during the movement of the first virtual element towards the equilibrium position.

6. The system of claim 1, wherein the physical object corresponds to a third virtual element, and the first virtual element corresponds to a first portion of the third virtual element and the second virtual element corresponds to a second portion of the third virtual element.

7. The system of claim 1, wherein the anchor relationship is based on a physical property of the physical object.

8. A method to display an interaction with a physical object in a virtual environment, the method comprising:
   identifying a first virtual element and a second virtual element corresponding to the physical object, the first virtual element and the second virtual element positioned within the virtual environment according to a first arrangement, the first virtual element movable within the virtual environment based on an anchor relationship between the first virtual element and the second virtual element, the anchor relationship defining an equilibrium position for the first virtual element, the equilibrium position defining a return position for the first virtual element with respect to the second virtual element;
   responsive to the first virtual element being displaced from the equilibrium position, moving the first virtual element towards the equilibrium position by applying a simulated force to the first virtual element, the force being directed towards the equilibrium position, the application of the force to the first virtual element being localized such that the force does not affect the second virtual element, and wherein an amount of the force is based on a distance between the first virtual element and the equilibrium position;

determining a second arrangement of the first virtual element and the second virtual element based on the movement of the first virtual element towards the equilibrium position; and displaying the virtual environment on the display, the virtual environment including the second arrangement of the first virtual element and the second virtual element.

9. The method of claim 8, wherein the first virtual element is associated with a first anchor point and the second virtual element is associated with a second anchor point, and the anchor relationship defines the equilibrium position for the first virtual element based on a first position of the first anchor point and a second position the second anchor point.

10. The method of claim 9, wherein the anchor relationship defines the equilibrium position for the first virtual element further based on a first orientation of the first anchor point and a second orientation of the second anchor point.

11. The method of claim 8, wherein the equilibrium position is fixed relative to the second virtual element.

12. The method of claim 8, wherein the movement of the first virtual element towards the equilibrium position is characterized by an anchor momentum, the anchor momentum defining an amount of distance the first virtual element overshoots the equilibrium position during the movement of the first virtual element towards the equilibrium position.

13. The method of claim 8, wherein the physical object corresponds to a third virtual element, and the first virtual element corresponds to a first portion of the third virtual element and the second virtual element corresponds to a second portion of the third virtual element.

14. The method of claim 8, wherein the anchor relationship is based on a physical property of the physical object.

* * * * *